US011140700B2

(12) United States Patent
Yoshimura et al.

(10) Patent No.: US 11,140,700 B2
(45) Date of Patent: Oct. 5, 2021

(54) TERMINAL APPARATUS, BASE STATION APPARATUS, AND COMMUNICATION METHOD

(71) Applicants: Sharp Kabushiki Kaisha, Osaka (JP); FG Innovation Company Limited, Tuen Mun (HK)

(72) Inventors: Tomoki Yoshimura, Sakai (JP); Shoichi Suzuki, Sakai (JP); Wataru Ouchi, Sakai (JP); Liqing Liu, Sakai (JP); Kimihiko Imamura, Sakai (JP)

(73) Assignees: SHARP KABUSHIKI KAISHA, Osaka (JP); FG INNOVATION COMPANY LIMITED, Tuen Mun (HK)

( * ) Notice: Subject to any disclaimer, the term of this patent is extended or adjusted under 35 U.S.C. 154(b) by 0 days.

(21) Appl. No.: 16/343,427

(22) PCT Filed: Aug. 29, 2017

(86) PCT No.: PCT/JP2017/030961
§ 371 (c)(1),
(2) Date: Apr. 19, 2019

(87) PCT Pub. No.: WO2018/074071
PCT Pub. Date: Apr. 26, 2018

(65) Prior Publication Data
US 2019/0268926 A1    Aug. 29, 2019

(30) Foreign Application Priority Data

Oct. 20, 2016   (JP) .............................. JP2016-205837

(51) Int. Cl.
*H04W 72/12* (2009.01)
*H03M 13/27* (2006.01)
(Continued)

(52) U.S. Cl.
CPC ....... *H04W 72/1268* (2013.01); *H03M 13/27* (2013.01); *H04L 27/26* (2013.01); *H04W 72/04* (2013.01); *H04W 72/12* (2013.01)

(58) Field of Classification Search
CPC .................................................. H04W 72/1268
See application file for complete search history.

(56) References Cited

U.S. PATENT DOCUMENTS

2008/0307427 A1   12/2008   Pi et al.
2009/0077456 A1*   3/2009   Pi .......................... H04L 1/0051
                                                         714/807

(Continued)

FOREIGN PATENT DOCUMENTS

EP            2996274 A1     3/2016
JP         2010-529772 A     8/2010

(Continued)

OTHER PUBLICATIONS

"3rd Generation Partnership Project; Technical Specification Group Radio Access Network; Evolved Universal Terrestrial Radio Access (E-UTRA); Study on latency reduction techniques for LTE (Release 13)", 3GPP TR 36.881 V0.5.2, Feb. 2016, pp. 1-92.

(Continued)

*Primary Examiner* — John D Blanton
(74) *Attorney, Agent, or Firm* — Finnegan, Henderson, Farabow, Garrett & Dunner LLP

(57) ABSTRACT

A communication method used by a terminal apparatus includes the step of separately generating first coded bits $f_k$ of a transport block, second coded bits $q_0$ of control information, and third coded bits $q_1$ of a rank indicator, and multiplexing the first coded bits $f_k$ and the second coded bits $q_0$ to generate multiplexed bits $g_k$, and the step of multiplexing the multiplexed bits $g_k$ and the third coded bits $q_1$ to generate a first sequence $h_k$, wherein the position where the third coded bits $q_1$ are mapped is given at least based on a (Continued)

MAPPING OF CODED BITS part of a first condition, a second condition, and a third condition, the first condition is whether a search space detecting the PDCCH is a CSS or a USS, the second condition is which RNTI is used to scramble CRC parity bits attached to the DCI format, and the third condition is whether the first method or the second method is used for the first coded bits.

16 Claims, 22 Drawing Sheets

(51) Int. Cl.
*H04L 27/26* (2006.01)
*H04W 72/04* (2009.01)

(56) References Cited

U.S. PATENT DOCUMENTS

| | | | |
|---|---|---|---|
| 2009/0100300 | A1 | 4/2009 | Kim et al. |
| 2012/0044893 | A1 | 2/2012 | Suzuki et al. |
| 2014/0126383 | A1 | 5/2014 | Tong et al. |
| 2015/0045085 | A1 | 2/2015 | Kishiyama et al. |
| 2015/0223075 | A1* | 8/2015 | Bashar .................. H04W 16/14 370/329 |
| 2016/0056942 | A1* | 2/2016 | Wang .................... H04L 5/0055 370/330 |
| 2017/0366380 | A1* | 12/2017 | Hwang ................. H04L 5/0055 |
| 2019/0229860 | A1* | 7/2019 | Yoshimura ............ H04L 1/0061 |

FOREIGN PATENT DOCUMENTS

| | | |
|---|---|---|
| JP | 2010-539840 A | 12/2010 |
| JP | 2010-541460 A | 12/2010 |
| JP | 2013-219507 A | 10/2013 |
| JP | 2015-517756 A | 6/2015 |
| WO | 2010/122722 A1 | 10/2010 |
| WO | WO 2016/163369 A1 | 10/2016 |
| WO | 2017/019132 A1 | 2/2017 |

OTHER PUBLICATIONS

Ericsson, "New Work Item on shortened TTI and processing time for LTE", 3GPP TSG RAN Meeting #72, RP-161299, Jun. 13-16, 2016, 8 pages.
European Patent Office, Supplementary European Search Report of EP 17862765.9, dated May 20, 2020.
Ericsson, "UCI on sPUSCH with short TTI," 3GPP TSG-RAN WG1 Meeting #86bis, R1-1610328 (Oct. 9, 2016).
ZTE, "Processing time reduction and related procedures," 3GPP TSG-RAN WG1 Meeting #84bis, RI-162408 (Apr. 2, 2016).
3GPP TS 36.212 (v13.2.0), "LTE; Evolved Universal Terrestrial Radio Access (E-UTRA); Multiplexing and channel coding" (Aug. 24, 2016).
World Intellectual Property Organization, International Search Report of PCT/JP2017/030961, dated Nov. 7, 2017.
Samsung, "Discussion on processing time reduction with 1ms TTI," 3GPP TSG-RAN WG1 Meeting #86bis, R1-1608997 (Oct. 14, 2016).

* cited by examiner

| Field | Bit width | | | |
|---|---|---|---|---|
| | 2 antenna ports | | 4 antenna ports | |
| | Rank = 1 | Rank = 2 | Rank = 1 | Rank > 1 |
| Wideband CQI codeword 0 | 4 | 4 | 4 | 4 |
| Wideband CQI codeword 1 | 0 | 4 | 0 | 4 |
| Precoding matrix indication | $2N$ | $N$ | $4N$ | $4N$ |

FIG. 11

| Field | Bit width | | | |
|---|---|---|---|---|
| | 2 antenna ports | | 4 antenna ports | |
| | Rank = 1 | Rank = 2 | Rank = 1 | Rank > 1 |
| Wideband CQI codeword 0 | 4 | 4 | 8 | 8 |
| Wideband CQI codeword 1 | 4 | 4 | 8 | 8 |
| Precoding matrix indication | $2N$ | $2N$ | $4N$ | $4N$ |

FIG. 13

PUSCH timing k and
corresponding maximum TBS threshold

| TBS | Timing k |
|---|---|
| 0<TBS<=Max TBS1 | K1 |
| Max TBS1<TBS<Max TBS2 | K2 |
| Max TBS2<=TBS | 4 |

FIG. 16A

PUSCH timing k and
corresponding maximum TBS threshold

| TBS | Timing k |
|---|---|
| 0<TBS<=Max TBS3 | K3 |
| Max TBS3<TBS | 4 |

FIG. 16B

HARQ-ACK timing j and
corresponding maximum TBS threshold

| TBS | Timing j |
|---|---|
| 0<TBS<=Max TBS1 | j1 |
| Max TBS1<TBS<Max TBS2 | j2 |
| Max TBS2<=TBS | 4 |

FIG. 18A

HARQ-ACK timing j and
corresponding maximum TBS threshold

| TBS | Timing j |
|---|---|
| 0<TBS<=Max TBS3 | j3 |
| Max TBS3<TBS | 4 |

FIG. 18B

PUSCH timing k and corresponding
maximum TA threshold

| TA | Timing k |
|---|---|
| 0<TA<=Max TA1 | Ka |
| Max TA1<TA<Max TA2 | Kb |
| Max TA2<=TA | 4 |

FIG. 19A

PUSCH timing k and corresponding
maximum TA threshold

| TA | Timing k |
|---|---|
| 0<TA<=Max TA3 | Kc |
| Max TA3<TA | 4 |

FIG. 19B

HARQ-ACK timing j and corresponding maximum TA threshold

| TA | Timing j |
|---|---|
| 0<TA<=Max TA1 | ja |
| Max TA1<TA<Max TA2 | jb |
| Max TA2<=TA | 4 |

FIG. 20A

HARQ-ACK timing j and corresponding maximum TA threshold

| TA | Timing j |
|---|---|
| 0<TA<=Max TA3 | jc |
| Max TA3<TA | 4 |

FIG. 20B

TERMINAL APPARATUS, BASE STATION APPARATUS, AND COMMUNICATION METHOD

TECHNICAL FIELD

The present invention relates to a terminal apparatus, a base station apparatus, and a communication method.

This application claims priority, based on JP 2016-205837 filed on Oct. 20, 2016, the contents of which are incorporated herein by reference.

BACKGROUND ART

In the 3rd Generation Partnership Project (3GPP), a radio access method and a radio network for cellular mobile communications (hereinafter, referred to as "Long Term Evolution (LTE)", or "Evolved Universal Terrestrial Radio Access (EUTRA)") have been studied (NPL. 1). In LTE, a base station apparatus is also referred to as an evolved NodeB (eNodeB), and a terminal apparatus is also referred to as a User Equipment (UE). LTE is a cellular communication system in which multiple areas are deployed in a cellular structure, with each of the multiple areas being covered by a base station apparatus. In such a cellular communication system, a single base station apparatus may manage multiple cells.

In 3GPP, latency reduction enhancements have been studied. For example, as solutions to reduction of the latency time, Semi-Persistent Scheduling (SPS), UL Grant reception, and Configured SPS activation and deactivation have been studied (NPL 1). Studies to shorten processing time has also begun (NPL 2).

CITATION LIST

Non Patent Literature

NPL 1: "3GPP TR 36.881 V0.5.2 (2016-02) Evolved Universal Terrestrial Radio Access (E-UTRA), Study on latency reduction techniques for LTE (Release13)", R2-161963, Ericsson.

NPL 2: "Work Item on shortened TTI and processing time for LTE", RP-161299, Ericsson, 3GPP TSG RAN Meeting #72, Busan, Korea, Jun. 13-16, 2016

SUMMARY OF INVENTION

Technical Problem

However, for the radio communication system as described above, a concrete method of a procedure to shorten processing time has not been sufficiently studied.

One aspect of the present invention is to provide a terminal apparatus, a base station apparatus, and a communication method which can communicate efficiently.

Solution to Problem (1) To accomplish the object described above, aspects of the present invention are contrived to provide the following measures. Specifically, a first aspect of the present invention is a terminal apparatus including: a reception unit configured to detect a PDCCH including a DCI format; a transmission unit configured to transmit a PUSCH including a transport block, control information, and a rank indicator, based on detection of the PDCCH, the control information including a channel quality indicator and/or a precoding matrix indicator; a coding processing unit configured to separately generate first coded bits $f_k$ of the transport block, second coded bits $q_0$ of the control information, and third coded bits $q_1$ of the rank indicator, and multiplex the first coded bits $f_k$ and the second coded bits $q_0$ to generate multiplexed bits $g_k$; and a channel interleaver unit configured to multiplex the multiplexed bits $g_k$ and the third coded bits $q_1$ to generate a first sequence $h_k$, wherein multiplexing the multiplexed bits $g_k$ and the third coded bit $q_1$ includes (i) a first procedure for mapping the third coded bits $q_1$ to a matrix, (ii) a second procedure for mapping the multiplexed bits $g_k$ to the matrix, except a position where the third coded bits $q_1$ are mapped, and (iii) a third procedure for generating the first sequence $h_k$ by reading from the matrix column by column after the first procedure and the second procedure, in the second procedure, either a first method or a second method is used for mapping the multiplexed bits $g_k$, the position where the third coded bits $q_1$ are mapped is given at least based on a part of a first condition, a second condition, and a third condition, the first condition is whether a search space detecting the PDCCH is a CSS or a USS, the second condition is which RNTI is used to scramble CRC parity bits attached to the DCI format, and the third condition is whether the first method or the second method is used for the first coded bits.

(2) A second aspect of the present invention is a terminal apparatus including: a reception unit configured to detect a PDCCH including a DCI format; transmission unit configured to transmit a PUSCH including a transport block, control information, and a rank indicator, based on detection of the PDCCH, the control information including a channel quality indicator and/or a precoding matrix indicator; a coding processing unit configured to separately generate first coded bits $f_k$ of the transport block, second coded bits $q_0$ of the control information, and third coded bits $q_1$ of the rank indicator, and multiplex the first coded bits $f_k$ and the second coded bits $q_0$ to generate multiplexed bits $g_k$; and a channel interleaver unit configured to multiplex the multiplexed bits $g_k$ and the third coded bits $q_1$ to generate a first sequence $h_k$, wherein multiplexing the multiplexed bits $g_k$ and the third coded bit $q_1$ includes (i) a first procedure for mapping the third coded bits $q_1$ to a matrix, (ii) a second procedure for mapping the multiplexed bits $g_k$ to the matrix, except a position where the third coded bits $q_1$ are mapped, and (iii) a third procedure for generating the first sequence $h_k$ by reading from the matrix column by column after the first procedure and the second procedure, in the second procedure, either a first method or a second method is used for mapping the multiplexed bits $g_k$, whether the second coded bits $q_0$ are concatenated on a front side or an end side of the first coded bits $f_k$ is given at least based on a part of a first condition, a second condition, and a third condition, the first condition is whether a search space detecting the PDCCH is a CSS or a USS, the second condition is whether or not CRC parity bits attached to the DCI format is scrambled with any RNTI, and the third condition is whether the first method or the second method is used for the first coded bits.

(3) A third aspect of the present invention is a terminal apparatus including: a reception unit configured to detect a PDCCH including a DCI format; a transmission unit configured to transmit a PUSCH including a transport block, control information, and a rank indicator, based on detection of the PDCCH, the control information including a channel quality indicator and/or a precoding matrix indicator; a coding processing unit configured to separately generate first coded bits $f_k$ of the transport block, second coded bits $q_0$ of the control information, and third coded bits $q_1$ of the rank indicator, and multiplex the first coded bits $f_k$ and the second coded bits $q_0$ to generate multiplexed bits $g_k$; and a channel interleaver unit configured to multiplex the multiplexed bits $g_k$ and the third coded bits $q_1$ to generate a first sequence $h_k$, wherein multiplexing the multiplexed bits $g_k$ and the third coded bit $q_1$ includes (i) a first procedure for mapping the third coded bits $q_1$ to a matrix, (ii) a second procedure for mapping the multiplexed bits $g_k$ to the matrix, except a position where the third coded bits $q_1$ are mapped, and (iii) a third procedure for generating the first sequence $h_k$ by reading from the matrix column by column after the first procedure and the second procedure, in the second procedure, either a first method or a second method is used for mapping the multiplexed bits $g_k$, in a case that the first method is used for mapping the multiplexed bits $g_k$, the number of bits of the control information is given at least based on a value of the rank indicator, and in a case that the second method is used for mapping the multiplexed bits $g_k$, the number of bits of the control information is given regardless the value of the rank indicator.

(4) A fourth aspect of the present invention is a base station apparatus including: a transmission unit configured to transmit a PDCCH including a DCI format to a terminal apparatus; and a reception unit configured to receive, from the terminal apparatus, a PUSCH corresponding to the PDCCH and including a transport block, control information, and a rank indicator, wherein the control information includes a channel quality indicator and/or a precoding matrix indicator, first coded bits $f_k$ of the transport block, second coded bits $q_0$ of the control information, and third coded bits $q_1$ of the rank indicator are separately generated, by the terminal apparatus, the first coded bits $f_k$ and the second coded bits $q_0$ are multiplexed to generate multiplexed bits $g_k$, by the terminal apparatus, the multiplexed bits $g_k$ and the third coded bits $q_1$ are multiplexed to generate a first sequence $h_k$, by the terminal apparatus, multiplexing the multiplexed bits $g_k$ and the third coded bit $q_1$ by the terminal apparatus includes (i) a first procedure for mapping the third coded bits $q_1$ to a matrix, (ii) a second procedure for mapping the multiplexed bits $g_k$ to the matrix, except a position where the third coded bits $q_1$ are mapped, and (iii) a third procedure for generating the first sequence $h_k$ by reading from the matrix column by column after the first procedure and the second procedure, in the second procedure, either a first method or a second method is used for mapping the multiplexed bits $g_k$, the position where the third coded bits $q_1$ are mapped is given at least based on a part of a first condition, a second condition, and a third condition, the first condition is whether a search space detecting the PDCCH is a CSS or a USS, the second condition is with which RNTI are used to scramble CRC parity bits attached to the DCI format, and the third condition is whether the first method or the second method are used for the first coded bits.

(5) A fifth aspect of the present invention is a terminal apparatus including: a reception unit configured to detect a PDCCH including a DCI format; a transmission unit configured to transmit a PUSCH including a transport block, control information, and a rank indicator, based on detection of the PDCCH, the control information including a channel quality indicator and/or a precoding matrix indicator; a coding processing unit configured to separately generate first coded bits $f_k$ of the transport block, second coded bits $q_0$ of the control information, and third coded bits $q_1$ of the rank indicator, and multiplex the first coded bits $f_k$ and the second coded bits $q_0$ to generate multiplexed bits $g_k$; and a channel interleaver unit configured to multiplex the multiplexed bits $g_k$ and the third coded bits $q_1$ to generate a first sequence $h_k$, wherein multiplexing the multiplexed bits $g_k$ and the third coded bit $q_1$ includes (i) a first procedure for mapping the third coded bits $q_1$ to a matrix, (ii) a second procedure for mapping the multiplexed bits $g_k$ to the matrix, except a position where the third coded bits $q_1$ are mapped, and (iii) a third procedure for generating the first sequence $h_k$ by reading from the matrix column by column after the first procedure and the second procedure, in the second procedure, either a first method or a second method is used for mapping the multiplexed bits $g_k$, in a case that the first method is used for mapping the multiplexed bits $g_k$, the number of bits of the control information is given at least based on a value of the rank indicator, and in a case that the second method is used for mapping the multiplexed bits $g_k$, the number of bits of the control information is given regardless the value of the rank indicator.

(6) A sixth aspect of the present invention is a base station apparatus including: a transmission unit configured to transmit a PDCCH including a DCI format to a terminal apparatus; and a reception unit configured to receive, from the terminal apparatus, a PUSCH corresponding to the PDCCH and including a transport block, control information, and a rank indicator, wherein the control information includes a channel quality indicator and/or a precoding matrix indicator, first coded bits $f_k$ of the transport block, second coded bits $q_0$ of the control information, and third coded bits $q_1$ of the rank indicator are separately generated, by the terminal apparatus, the first coded bits $f_k$ and the second coded bits $q_0$ are multiplexed to generate multiplexed bits $g_k$, by the terminal apparatus, the multiplexed bits $g_k$ and the third coded bits $q_1$ are multiplexed to generate a first sequence $h_k$, by the terminal apparatus, multiplexing the multiplexed bits $g_k$ and the third coded bit $q_1$ by the terminal apparatus includes (i) a first procedure for mapping the third coded bits $q_1$ to a matrix, (ii) a second procedure for mapping the multiplexed bits $g_k$ to the matrix, except a position where the third coded bits $q_1$ are mapped, and (iii) a third procedure for generating the first sequence $h_k$ by reading from the matrix column by column after the first procedure and the second procedure, in the second procedure, either a first method or a second method is used for mapping the multiplexed bits $g_k$, the position where the third coded bits $q_1$ are mapped is given at least based on a part of a first condition, a second condition, and a third condition, the first condition is whether a search space detecting the PDCCH is a CSS or a USS, the second condition is with which RNTI are used to scramble CRC parity bits attached to the DCI format, and the third condition is whether the first method or the second method are used for the first coded bits.

(7) A seventh aspect of the present invention is a communication method used by a terminal apparatus, the communication method including the steps of: detecting a PDCCH including a DCI format; transmitting a PUSCH including a transport block, control information, and a rank indicator, based on detection of the PDCCH, the control information including a channel quality indicator and/or a precoding matrix indicator; separately generating first coded bits $f_k$ of the transport block, second coded bits $q_0$ of the control information, and third coded bits $q_1$ of the rank indicator, and multiplexing the first coded bits $f_k$ and the second coded bits $q_0$ to generate multiplexed bits $g_k$; and multiplexing the multiplexed bits $g_k$ and the third coded bits $q_1$ to generate a first sequence $h_k$, wherein multiplexing the multiplexed bits $g_k$ and the third coded bit $q_1$ includes (i) a first procedure for mapping the third coded bits $q_1$ to a matrix, (ii) a second procedure for mapping the multiplexed bits $g_k$ to the matrix, except a position where the third coded bits $q_1$ are mapped, and (iii) a third procedure for generating the first sequence $h_k$ by reading from the matrix column by column after the first procedure and the second procedure, in the second procedure, either a first method or a second method is used for mapping the multiplexed bits $g_k$, the position where the third coded bits $q_1$ are mapped is given at least based on a part of a first condition, a second condition, and a third condition, the first condition is whether a search space detecting the PDCCH is a CSS or a USS, the second condition is which RNTI is used to scramble CRC parity bits attached to the DCI format, and the third condition is whether the first method or the second method is used for the first coded bits.

(8) An eighth aspect of the present invention is a communication method used by a terminal apparatus, the communication method including the steps of: detecting a PDCCH including a DCI format; transmitting a PUSCH including a transport block, control information, and a rank indicator, based on detection of the PDCCH, the control information including a channel quality indicator and/or a precoding matrix indicator; separately generating first coded bits $f_k$ of the transport block, second coded bits $q_0$ of the control information, and third coded bits $q_1$ of the rank indicator, and multiplexing the first coded bits $f_k$ and the second coded bits $q_0$ to generate multiplexed bits $g_k$; and multiplexing the multiplexed bits $g_k$ and the third coded bits $q_1$ to generate a first sequence $h_k$, wherein multiplexing the multiplexed bits $g_k$ and the third coded bit $q_1$ includes (i) a first procedure for mapping the third coded bits $q_1$ to a matrix, (ii) a second procedure for mapping the multiplexed bits $g_k$ to the matrix, except a position where the third coded bits $q_1$ are mapped, and (iii) a third procedure for generating the first sequence $h_k$ by reading from the matrix column by column after the first procedure and the second procedure, in the second procedure, either a first method or a second method is used for mapping the multiplexed bits $g_k$, whether the second coded bits $q_0$ are concatenated on a front side or an end side of the first coded bits $f_k$ is given at least based on a part of a first condition, a second condition, and a third condition, the first condition is whether a search space detecting the PDCCH is a CSS or a USS, the second condition is whether or not CRC parity bits attached to the DCI format is scrambled with any RNTI, and the third condition is whether the first method or the second method is used for the first coded bits.

(9) A ninth aspect of the present invention is a communication method used by a terminal apparatus, the communication method including the steps of: detecting a PDCCH including a DCI format; transmitting a PUSCH including a transport block, control information, and a rank indicator, based on detection of the PDCCH, the control information including a channel quality indicator and/or a precoding matrix indicator; separately generating first coded bits $f_k$ of the transport block, second coded bits $q_0$ of the control information, and third coded bits $q_1$ of the rank indicator, and multiplexing the first coded bits $f_k$ and the second coded bits $q_0$ to generate multiplexed bits $g_k$; and multiplexing the multiplexed bits $g_k$ and the third coded bits $q_1$ to generate a first sequence $h_k$, wherein multiplexing the multiplexed bits $g_k$ and the third coded bit $q_1$ includes (i) a first procedure for mapping the third coded bits $q_1$ to a matrix, (ii) a second procedure for mapping the multiplexed bits $g_k$ to the matrix, except a position where the third coded bits $q_1$ are mapped, and (iii) a third procedure for generating the first sequence $h_k$ by reading from the matrix column by column after the first procedure and the second procedure, in the second procedure, either a first method or a second method is used for mapping the multiplexed bits $g_k$, in the case that the first method is used for mapping the multiplexed bits $g_k$, the number of bits of the control information is given at least based on a value of the rank indicator, and in a case that the second method is used for mapping the multiplexed bits $g_k$, the number of bits of the control information is given regardless the value of the rank indicator.

(10) A tenth aspect of the present invention is a communication method used by a base station apparatus, the communication method including the steps of: transmitting a PDCCH including a DCI format to a terminal apparatus; and receiving, from the terminal apparatus, a PUSCH corresponding to the PDCCH and including a transport block, control information, and a rank indicator, wherein the control information includes a channel quality indicator and/or a precoding matrix indicator, first coded bits $f_k$ of the transport block, second coded bits $q_0$ of the control information, and third coded bits $q_1$ of the rank indicator are separately generated, by the terminal apparatus, the first coded bits $f_k$ and the second coded bits $q_0$ are multiplexed to generate multiplexed bits $g_k$, by the terminal apparatus, the multiplexed bits $g_k$ and the third coded bits $q_1$ are multiplexed to generate a first sequence $h_k$, by the terminal apparatus, multiplexing the multiplexed bits $g_k$ and the third coded bit $q_1$ by the terminal apparatus includes (i) a first procedure for mapping the third coded bits $q_1$ to a matrix, (ii) a second procedure for mapping the multiplexed bits $g_k$ to the matrix, except a position where the third coded bits $q_1$ are mapped, and (iii) a third procedure for generating the first sequence $h_k$ by reading from the matrix column by column after the first procedure and the second procedure, in the second procedure, either a first method or a second method is used for mapping the multiplexed bits $g_k$, the position where the third coded bits $q_1$ are mapped is given at least based on a part of a first condition, a second condition, and a third condition, the first condition is whether a search space detecting the PDCCH is a CSS or a USS, the second condition is with which RNTI are used to scramble CRC parity bits attached to the DCI format, and the third condition is whether the first method or the second method are used for the first coded bits.

(11) An eleventh aspect of the present invention is a communication method used by a base station apparatus, the communication method including the steps of: transmitting a PDCCH including a DCI format to a terminal apparatus; and receiving, from the terminal apparatus, a PUSCH corresponding to the PDCCH and including a transport block, control information, and a rank indicator, wherein the control information includes a channel quality indicator and/or a precoding matrix indicator, first coded bits $f_k$ of the transport block, second coded bits $q_0$ of the control information, and third coded bits $q_1$ of the rank indicator are separately generated, by the terminal apparatus, the first coded bits $f_k$ and the second coded bits $q_0$ are multiplexed to generate multiplexed bits $g_k$, by the terminal apparatus, the multiplexed bits $g_k$ and the third coded bits $q_1$ are multiplexed to generate a first sequence $h_k$, by the terminal apparatus, multiplexing the multiplexed bits $g_k$ and the third coded bit $q_1$ by the terminal apparatus includes (i) a first procedure for mapping the third coded bits $q_1$ to a matrix, (ii) a second procedure for mapping the multiplexed bits $g_k$ to the matrix, except a position where the third coded bits $q_1$ are mapped, and (iii) a third procedure for generating the first sequence $h_k$ by reading from the matrix column by column after the first procedure and the second procedure, in the second procedure, either a first method or a second method is used for mapping the multiplexed bits $g_k$, whether the second coded bits $q_0$ are concatenated on a front side or an end side of the first coded bits $f_k$ is given at least based on a part of a first condition, a second condition, and a third condition, the first condition is whether a search space detecting the PDCCH is a CSS or a USS, the second condition is which RNTI is used to scramble CRC parity bits attached to the DCI format, and the third condition is whether the first method or the second method is used for the first coded bits.

(12) A twentieth aspect of the present invention is a communication method used by a base station apparatus, the communication method including the steps of: transmitting a PDCCH including a DCI format to a terminal apparatus; and receiving, from the terminal apparatus, a PUSCH corresponding to the PDCCH and including a transport block, control information, and a rank indicator, wherein the control information includes a channel quality indicator and/or a precoding matrix indicator, first coded bits $f_k$ of the transport block, second coded bits $q_0$ of the control information, and third coded bits $q_1$ of the rank indicator are separately generated, by the terminal apparatus, the first coded bits $f_k$ and the second coded bits $q_0$ are multiplexed to generate multiplexed bits $g_k$, by the terminal apparatus, the multiplexed bits $g_k$ and the third coded bits $q_1$ are multiplexed to generate a first sequence $h_k$, by the terminal apparatus, multiplexing the multiplexed bits $g_k$ and the third coded bit $q_1$ by the terminal apparatus includes (i) a first procedure for mapping the third coded bits $q_1$ to a matrix, (ii) a second procedure for mapping the multiplexed bits $g_k$ to the matrix, except a position where the third coded bits $q_1$ are mapped, and (iii) a third procedure for generating the first sequence $h_k$ by reading from the matrix column by column after the first procedure and the second procedure, in the second procedure, either a first method or a second method is used for mapping the multiplexed bits $g_k$, in a case that the first method is used for mapping the multiplexed bits $g_k$, the number of bits of the control information is given at least based on a value of the rank indicator, and in a case that the second method is used for mapping the multiplexed bits $g_k$, the number of bits of the control information is given regardless the value of the rank indicator.

Advantageous Effects of Invention

According to some aspects of the present invention, a base station apparatus and a terminal apparatus efficiently communicate with each other.

BRIEF DESCRIPTION OF DRAWINGS

FIG. 11 is a diagram illustrating an example of the number of bits of channel quality indicator and precoding matrix indicator according to the present embodiment.

FIG. 13 is a diagram illustrating an example of the number of bits of channel quality indicator and precoding matrix indicator according to the present embodiment.

FIG. 16A is a diagram illustrating an example of threshold values of maximum TBS and transmission timings (values of k) of corresponding PUSCHs according to the present embodiment.

FIG. 16B is a diagram illustrating another example of threshold values of maximum TBS and transmission timings (values of k) of corresponding PUSCHs according to the present embodiment.

FIG. 18A is a diagram illustrating an example of threshold values of maximum TBS and transmission timings (values of j) of corresponding HARQ-ACKs according to the present embodiment.

FIG. 18B is a diagram illustrating another example of threshold values of maximum TBS and transmission timings (values of j) of corresponding HARQ-ACKs according to the present embodiment.

FIG. 19A is a diagram illustrating an example of PUSCH transmission timings (values of k) and threshold values of corresponding prescribed maximum TA according to the present embodiment.

FIG. 19B is a diagram illustrating another example of PUSCH transmission timings (values of k) and threshold values of corresponding prescribed maximum TA according to the present embodiment.

FIG. 20A is a diagram illustrating an example of transmission timings (values of j) of HARQ-ACK and threshold values of corresponding prescribed maximum TA according to the present embodiment.

FIG. 20B is a diagram illustrating another example of transmission timings (values of j) of HARQ-ACK and threshold values of corresponding prescribed maximum TA according to the present embodiment.

DESCRIPTION OF EMBODIMENTS

Each embodiment of the present invention will be described below.

Figure 1:
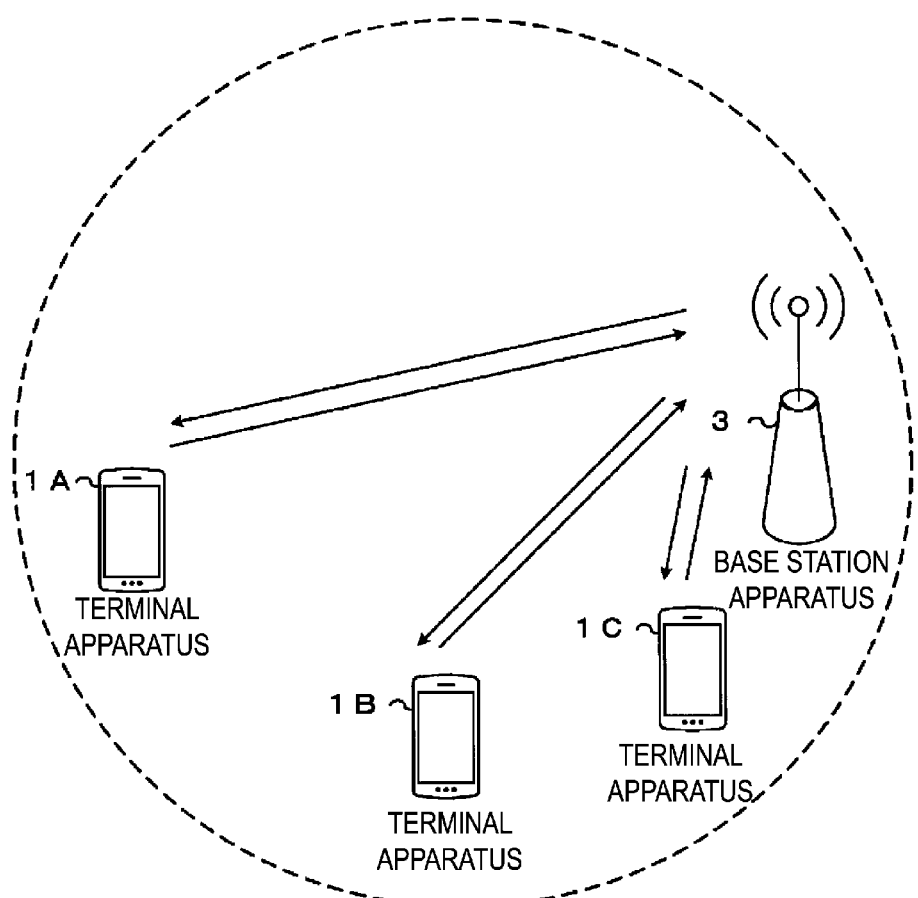
FIG. 1 is a diagram illustrating a concept of a radio communication system according to the present embodiment.

FIG. 1 is a conceptual diagram of a radio communication system according to the present embodiment. In FIG. 1, a radio communication system includes terminal apparatuses 1A to 1C and a base station apparatus 3. Hereinafter, the terminal apparatuses 1A to 1C are each also referred to as a terminal apparatus 1.

Figure 2:
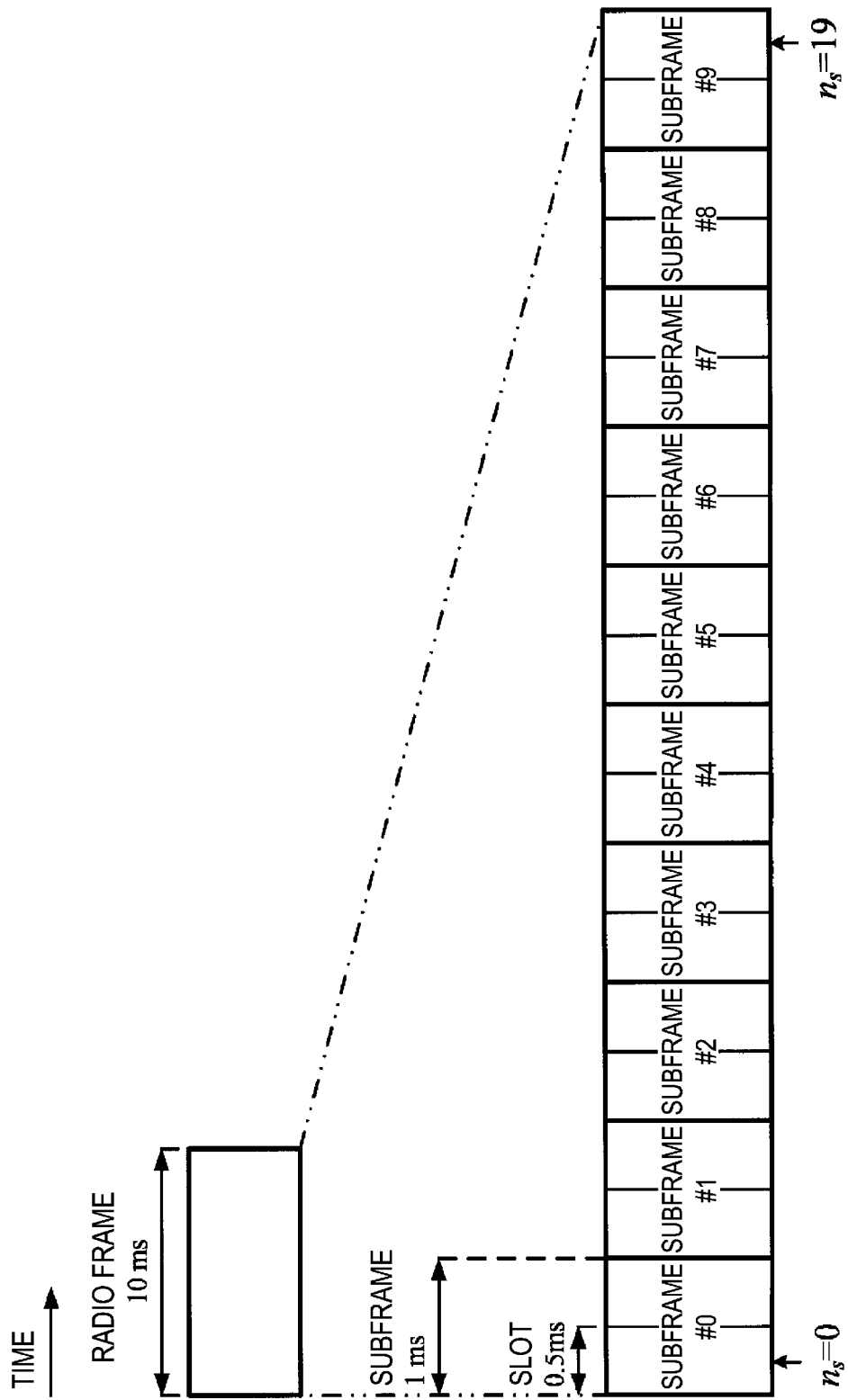
FIG. 2 is a diagram illustrating a schematic configuration of a radio frame according to the present embodiment.

FIG. 2 is a diagram illustrating a schematic configuration of a radio frame according to the present embodiment. In FIG. 2, the horizontal axis is a time axis.

Sizes of various kinds of fields in the time domain are expressed by the number of time units $T_s=1/(15000*2048)$ seconds. The length of a radio frame is $T_f=307200*T_s=10$ ms. Each of the radio frames includes ten contiguous subframes in the time domain. The length of each of subframes is $T_{subframe}=30720*T_s=1$ ms. Each of subframes i includes two contiguous slots in the time domain. The two contiguous slots in the time domain are a slot having a slot number $n_s$ of 2i in the radio frame and a slot having a slot number $n_s$ of 2i+1 in the radio frame. The length of each of slots is $T_{slot}=153600*n_s=0.5$ ms. Each of the radio frames includes ten contiguous subframes in the time domain. Each of the radio frames includes 20 contiguous slots ($n_s=0, 1, \ldots, 19$) in the time domain.

Figure 3:
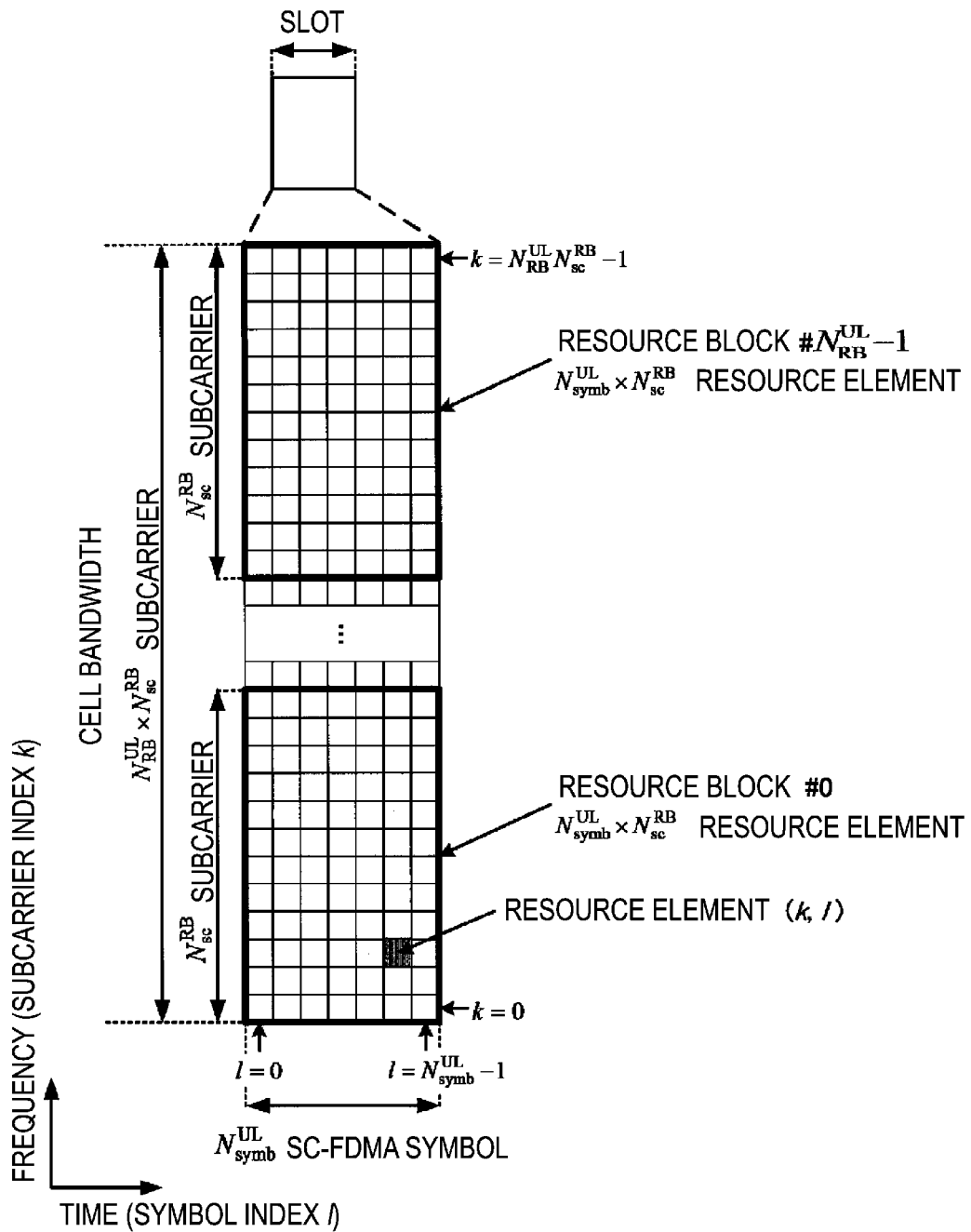
FIG. 3 is a diagram illustrating a schematic configuration of an uplink slot according to the present embodiment.

A configuration of a slot according to the present embodiment will be described below. FIG. 3 is a diagram illustrating a schematic configuration of an uplink slot according to the present embodiment. FIG. 3 illustrates a configuration of an uplink slot in a cell. In FIG. 3, the horizontal axis is a time axis, and the vertical axis is a frequency axis. In FIG. 3, 1 is a Single Carrier-Frequency Division Multiple Access (SC-FDMA) symbol number/index, and k is a subcarrier number/index.

The physical signal or the physical channel transmitted in each of the slots is expressed by a resource grid. In uplink, the resource grid is defined by multiple subcarriers and multiple SC-FDMA symbols. Each element within the resource grid is referred to as a resource element. The resource element is expressed by a subcarrier number/index k and an SC-FDMA symbol number/index 1.

The resource grid is defined for each antenna port. In the present embodiment, description is given for one antenna port. The present embodiment may be applied to each of multiple antenna ports.

The uplink slot includes multiple SC-FDMA symbols 1 ($1=0, 1, \ldots, N^{UL}_{symb}$) in the time domain. $N^{UL}_{symb}$ indicates the number of SC-FDMA symbols included in one uplink slot. For a normal Cyclic Prefix (CP), $N^{UL}_{symb}$ is 7. For an extended Cyclic Prefix (CP), $N^{UL}_{symb}$ is 6. Thus, for a normal CP, one subframe is constituted by 14 SC-FDMA symbols. For an extended CP, one subframe is constituted by 12 SC-FDMA symbols.

The uplink slot includes multiple subcarriers k ($k=0, 1, \ldots, N^{UL}_{RB}*N^{RB}_{sc}$) in the frequency domain. $N^{UL}RB_{is}$ an uplink bandwidth configuration for the serving cell expressed by a multiple of $N^{RB}_{sc}$. $N^{RB}_{sc}$ is the (physical) resource block size in the frequency domain expressed by the number of subcarriers. In the present embodiment, the subcarrier interval $\Delta f$ is 15 kHz, and $N^{RB}_{sc}$ is 12 subcarriers. Thus, in the present embodiment, $N^{RB}_{sc}$ is 180 kHz.

A resource block is used to express mapping of a physical channel to resource elements. For a resource block, a virtual resource block and a physical resource block are defined. A physical channel is first mapped to a virtual resource block. Then, the virtual resource block is mapped to the physical resource block. One physical resource block is defined by $N^{UL}_{symb}$ contiguous SC-FDMA symbols in the time domain and by $N^{RB}_{sc}$ contiguous subcarriers in the frequency domain. Thus, one physical resource block is constituted by ($N^{UL}_{symb}*N^{RB}_{sc}$) resource elements. One physical resource block corresponds to one slot in the time domain. The physical resource blocks are numbered ($0, 1, \ldots, N^{UL}_{RB}-1$) in ascending order of frequencies in the frequency domain.

The downlink slot according to the present embodiment includes multiple OFDM symbols. Since the configuration of the downlink slot according to the present embodiment is the same as the configuration of the uplink slot except that a resource grid is defined by multiple subcarriers and by multiple OFDM symbols, the description of the configuration of the downlink slot will be omitted.

Here, for transmission in the downlink and/or transmission in the uplink, a Transmission Time Interval (TTI) may be defined. Thus, transmission in the downlink and/or transmission in the uplink may be performed in one transmission time interval (the length of one transmission time interval).

For example, in the downlink, the TTI is constituted by 14 OFDM symbols (one subframe and/or 1 ms). A transmission time interval constituted by less than 14 OFDM symbols is also referred to as a short Transmission Interval (sTTI). Alternatively, a transmission time interval that is shorter than a prescribed transmission time interval (or a transmission period) is also referred to as a sTTI. Here, the prescribed transmission time interval may be 1 ms. The sTTI may be also referred to as a mini-slot. Here, an OFDM symbol may be an SC-FDMA symbol.

In the uplink, a TTI is constituted by 14 SC-FDMA symbols (one subframe and/or 1 ms). A transmission time interval constituted by less than 14 SC-FDMA symbols is also referred to as a sTTI. Alternatively, a transmission time interval that is shorter than a prescribed transmission time interval (or a transmission period) is also referred to as a sTTI. Here, the prescribed transmission time interval may be 1 ms. The sTTI is also referred to as a mini-slot. Here, an SC-FDMA symbol may be an OFDM symbol.

Physical channels and physical signals according to the present embodiment will be described.

In FIG. 1, in uplink radio communication from the terminal apparatus 1 to the base station apparatus 3, the following uplink physical channels are used. Here, the uplink physical channels are used to transmit information output from the higher layers.

Physical Uplink Control Channel (PUCCH)
Physical Uplink Shared Channel (PUSCH)
Physical Random Access Channel (PRACH)

Here, a PUCCH, a PUSCH, and a PRACH transmitted by a sTTI may be referred to as an sPUCCH, an sPUSCH, and an sPRACH, respectively.

The PUCCH is used to transmit Uplink Control Information (UCI). Here, uplink control information may include Channel State Information (CSI) for the downlink. The uplink control information may include a Scheduling Request (SR) used to request a UL-SCH resource. The uplink control information may include Hybrid Automatic Repeat request ACKnowledgment (HARQ-ACK). Here, the PUCCH may be an sPUCCH. The sPUCCH may be constituted by a number of OFDM symbols less than the number of OFDM symbols included in the PUCCH. For example, the sPUCCH may be constituted by a number of OFDM symbols less than 14. The sPUCCH may include a transmission time interval that is shorter than a prescribed transmission time interval. The sPUCCH may include a transmission time interval corresponding to the sTTI.

Here, HARQ-ACK may indicate HARQ-ACK for downlink data (Transport block, Medium Access Control Protocol Data Unit (MAC PDU), Downlink-Shared Channel (DL-SCH), or Physical Downlink Shared Channel (PDSCH)). In other words, HARQ-ACK may indicate acknowledgement, positive-acknowledgment (ACK) or negative-acknowledgement (NACK) for downlink data. CSI may be constituted by a channel quality indicator (CQI), a precoding matrix indicator (PMI), and/or a rank indicator (RI). HARQ-ACK may be referred to as a HARQ-ACK response or an ACK/NACK response.

The PUSCH is used to transmit uplink data (Uplink-Shared Channel (UL-SCH)). The PUSCH is used to transmit random access message 3. The PUSCH may be used to transmit HARQ-ACK and/or CSI with uplink data which does not include random access message 3. The PUSCH may be used to transmit CSI only or HARQ-ACK and CSI only. In other words, the PUSCH may be used to transmit the uplink control information only. Here, the PUSCH may be an sPUSCH. The sPUSCH may be constituted by a number of OFDM symbols less than the number of OFDM symbols included in the PUSCH. For example, the sPUSCH may be constituted by a number of OFDM symbols less than 14. The sPUSCH may include a transmission time interval that is shorter than a prescribed transmission time interval. The sPUSCH may include a transmission time interval corresponding to the sTTI.

Here, the base station apparatus 3 and the terminal apparatus 1 may exchange (transmit and/or receive) signals with each other in their respective higher layers. For example, the base station apparatus 3 and the terminal apparatus 1 may transmit and/or receive RRC signaling (also referred to as an RRC message or RRC information) in a Radio Resource Control (RRC) layer. The base station apparatus 3 and the terminal apparatus 1 may exchange (transmit and/or receive) a Medium Access Control (MAC) control element in a MAC layer. Here, the RRC signaling and/or the MAC control element is also referred to as higher layer signaling.

Here, in the present embodiment, "a parameter of a higher layer", "a message of a higher layer", "higher layer signaling", "information of a higher layer", and "an information element of a higher layer" may be the same.

The PUSCH may be used to transmit the RRC signaling and the MAC control element. Here, the RRC signaling transmitted from the base station apparatus 3 may be signaling common to multiple terminal apparatuses 1 in a cell. The RRC signaling transmitted from the base station apparatus 3 may be signaling dedicated to a certain terminal apparatus 1 (also referred to as dedicated signaling). In other words, UE-specific information (information unique to a UE) may be transmitted through signaling dedicated to the certain terminal apparatus 1.

The PRACH is used to transmit a random access preamble. For example, the PRACH (or a random access procedure) is used with a main purpose for the terminal apparatus 1 to obtain synchronization in the time domain with the base station apparatus 3. The PRACH (or a random access procedure) may be also used for an initial connection establishment procedure, a handover procedure, a connection re-establishment procedure, synchronization (timing adjustment) for uplink transmission, and transmission of a scheduling request (a request of a PUSCH resource, or a request of a UL-SCH resource).

In FIG. 1, the following uplink physical signal is used in the uplink radio communication. Here, the uplink physical signal is not used to transmit information output from the higher layers but is used by the physical layer.

Uplink Reference Signal (UL RS)

According to the present embodiment, the following two types of uplink reference signals are used.

Demodulation Reference Signal (DMRS)

Sounding Reference Signal (SRS)

The DMRS is associated with transmission of the PUSCH or the PUCCH. The DMRS is time-multiplexed with the PUSCH or the PUCCH. The base station apparatus 3 uses the DMRS in order to perform channel compensation of the PUSCH or the PUCCH. Transmission of both of the PUSCH and the DMRS is hereinafter referred to simply as transmission of the PUSCH. Transmission of both of the PUCCH and the DMRS is hereinafter referred to simply as transmission of the PUCCH.

The SRS is not associated with the transmission of the PUSCH or the PUCCH. The base station apparatus 3 may use the SRS for measurement of a channel state. The SRS is transmitted in the last SC-FDMA symbol in an uplink subframe or an SC-FDMA symbol in an UpPTS.

In FIG. 1, the following downlink physical channels are used for downlink radio communication from the base station apparatus 3 to the terminal apparatus 1. Here, the downlink physical channels are used to transmit the information output from the higher layers.

Physical Broadcast Channel (PBCH)
Physical Control Format Indicator Channel (PCFICH)
Physical Hybrid automatic repeat request Indicator Channel (PHICH)
Physical Downlink Control Channel (PDCCH)
Enhanced Physical Downlink Control Channel (EPDCCH)
Physical Downlink Shared Channel (PDSCH)
Physical Multicast Channel (PMCH)

Here, a PBCH, a PCFICH, a PHICH, a PDCCH, an EPDCCH, a PDSCH, and a PMCH transmitted by a sTTI may be referred to an sPBCH, an sPCFICH, an sPHICH, an sPDCCH, an sEPDCCH, an sPDSCH, and an sPMCH, respectively.

The PBCH is used for broadcasting a Master Information Block (MIB, a Broadcast Channel (BCH)) that is shared by the terminal apparatuses 1.

The PCFICH is used for transmission of information indicating a region (OFDM symbols) to be used for transmission of the PDCCH.

The PHICH is used to transmit an HARQ indicator (HARQ feedback or response information) indicating an ACKnowledgement (ACK) or a Negative ACKnowledgement (NACK) with respect to the uplink data (Uplink Shared Channel (UL-SCH)) received by the base station apparatus 3.

The PDCCH and the EPDCCH are used to transmit Downlink Control Information (DCI).

For the downlink control information transmitted by the PDCCH and the EPDCCH, one or multiple types of downlink control information of may be used depending on purposes of utilization. The downlink control information transmitted by the PDCCH and the EPDCCH may vary in types depending on purposes of utilization. The downlink control information transmitted depending on purposes of utilization may be defined as a DCI format. A purpose of utilization may be defined for each DCI format, and a type of downlink control information or a DCI field to be transmitted may be defined for each DCI format. For example, the DCI and/or the DCI format may be used for scheduling of the PDSCH or the PUSCH. In other words, the PDCCH and the EPDCCH may be used at least to transmit downlink control information for the PDSCH. The PDCCH and the EPDCCH may be used at least to transmit the DCI and/or the DCI format for the PUSCH.

The sPDCCH may be used at least to transmit the DCI and/or the DCI format for the sPDSCH. The sPDCCH may be used at least to transmit downlink control information for the sPUSCH. In other words, sPDCCH may be at least a downlink control channel used to transmit downlink control information for the sPUSCH. Here, downlink control information transmitted in the sPDCCH, or in other words, downlink control information used for scheduling of the sPDSCH or the sPUSCH may be referred to as an sDCI and/or an sDCI format. Here, the sPDCCH may include the sEPDCCH.

The DCI may include the sDCI. The DCI format may include the sDCI format. In other words, the DCI and/or the DCI format may be used for scheduling of the sPUSCH or the sPDSCH. Here, the sDCI may be defined as a channel including allocation information of the sPDSCH. In other words, the sDCI may be used for allocation of the sPDSCH. The sDCI may be defined as a channel including allocation information of the sPUSCH. In other words, the sDCI may be used for allocation of the sPUSCH. Here, a payload size (or a format size) of a prescribed DCI format may be a prescribed payload size. On the other hand, a payload size of a prescribed sDCI format may be a first payload size. Payload sizes of the DCI may be different based on DCI formats. Payload size of DCI formats and payload sizes of sDCI formats may be prescribed individually.

For downlink control information transmitted on the PDCCH and/or the EPDCCH, multiple DCI formats may be defined. In other words, a field for downlink control information may defined in a DCI format and is mapped to information bits.

Here, the DCI format for the downlink is also referred to as a DCI of the downlink, a downlink grant, and/or downlink assignment. The DCI format for the uplink is also referred to as a DCI of the uplink, an Uplink grant, and/or Uplink assignment. The DCI grant may include a downlink grant (DL grant) and an uplink grant (UL grant). The downlink grant is also referred to as downlink assignment or downlink allocation.

The DCI included in the PDCCH and the EPDCCH may include a DL grant for the PDSCH.

In other words, one downlink grant may be used for scheduling of one PDSCH in one serving cell. The downlink grant may be used for scheduling of the PDSCH within the same subframe as the subframe on which the downlink grant is transmitted.

Here, the downlink grant may include information associated with downlink allocation for one or multiple terminal apparatuses 1. In other words, the downlink grant may include at least one of frequency allocation information (Resource allocation) for one or multiple terminal apparatuses 1, Modulation and Coding (MCS), the number of transmitting antenna ports, a Scramble Identity (SCID), the number of layers, a New Data Indicator, a Redundancy Version (RV), the number of transport blocks, precoder information, information about a transmission scheme.

One uplink grant is used for scheduling of one PUSCH in one serving cell. The uplink grant may be used for scheduling of the PUSCH within the fourth or later subframe from the subframe in which the uplink grant is transmitted.

The uplink grant transmitted on the PDCCH includes DCI format 0. The transmission scheme of the PUSCH corresponding to DCI format 0 is a single antenna port. The terminal apparatus 1 uses a single antenna port transmission scheme for PUSCH transmission corresponding to DCI format 0. The PUSCH where a single antenna port transmission scheme is applied is used for transmission of one codeword (one transport block).

The uplink grant transmitted on the PDCCH includes DCI format 4. The transmission scheme of the PUSCH corresponding to DCI format 4 is closed loop spatial multiplexing. The terminal apparatus 1 uses a closed loop spatial multiplexing transmission scheme for PUSCH transmission corresponding to DCI format 4. The PUSCH where a closed loop spatial multiplexing transmission scheme is applied is used for transmission of up to two codewords (up to two transport blocks).

The terminal apparatus 1 may monitor a set of PDCCH candidates and a set of EPDCCH candidates. The PDCCH may include the EPDDCH below.

Here, the PDCCH candidates may be candidates (resources) which the PDCCH may be mapped to and/or transmitted on by the base station apparatus 3. "Monitor" may include meaning that the terminal apparatus 1 attempts to decode each PDCCH in the set of PDCCH candidates in accordance with each of all the monitored DCI formats.

Here, the set of PDCCH candidates to be monitored by the terminal apparatus 1 is also referred to as a search space. The search space may include a Common Search Space (CSS). For example, the common search space may be defined as a space common to multiple terminal apparatuses 1. The common search space may be constituted by Control Channel Elements (CCEs) of an index prescribed by a specification, and the like.

The search space may include a UE-specific Search Space (USS). For example, the index of the CCE to constitute the UE-specific search space may be at least given based on the C-RNTI assigned to the terminal apparatus 1. The terminal apparatus 1 may monitor the PDCCH in the common search space and/or the UE-specific search space, and may detect the PDCCH destined to the apparatus itself.

Figure 4:
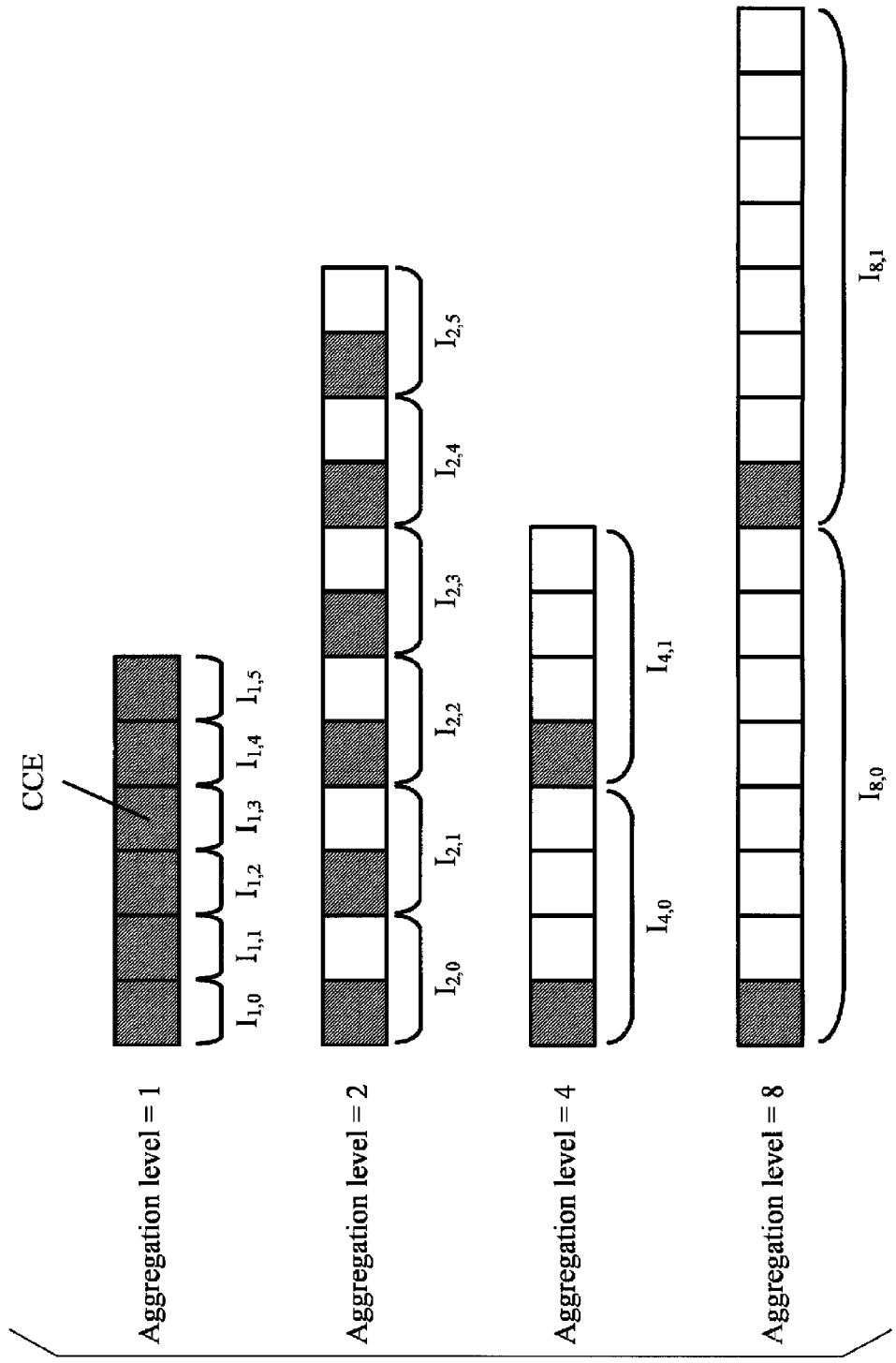
FIG. 4 is a diagram illustrating an example of a CCE index of a search space according to the present embodiment.

FIG. 4 is a diagram illustrating an example of a CCE index of a search space. FIG. 4 is an example in cases that Aggregation levels are 1, 2, 4, and 8. Each of quadrangular blocks illustrated in FIG. 4 represent one CCE. The aggregation level is the number of CCEs constituting a PDCCH including a DCI format (the aggregation number). In other words, for example, in the case of aggregation level 4, the PDCCH including the DCI format is constituted by four CCEs. Here, $I_{AL,INDEX}$ is the CCE index of the INDEX-th PDCCH in the aggregation level AL. For example, the CCE index of the PDCCH may be the index of the CCE illustrated in a slanted line (the first CCE among the CCEs constituting the PDCCH). The CCE index of the PDCCH may be related to the index of some or all of the CCEs constituting the PDCCH.

Here, in the present embodiment, "detect the PDCCH", "detect the DCI format", and "detect the PDCCH including the DCI format" may be the same.

An RNTI assigned to the terminal apparatus 1 by the base station apparatus 3 may be used for the transmission of the downlink control information (transmission on the PDCCH). Specifically, Cyclic Redundancy Check (CRC) parity bits may be attached to the DCI format (or downlink control information), and after the attaching, the CRC parity bits are scrambled with the RNTI. Here, the CRC parity bits attached to the DCI format may be obtained from a payload of the DCI format.

Here, in the present embodiment, "the CRC parity bits", "the CRC bits", and "the CRC" may be the same. "The PDCCH on which the DCI format attached with the CRC parity bits is transmitted", "the PDCCH including the CRC parity bits and including the DCI format", "the PDCCH including the CRC parity bits", and "the PDCCH including the DCI format" may be the same. "The PDCCH including X" and "the PDCCH with X" may be the same. The terminal apparatus 1 may monitor the DCI format. The terminal apparatus 1 may monitor the DCI. The terminal apparatus 1 may monitor the PDCCH.

The terminal apparatus 1 attempts to decode the DCI format to which the CRC parity bits scrambled with the RNTI are attached, and detects, as a DCI format destined for the terminal apparatus 1 itself, the DCI format for which the CRC has been successful (also referred to as blind coding). In other words, the terminal apparatus 1 may detect the PDCCH with the CRC scrambled with the RNTI. The terminal apparatus 1 may detect the PDCCH including the DCI format to which the CRC parity bits scrambled with the RNTI are attached.

Here, the RNTI may include a Cell-Radio Network Temporary Identifier (C-RNTI). For example, the C-RNTI may be an identifier unique to the terminal apparatus 1 and used for the identification in RRC connection and scheduling. The C-RNTI may be used for dynamically scheduled unicast transmission.

The RNTI may further include a Semi-Persistent Scheduling C-RNTI (SPS C-RNTI). For example, the SPS C-RNTI is an identifier unique to the terminal apparatus 1 and used for semi-persistent scheduling. The SPS C-RNTI may be used for semi-persistently scheduled unicast transmission. Here, the semi-persistently scheduled transmission may include meaning of periodically scheduled transmission.

The RNTI may include a Random Access RNTI (RA-RNTI). For example, the RA-RNTI may be an identifier used for transmission of a random access response message. In other words, the RA-RNTI may be used for the transmission of the random access response message in a random access procedure. For example, the terminal apparatus 1 may monitor the PDCCH with the CRC scrambled with the RA-RNTI after the transmission of a random access preamble. The terminal apparatus 1 may receive a random access response on the PDSCH in accordance with detection of the PDCCH with the CRC scrambled with the RA-RNTI.

The RNTI may include a Temporary C-RNTI. For example, the Temporary C-RNTI may be an identifier unique to the preamble transmitted by the terminal apparatus 1 and used during a contention-based random access procedure. The Temporary C-RNTI may be used for dynamically scheduled transmission.

The RNTI may further include a Paging RNTI (P-RNTI). For example, the P-RNTI may be an identifier used for paging and notification of system information modification. For example, the P-RNTI may be used for paging and transmission of a system information message. For example, the terminal apparatus 1 may receive paging on the PDSCH in accordance with detection of the PDCCH with the CRC scrambled with the P-RNTI.

The RNTI may further include a System Information RNTI (SI-RNTI). For example, the SI-RNTI may be an identifier used for broadcast of the system information. For example, the SI-RNTI may be used for transmission of the system information message. For example, the terminal apparatus 1 may receive the system information message on the PDSCH in accordance with detection of the PDCCH with the CRC scrambled with the SI-RNTI.

Here, the PDCCH with the CRC scrambled with the C-RNTI may be transmitted in the USS or CSS. The PDCCH with the CRC scrambled with the SPS C-RNTI may be transmitted in the USS or CSS. The PDCCH with the CRC scrambled with the RA-RNTI may be transmitted only in the CSS. The PDCCH with the CRC scrambled with the P-RNTI may be transmitted only in the CSS. The PDCCH with the CRC scrambled with the SI-RNTI may be transmitted only in the CSS. The PDCCH with the CRC scrambled with the Temporary C-RNTI may be transmitted only in the CSS.

The PDSCH is used to transmit downlink data (Downlink Shared Channel (DL-SCH)). The PDSCH may be used to transmit a random access response grant. Here, the random access response grant is used in scheduling of the PUSCH in the random access procedure. The random access response grant is indicated by the higher layers (e.g., the MAC layer) to the physical layer. Here, the PDSCH may be a sPDSCH. The sPDSCH may be constituted by a number of OFDM symbols less than the number of OFDM symbols included in the PDSCH. For example, the sPDSCH may be constituted by a number of OFDM symbols less than 14. The sPDSCH may include a transmission time interval that is shorter than a prescribed transmission time interval. The sPDSCH may include a transmission time interval corresponding to the sTTI.

The PDSCH is used to transmit a system information message. Here, the system information message may be cell-specific information (information unique to a cell). The system information may be included in RRC signaling. The PDSCH may be used to transmit the RRC signaling and the MAC control element.

The PMCH is used to transmit multicast data (Multicast Channel (MCH)).

In FIG. 1, the following downlink physical signals are used for downlink radio communication. Here, the downlink physical signals are not used to transmit the information output from the higher layers but is used by the physical layer.

Synchronization signal (SS)
Downlink Reference Signal (DL RS)

The synchronization signal is used for the terminal apparatus 1 to take synchronization in the frequency domain and the time domain in the downlink. In the TDD scheme, the synchronization signal is mapped to subframes 0, 1, 5, and 6 within a radio frame. In the FDD scheme, the synchronization signal is mapped to subframes 0 and 5 within a radio frame.

The downlink reference signal is used for the terminal apparatus 1 to perform channel compensation on a downlink physical channel. The downlink reference signal is used for the terminal apparatus 1 to obtain the downlink channel state information.

According to the present embodiment, the following seven types of downlink reference signals are used.

Cell-specific Reference Signal (CRS)
UE-specific Reference Signal (URS) relating to the PDSCH Demodulation Reference Signal (DMRS) relating to the EPDCCH Non-Zero Power Channel State Information—Reference Signal (NZP CSI-RS)

Zero Power Channel State Information—Reference Signal (ZP CSI-RS)

Multimedia Broadcast and Multicast Service over Single Frequency Network Reference signal (MBSFN RS)

Positioning Reference Signal (PRS)

Here, the downlink physical channel and the downlink physical signal are also collectively referred to as a downlink signal. The uplink physical channel and the uplink physical signal are also collectively referred to as an uplink signal. The downlink physical channels and the uplink physical channels are collectively referred to as a physical channel. The downlink physical signals and the uplink physical signals are collectively referred to as physical signals.

The BCH, the MCH, the UL-SCH, and the DL-SCH are transport channels. A channel used in a Medium Access Control (MAC) layer is referred to as a transport channel. A unit of the transport channel used in the MAC layer is also referred to as a transport block (TB) or a MAC Protocol Data Unit (PDU). A Hybrid Automatic Repeat reQuest (HARQ) is controlled for each transport block in the MAC layer. The transport block is a unit of data that the MAC layer delivers to the physical layer. In the physical layer, the transport block is mapped to a codeword, and coding processing is performed for each codeword.

Figure 5:
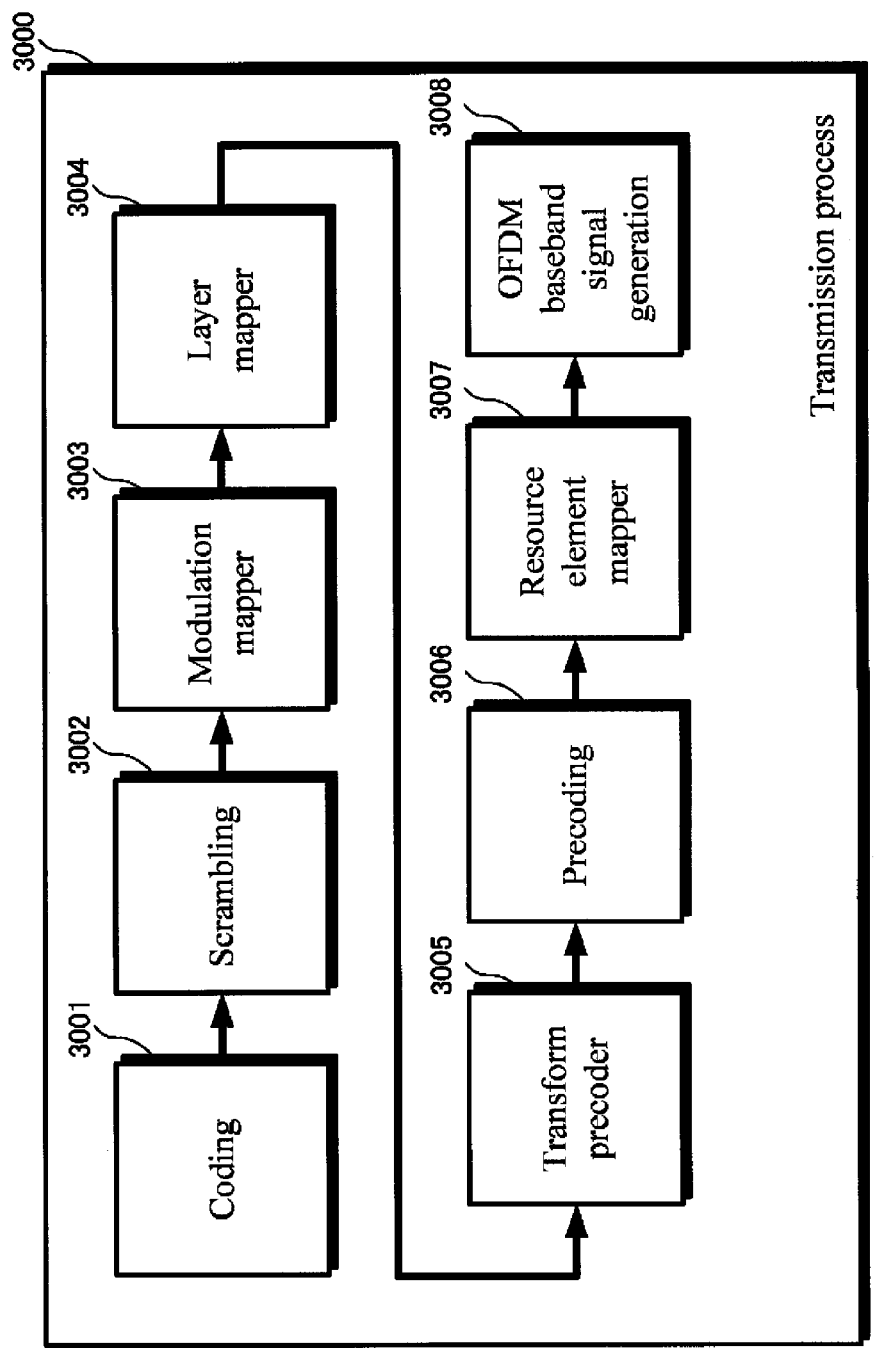
FIG. 5 is a diagram illustrating an example of a configuration of a transmission process 3000 according to the present embodiment.

FIG. 5 is a diagram illustrating an example of a configuration of a transmission process 3000 of the physical layer. The Transmission process 3000 is a configuration including at least one of a coding processing unit (coding) 3001, a scramble processing unit (Scrambling) 3002, a modulation map processing unit (Modulation mapper) 3003, a layer map processing unit (Layer mapper) 3004, a transmission precode processing unit (Transform precoder) 3005, a precode processing unit (Precoder) 3006, a resource element map processing unit (Resource element mapper) 3007, and a baseband signal generation processing unit (OFDM baseband signal generation) 3008. In a case that the transmission process 3000 does not include at least one device (the coding processing unit (coding) 3001, the scramble processing unit (Scrambling) 3002, the modulation map processing unit (Modulation mapper) 3003, the layer map processing unit (Layer mapper) 3004, the transmission precode processing unit (Transform precoder) 3005, the precode processing unit (Precoder) 3006, the resource element map processing unit (Resource element mapper) 3007, the baseband signal generation processing unit (OFDM baseband signal generation) 3008), it may be considered that the device not included in the transmission process 3000 is short-circuited. A state that the device is short-circuited may be a state that an input to the device and an output from the device are the same.

For example, the coding processing unit 3001 may include a function of converting the transport block (a data block, transport data, transmit data, a transmit code, a transmit block, payload, information, an information block, or the like) sent (notified of, conveyed, transmitted, delivered, or the like) from the higher layer into coded bits (generating coded bits, or including coded bits) through error correction coding processing. Here, the coded bits including the transport block are also referred to as first coded bits. Note that, in one aspect of the embodiment of the present invention, an input to the coding processing unit 3001 may be channel state information, of which transmission is triggered by a PDCCH of the base station apparatus 3. Specifically, the first coded bits may include channel state information triggered by the PDCCH of the base station apparatus 3. For example, the error correction coding includes a Turbo code, a convolutional code (a Tail biting convolutional code or the like), a block code, a Reed Muller (RM) code, a repetition code, an LDPC code, a QC-LDPC code, and a polar code. The coding processing unit 3001 includes a function of delivering the coded bits to the scramble processing unit 3002. The detail of operation of the coding processing unit 3001 will be described later.

The scramble processing unit 3002 includes a function of converting the coded bits into scramble bits through scramble processing. The scramble bits may be obtained by the coded bits and a scramble sequence taking a sum modulo 2. Specifically, the scramble bits may be the coded bits and a scramble sequence taking a sum modulo 2. The scramble sequence may be a sequence generated from a pseudo-random function, based on a specific sequence (e.g., a Cell specific—Radio Network Temporary Identifier (C-RNTI)). The specific sequence may be an RNTI other than the C-RNTI, which is configured for reduced timing operation.

The modulation map unit 3003 includes a function of converting the scramble bits into modulation bits through modulation map processing. The modulation bits are obtained by applying, to the scramble bits, modulation processing such as Quaderature Phase Shift Keying (QPSK), 16 Quaderature Amplitude Modulation (QAM), 64 QAM, and 256 QAM. Here, the modulation bit is also referred to as a modulation symbol.

The layer map processing unit 3004 may include a function of mapping the modulation bits to each layer. The layer is an index concerning a degree of multiplicity of a physical layer signal in a spatial domain. Specifically, for example, a case that the number of layers is 1 means that spatial multiplexing is not performed. A case that the number of layers is 2 means that two types of physical layer signals are spatially multiplexed.

In uplink, the transmission process 3000 includes the transmission precode processing unit 3005. The transmission precode processing unit 3005 includes a function of applying transmission precode processing to the modulation bits to be mapped to each layer to generate transmit bits. The modulation bit and the transmit bit may be a complex valued symbol. For example, the transmission precode processing includes processing with DFT spread (DFT spreading) or the like. Here, the transmit bit is also referred to as a transmit symbol. The modulation bit is also referred to as a modulation symbol.

The precode processing unit 3006 includes a function of multiplying the transmit bits by a precoder to generate transmit bits for each transmit antenna port. The transmit antenna port is a port of a logical antenna. One transmit antenna port may be configured with multiple physical antennas. The logical antenna port may be identified by the precoder.

The resource element map processing unit 3007 includes a function of performing processing of mapping the transmit bits for each transmit antenna port to resource elements. The details of a method of mapping to the resource elements in the resource element map processing unit 3007 will be described later.

The baseband signal generation processing unit 3008 may include a function of converting the transmit bits mapped to the resource elements into a baseband signal. For example, the processing of converting the transmit bits into a baseband signal may include Inverse Fast Fourier Transform (IFFT), Windowing, Filter processing, or the like. In the transmission process 3000, higher layer signaling and a control channel may be transmitted by one of the terminal apparatus 1 and the base station apparatus 3. In the transmission process 3000, the higher layer signaling and the control channel may be received by the other of the terminal apparatus 1 and the base station apparatus 3. In the transmission process 3000, capability information of the terminal apparatus 1 including the transmission process 3000 may be transmitted to the base station apparatus 3, by using the higher layer signaling or the control channel. Here, the capability information of the terminal apparatus 1 may be information indicating capability of the terminal apparatus 1. For example, the information indicating the capability of the terminal apparatus 1 may be information indicating error correction coding methods supported by the terminal apparatus 1. The information indicating the capability of the terminal apparatus 1 may be associated with Processing time necessary for processing of the transport block transmitted from the base station apparatus 1. The information indicating the capability of the terminal apparatus 1 may be a minimum value that can be allowed by the terminal apparatus 1 as a period from when the terminal apparatus 1 transmits a transport block to when an acknowledgement for the transport block is expected to be received. The information indicating the capability of the terminal apparatus 1 may be a minimum value that can be allowed by the terminal apparatus 1 as a period from when the terminal apparatus 1 receives a transport block to when an acknowledgement for the transport block is expected to be transmitted.

The details of the operation of the coding processing unit 3001 will be described below.

Figure 6:
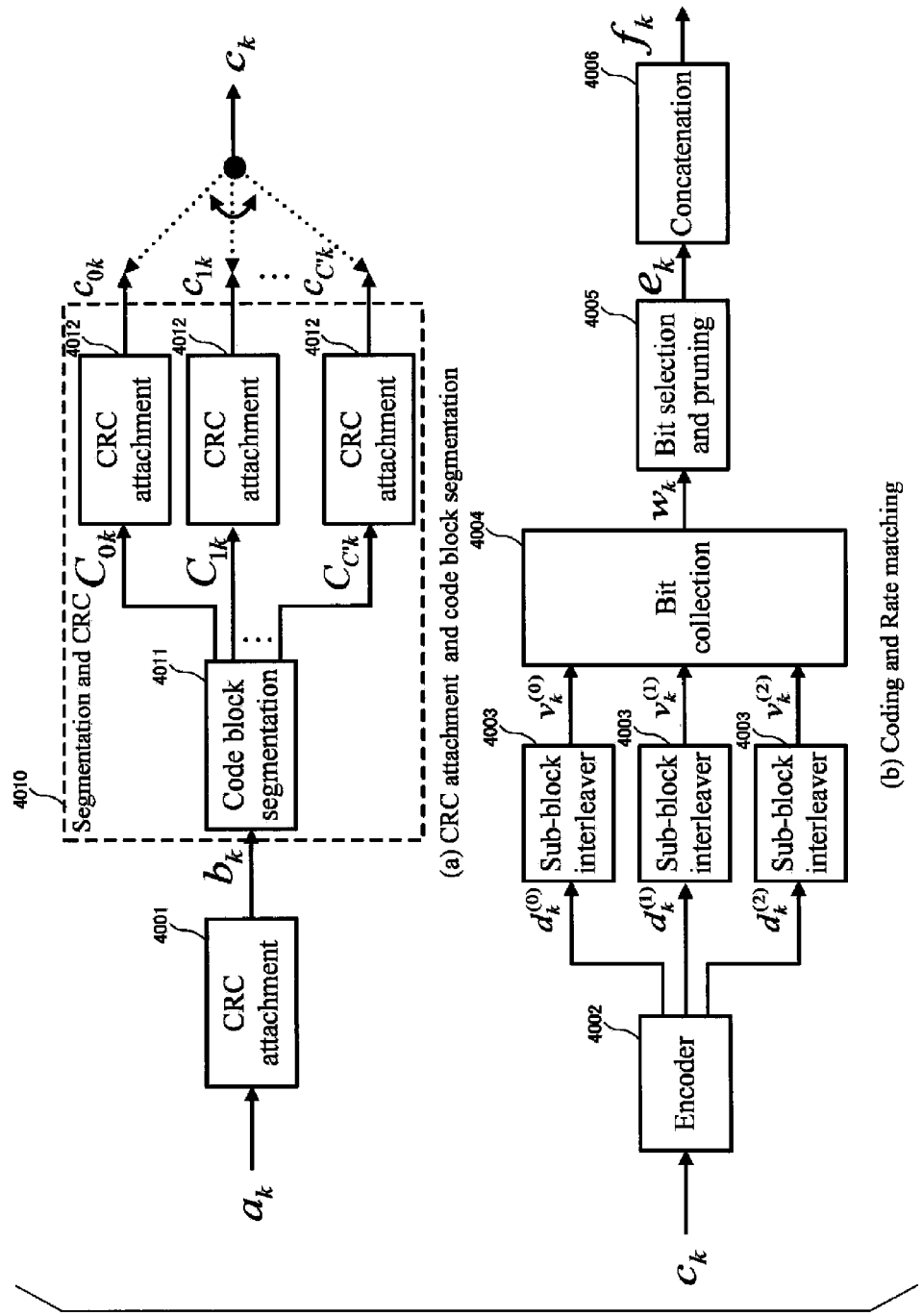
FIG. 6 is a diagram illustrating an example of a configuration of a coding processing unit 3001 according to the present embodiment.

FIG. 6 is a diagram illustrating an example of a configuration of the coding processing unit 3001 according to the present embodiment. The coding processing unit 3001 includes at least one of a CRC attachment unit 4001, a Segmentation and CRC unit 4010, an Encoder unit 4002, Sub-block interleaver units 4003, a Bit collection unit 4004, a Bit selection and pruning unit 4005, and a Concatenation unit 4006. Here, the segmentation and CRC unit 4010 includes at least one of a code block segmentation unit 4011 and one or multiple CRC attachment units 4012. In a case that the coding processing unit 3001 does not include at least one device (the CRC attachment unit 4001, the Segmentation and CRC unit 4010, the Encoder unit 4002, the Sub-block interleaver units 4003, the Bit collection unit 4004, the Bit selection and pruning unit 4005, the Concatenation unit 4006, the code block segmentation unit 4011, the one or multiple CRC attachment units 4012), it may be considered that the device not included in the coding processing unit is short-circuited. A state that the device is short-circuited may be a state that an input to the device and an output from the device are the same.

For example, a transport block (also referred to as $a_k$) may be input to the CRC attachment unit 4001. The CRC attachment unit 4001 may generate CRC bits as redundancy bits for error detection, based on the input transport block. The generated CRC bits are attached to the transport block. The transport block to which the CRC bits are attached (also referred to as $b_k$) is output by the CRC attachment unit 4001. In the CRC attachment unit 4001, the number of CRC bits to be attached to the transport block may be provided based on a predetermined condition 401 or a predetermined condition 501.

For example, $b_k$ may be input to the code block segmentation unit 4011. The code block segmentation unit 4011 may segment $b_k$ into one or multiple Code blocks. For example, in a case that $b_k$ satisfies $b_k > Z$, $b_k$ may be segmented into multiple code blocks. Here, Z is a maximum code block length.

The maximum code block length Z may be provided based on the predetermined condition 401 or the predetermined condition 501.

The maximum code block length Z of the transport block may be provided based on the predetermined condition 401 or the predetermined condition 501.

Here, the maximum code block length Z may be interpreted as a code block length.

Each code block of the multiple code blocks generated from one transport block may have an equal code block length. Each code block of the multiple code blocks forming one transport block may have a different code block length. Here, the code block length of the multiple code blocks forming one transport block is also referred to as the code block length.

The code block length may be a unit of the error correction coding. Specifically, the error correction coding may be performed on each code block. As one aspect of the present invention, processing will be described below based on one example in which the error correction coding is performed on each code block. Meanwhile, another aspect of the present invention may be based on processing in which the error correction coding is performed on multiple code blocks.

The code block segmentation unit 4011 may output C' (C' is an integer of 1 or greater) code block(s) ($C_{0k}$ to $C_{C'k}$).

The code block(s) may be input to the CRC attachment unit(s) 4012. The CRC attachment unit(s) 4012 may generate CRC bits, based on the code block(s). The CRC attachment unit(s) 4012 may attach the generated CRC bits to the code block(s). The CRC attachment unit(s) 4012 may output a sequence ($c_{0k}$ to $c_{C'k}$) in which the CRC bits are attached to the code block(s). Here, in a case that the code block segmentation is not performed (in a case that C'=1), the CRC attachment unit 4012 need not attach CRC to the code block.

In the CRC attachment unit(s) 4012, the number of CRC bits to be attached to the code block(s) may be provided based on the predetermined condition 401 or the predetermined condition 501.

Each of the code blocks output by the CRC attachment units 4012 is input to the encoder unit 4002. In a case that C'>1, an input to the encoder unit 4002 is code blocks successively selected. Each one code block input to the encoder unit 4002 ($C_{0k}$ to $C_{C'k}$) is hereinafter also referred to as $C_k$.

The encoder unit 4002 includes a function of performing error correction coding on the input code block $C_k$. As the error correction coding, the turbo code is used in the encoder unit 4002. The encoder unit 4002 performs error correction coding processing on the code block $C_k$ to output Coded bits. The output coded bits are $d_k^{(0)}$, $d_k^{(1)}$, and $d_k^{(2)}$. Here, $d_k^{(0)}$ may be a systematic bit. $d_k^{(1)}$ and $d_k^{(2)}$ are parity bits. The coded bit is also referred to as a sub-block.

The coded bits output by the encoder unit 4002 are input to the sub-block interleaver units 4003.

Figures 7A, 7B:
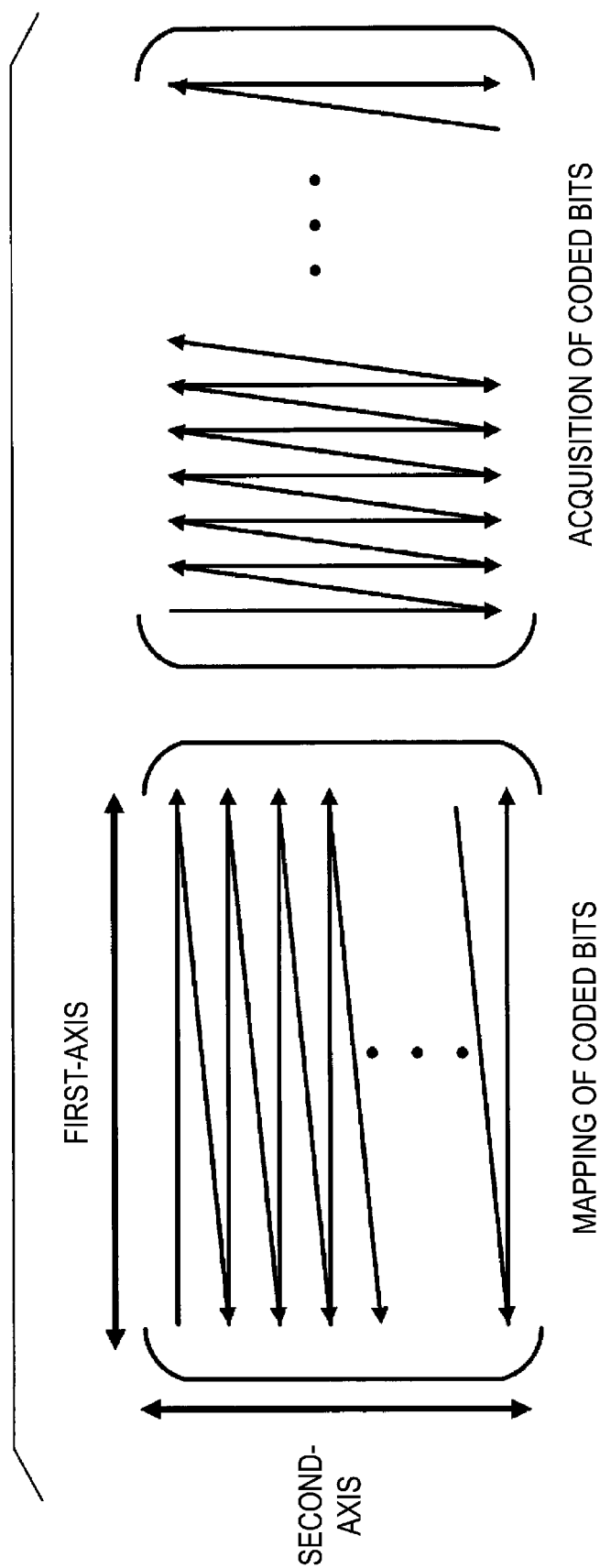
FIGS. 7A and 7B are diagrams illustrating an example of coded bit arrangement modification according to the present embodiment.

The coded bits are input to the sub-block interleaver units 4003. Each sub-block interleaver unit 4003 includes a function of changing an arrangement of the coded bits. FIGS. 7A and 7B are diagrams illustrating an example of coded bit arrangement modification performed by the sub-block interleaver unit 4003 of the present embodiment. The sub-block interleaver unit 4003 may map the coded bits to a two-dimensional block B (also referred to as a matrix). Here, the block B may be one-dimensional, three-dimensional, or three-dimensional or higher. Here, in a case that the block B is one-dimensional, the block B is also referred to as a vector. In a case that the block B is three-dimensional or higher, the block B is also referred to as a multi-dimensional matrix (or a multi-dimensional arrangement). For example, the block B may include a first-axis and a second-axis. Here, the first-axis is also referred to as a horizontal axis, or a column. The second-axis is also referred to as a vertical axis, or a row. In the block B, a point specified by one point in the first-axis and one point in the second-axis is also referred to as an element (or a position). Here, one element may be one coded bit (or may correspond to one coded bit). The sub-block interleaver unit 4003 may map (write) the coded bits in first-axis prioritized manner. Here, the mapping method illustrated in FIG. 7A illustrates one example of a method of mapping in first-axis prioritized manner. Specifically, mapping in first-axis prioritized manner refers to mapping based on the following procedure (or repetition based on the following procedure). (1) Map in a first-axis direction with respect to one point in the second-axis (one row). (2) Map in the first-axis direction with respect to next one point in the second-axis.

For example, in a case that the first-axis is the time axis and the second-axis is the frequency axis, mapping in first-axis prioritized manner means mapping in time axis prioritized manner (Time first mapping). On the other hand, mapping in second-axis prioritized manner means mapping in frequency axis prioritized manner (Frequency first mapping). Mapping in first-axis prioritized manner may refer to mapping first-axis by first-axis. In a case that the first-axis is a column, mapping in first-axis prioritized manner may refer to mapping column by column. Mapping in second-axis prioritized manner may refer to mapping second-axis by second-axis. In a case that the second-axis is a row, mapping in second-axis prioritized manner may refer to mapping row by row (line by line).

Here, the number of columns in the first-axis may be 32, and the number of rows in the second-axis may be a minimum integer value on a condition that the integer value does not fall below a value obtained by dividing the coded bits by 32. In a case that the coded bits are mapped in first-axis prioritized manner, null (or dummy bits) may be mapped to an element to which the coded bits are not mapped.

For example, the sub-block interleaver unit 4003 may include a function of performing different processing, based on an input. In a case that the input is $d_k^{(0)}$ or $d_k^{(1)}$, Permutation patterns need not be applied to the block B. In contrast, in a case that the input is $d_k^{(2)}$, permutation patterns may be applied to the block B. Specifically, the sub-block interleaver unit 4003 may switch application of the permutation patterns, based on the input coded bits. The application of the permutation patterns may be processing of rearranging order of the first-axis. For example, a permutation pattern P may be P=[0, 16, 8, 24, 4, 20, 12, 28, 2, 18, 10, 26, 6, 22, 14, 30, 1, 17, 9, 25, 5, 21, 13, 29, 3, 19, 11, 27, 7, 23, 15, 31].

For example, the sub-block interleaver unit 4003 may acquire (read) the coded bits mapped to the block B, in second-axis prioritized manner. Here, the mapping method illustrated in FIG. 7B illustrates one example of a method of mapping in second-axis prioritized manner. The sub-block interleaver unit 4003 outputs remapped bits (e.g., $v_k^{(0)}$, $v_k^{(1)}$, and $v_k^{(2)}$) acquired in second-axis prioritized manner.

For example, in a case that the coded bits are mapped in first-axis prioritized manner and are acquired in second-axis prioritized manner, the order of the coded bits input to the sub-block interleaver unit 4003 and order of the remapped bits are switched. In other words, the sub-block interleaver unit 4003 may include a function of switching order of the coded bits and order of the remapped bits. Here, in a case that the axis used first in a case of mapping to the block B and the axis used first in a case of acquiring from the block B are different from each other, operation in the sub-block interleaver unit 4003 is also referred to as arrangement switching (interleaving, rearrangement, or the like). Note that in a case that the axis used first in a case of mapping to the block B and the axis used first in a case of acquiring from the block B are the same, arrangement switching is not performed in the sub-block interleaver unit 4003 (order of the coded bits input to the sub-block interleaver unit 4003 and order of the remapped bits are not switched).

For example, whether or not arrangement switching of the coded bits is performed by the sub-block interleaver unit 4003 may be provided based on the predetermined condition 401 or the predetermined condition 501.

Here, the axis used first for mapping in arrangement switching of the coded bits may be the time axis (Time first mapping). The axis used first for mapping in arrangement switching of the coded bits may be the frequency axis (Frequency first mapping).

The remapped bits or the coded bits are input to the bit collection unit 4004. The bit collection unit 4004 includes a function of generating a Virtual circular buffer, based on the remapped bits. A virtual circular buffer w k is generated based on $w_k = v_k^{(0)}$, $w_{K_\Pi + 2k} = v_k^{(1)}$, and $w_{K_\Pi + 2k+1} = v_k^{(2)}$. Here, $K_\Pi$ is the number of elements of the entire block B, and $K_w$ is a value indicated by $K_w = 3K_\Pi$. The bit collection unit 4004 outputs the virtual circular buffer $w_k$.

The virtual circular buffer is input to the bit selection and pruning unit 4005. The bit selection and pruning unit 4005 includes a function of selecting bits in the virtual circular buffer, based on the number of radio resources. Here, the number of radio resources may be the number of resource elements provided based on scheduling information. Here, the number of resource elements may be provided by a product of the number of allocated subcarriers and the number of allocated symbols. The number of allocated subcarriers or the number of allocated symbols may be provided based on information contained in the DCI transmitted by the base station apparatus 3. The number of resource elements may be provided as a value obtained by subtracting resource elements included in a predetermined region from the product of the number of allocated subcarriers and the number of allocated symbols. Here, the predetermined region may be a region in which a reference signal channel is included. The predetermined region may be a region in which a synchronization channel is included. Bit selection in the virtual circular buffer may be performed by regarding an index $k_0$ as a starting position and acquiring the bits in the virtual circular buffer $w_k$ in a cyclic manner. Here, the acquired bits are also referred to as $e_k$. The bit selection and pruning unit 4005 outputs $e_k$. For example, $k_0$ may be expressed by $k_0 = 32*(2*\text{Ceil}(N_{cb}/(8*R^{TC}))*rv_{idx}+2)$. Here, Ceil(*) is a function for acquiring a minimum integer on a condition that the integer does not fall below *. Alternatively, Ceil(*) is a function for rounding up * to an integer. $rv_{idx}$ is a Redundancy version. The redundancy version is determined based on the MCS information and/or the New Data Indicator (NDI) contained in the DCI transmitted by the base station apparatus 3. $N_{cb}$ is a soft buffer size. $N_{cb}$ may be $N_{cb} = \min(\text{floor}(N_{IR}/C'), K_w)$ in a case of downlink communication, and may be $N_{cb} = K_w$ in a case of uplink communication. Here, min(A, B) is a function for selecting the smaller one of A and B. floor(*) is a function for acquiring a maximum integer not exceeding *. Alternatively, floor(*) is a function for rounding down to an integer.

$e_k$ is input to the concatenation unit 4006. The concatenation unit 4006 includes a function of concatenating the C' code blocks to generate concatenated bits. The concatenated bits are also referred to as $f_k$.

The processing of the coding processing unit 3001 will be described below with an example of a case of uplink. Note that, also in a case of downlink, the coding processing unit 3001 may include a configuration of including at least one of a control information and data multiplexing unit (Control and data multiplexing unit) 4007 and/or a Channel interleaver unit 4008.

Figure 8:
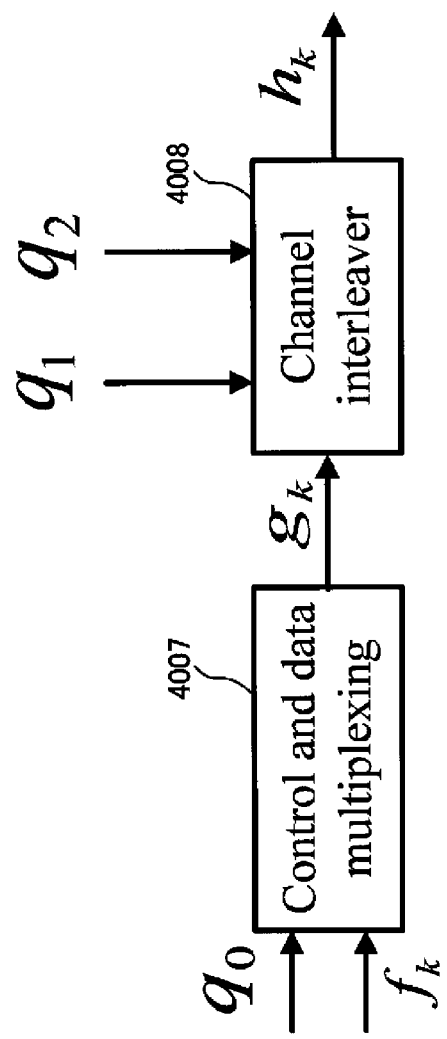
FIG. 8 is a diagram illustrating a part of an example of a configuration of a control information and data multiplexing unit (Control and data multiplexing unit) 4007 and a Channel interleaver unit 4008 included in a coding processing unit 3001 in the uplink according to the present embodiment.

FIG. 8 is a diagram illustrating a part of an example of a configuration of the control information and data multiplexing unit (Control and data multiplexing unit) 4007 and the Channel interleaver unit 4008 included in the coding processing unit 3001 in uplink according to the present embodiment. In uplink, the coding processing unit 3001 includes at least one of the control information and data multiplexing unit (Control and data multiplexing unit) 4007 and the Channel interleaver unit 4008. For example, the concatenated bits $f_k$ output by the concatenation unit 4006 of the coding processing unit 3001 may be input to the control information and data multiplexing unit 4007 of the coding processing unit 3001, together with the Uplink Control Information (UCI). Here, coded bits of the Uplink Control Information input to the control information and data multiplexing unit 4007 are also referred to as $q_0$. For example, the coded bits $q_0$ may be coded bits of the Chanel State Information (CSI). The channel state information may include a Channel Quality Indicator (CQI), a Precoding Matrix Indicator (Precoder Matrix Indication) (PMI), and a Rank Indicator (RI). For example, the coded bits $q_0$ may be coded bits of an ACKnowledgement (ACK) in downlink communication. The control information and data multiplexing unit 4007 may multiplex the concatenated bits $f_k$ and the coded bits $q_0$ to output multiplexed bits $g_k$. In a case that the coded bits $q_0$ are not input to the control information and data multiplexing unit 4007, the multiplexed bits g k output by the control and data multiplexing unit 4007 may be $g_k=f_k$. The concatenated bits $f_k$ are a sequence including the first coded bits. The concatenated bits $f_k$ may be referred to as the first coded bits. The coded bits $q_0$ may be referred to as second coded bits.

Here, the multiplexed bits g k may be provided by concatenating (or multiplexing) the coded bits $q_0$ and the concatenated bits $f_k$. For example, the multiplexed bits $g_k$ may be provided by concatenating the concatenated bits $f_k$ on an end side of the coded bits $q_0$. For example, $g_k$ may be provided by concatenating the concatenated bits $f_k$ on a front side of the coded bits $q_0$. A method of concatenating the coded bits $q_0$ and the concatenated bits $f_k$ is not limited to the method described above.

For example, the multiplexed bits $g_k$ may be input to the channel interleaver unit 4008 of the coding processing unit 3001. Here, coded bits $q_1$ of the Uplink Control Information and/or coded bits $q_2$ of the Uplink Control Information may be input to the channel interleaver unit. The channel interleaver unit 4008 may map the multiplexed bits $g_k$ to a block $B_1$. Here, the block $B_1$ is the same as the block B, except for the number of columns and the number of rows of the block $B_1$. For example, the number of columns $C_{mux}$ in the first-axis of the block $B_1$ may be 12 for the PUSCH. The number of columns $C_{mux}$ in the first-axis of the block B1 may be 6 for the sPUSCH. The number of rows $R'_{mux}$ in the second-axis may be $H/C_{mux}$. Here, the number of bits of H may be $g_k+q_1$. $C_{mux}$ and $R'_{mux}$ may be provided to satisfy a relationship of $H=C_{mux}*R'_{mux}$. One element of the block $B_1$ may be one multiplexed bit (or may correspond to one multiplexed bit). Here, the coded bits $q_1$ may be referred to as third coded bits. The coded bits $q_2$ may be referred to as the third coded bits. Note that the coded bits $q_0$, $q_1$, and $q_2$ are also collectively referred to as the Uplink Control Information. The coded bits $q_0$, $q_1$, and $q_2$ are also collectively referred to as the coded bits of the Uplink Control Information.

In a case that the coded bits $q_1$ are input to the channel interleaver unit 4008, the channel interleaver unit 4008 maps the coded bits $q_1$ at a predetermined position of the block $B_1$. The predetermined position of the coded bits $q_1$ may be an element indicated by a position defined in advance. The predetermined position of the coded bits $q_1$ may be provided based on information contained in the higher layer signaling. The predetermined position of the coded bits $q_1$ may be provided based on information contained in a downlink control channel (PDCCH). In the block $B_1$ in the channel interleaver unit 4008, one element may correspond to one group. The one group may include as many coded bits as the number of a modulation order of a modulation scheme corresponding to the transport block. Here, the predetermined position of the coded bits $q_1$ and the predetermined position of the coded bits $q_2$ are also collectively referred to as a predetermined position of the Uplink Control Information. The predetermined position of the coded bits $q_1$ and the predetermined position of the coded bits $q_2$ are also collectively referred to as a predetermined position of the coded bits. The predetermined position of the coded bits $q_1$ and the predetermined position of the coded bits $q_2$ are also collectively referred to as a predetermined position of the coded bits of the Uplink Control Information. The predetermined position of the coded bits $q_1$ and the predetermined position of the coded bits $q_2$ are also collectively referred to as a predetermined position.

The channel interleaver unit 4008 may map the multiplexed bits $g_k$ to the block $B_1$ in first-axis prioritized manner. The channel interleaver unit 4008 need not map the multiplexed bits $g_k$ to the elements to which the coded bits $q_1$ are mapped.

In a case that the coded bits $q_2$ are input to the channel interleaver unit 4008, the channel interleaver unit 4008 maps the coded bits $q_2$ at the predetermined position. The predetermined position of the coded bits $q_2$ may be a position defined in advance. The predetermined position may be provided based on information contained in the higher layer signaling. The predetermined position may be provided based on information contained in the downlink control channel (PDCCH). Here, in a case that the coded bits $q_1$ or the multiplexed bits $g_k$ are already mapped at the predetermined position, the coded bits $q_1$ or the multiplexed bits $g_k$ may be punctured. Here, the predetermined position of the coded bits $q_1$ and the position of the coded bits $q_2$ may be different from each other.

The channel interleaver unit 4008 may acquire the elements mapped in the block $B_1$, in second-axis prioritized manner (i.e., arrangement switching may be performed). The channel interleaver unit 4008 may acquire the elements mapped in the block $B_1$, in first-axis prioritized manner (i.e., arrangement switching need not be performed). The elements acquired by the channel interleaver unit 4008 are also referred to as an output $h_k$.

For example, whether or not arrangement switching of the multiplexed bits is performed by the channel interleaver unit 4008 may be provided based on the predetermined condition 401 or the predetermined condition 501.

Here, the axis used first for mapping in arrangement switching of the multiplexed bits may be the time axis (Time first mapping). Specifically, the first-axis may be the time axis. The axis used first for mapping in arrangement switching of the coded bits may be the frequency axis (Frequency first mapping). Specifically, the second-axis may be the frequency axis. The first-axis may correspond to the time axis. The second-axis may correspond to the frequency axis.

Figure 9:
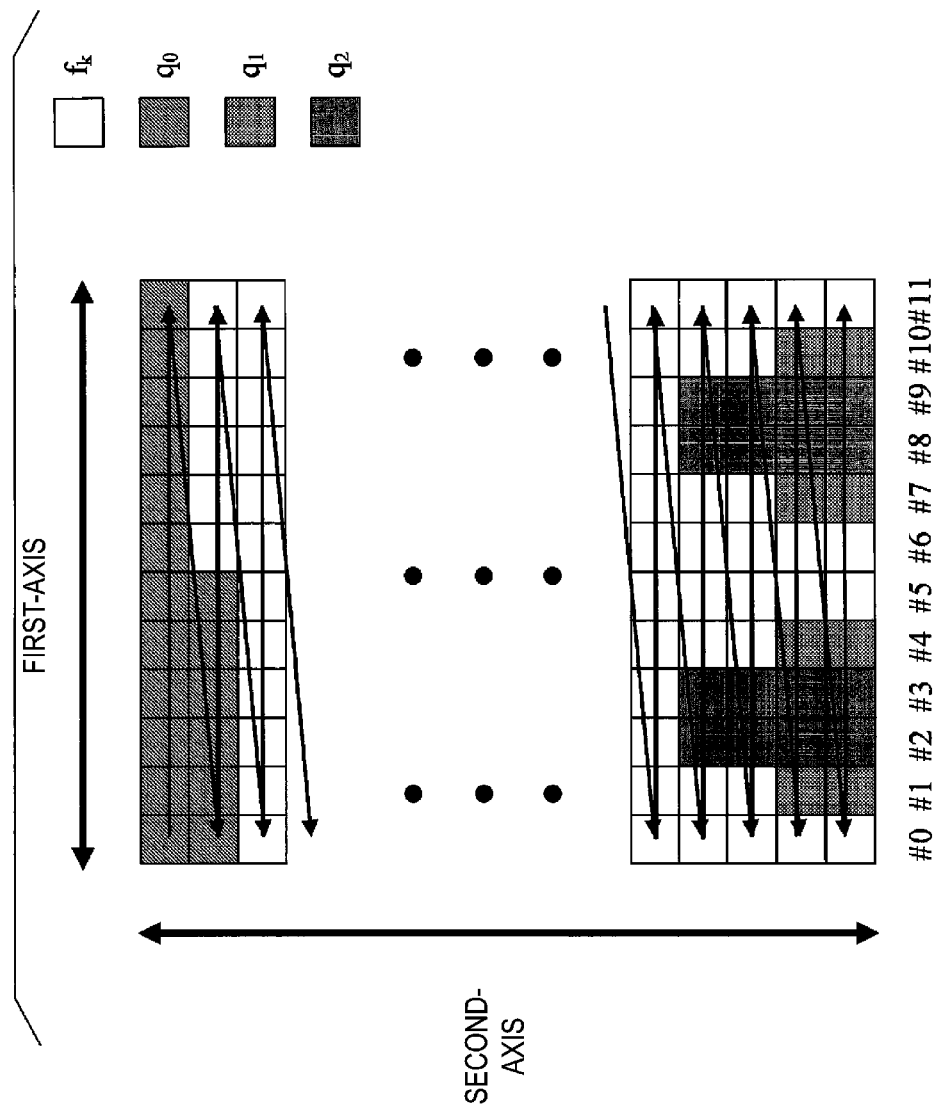
FIG. 9 is a diagram illustrating an example of mapping of an output $h_k$ in a case that arrangement switching of multiplexed bits $g_k$ by the channel interleaver unit according to the present embodiment is performed.

FIG. 9 is a diagram illustrating an example of mapping of the output $h_k$ in a case that arrangement switching of the multiplexed bits $g_k$ by the channel interleaver unit 4008 is performed. The output $h_k$ is also referred to as a first sequence. Here, each of the squares illustrated in FIG. 9 indicates an element of a block (or a matrix). The multiplexed bits $g_k$ or the coded bits of the Uplink Control Information may be mapped for each element. In FIG. 9, uncolored blocks indicate that the concatenated bits $f_k$ included in the multiplexed bits $g_k$ are mapped to the blocks. The blocks with diagonal lines indicate that the coded bits $q_0$ are mapped to the blocks. The latticed blocks indicate that the coded bits $q_1$ are mapped to the blocks. The blocks with a dot pattern indicate that the coded bits $q_2$ are mapped to the blocks. The relationship between the blocks illustrated in the drawings and the mapped sequence also similarly applies in the subsequent drawings. As indicated by the arrows of FIG. 9, the multiplexed bits $g_k$ are mapped in the first-axis prioritized manner. Here, the number of columns C. in the first-axis=12. Numbers of #0 (the head column of the first-axis) to #11 (the last column of the first-axis) are assigned to each column of the first-axis in order from the left. Next, the mapped multiplexed bits $g_k$ are acquired in the second-axis prioritized manner. In FIG. 9, the coded bits $q_1$ are mapped at the predetermined position of the coded bits $q_1$. The coded bits $q_2$ are mapped at the predetermined position of the coded bits $q_2$. Here, the predetermined position of the coded bits of the Uplink Control Information may be provided based on the description of specifications or the like. For example, in a case that a normal CP is configured in the terminal apparatus 1, the predetermined position of the coded bits $q_1$ may be #1 (the second column of the first-axis), #4 (the fifth column of the first-axis), #7 (the eighth column of the first-axis), and #10 (the eleventh column of the first-axis) for the first-axis. In the case that a normal CP is configured in the terminal apparatus 1, the predetermined position of the coded bits $q_2$ may be #2 (the third column of the first-axis), #3 (the fourth column of the first-axis), #8 (the ninth column of the first-axis), and #9 (the tenth column of the first-axis) for the first-axis. In the case that a normal CP is configured in the terminal apparatus 1, the predetermined position of the coded bits $q_2$ may be provided based on the number of bits of the coded bits $q_2$ for the second-axis. Here, a method in which the multiplexed bits $g_k$ are mapped in a column direction by the channel interleaver unit 4008 is also referred to as a first method. For example, the first method may be a method in which arrangement switching of the multiplexed bits $g_k$ is performed by the channel interleaver unit 4008. A method in which the multiplexed bits $g_k$ are mapped in a row direction by the channel interleaver unit 4008 is also referred to as a second method. For example, the second method may be a method in which arrangement switching of the multiplexed bits $g_k$ is not performed by the channel interleaver unit 4008.

For example, in a case that the first-axis corresponds to the time axis and the second-axis corresponds to the frequency axis, the concatenated bits $f_k$ being a sequence including the transport block are mapped in the time axis first (time first mapping). Here, one or each of the multiple code blocks included in the transport block is mapped in a manner of spreading along the time axis. The code block is a unit of error correction coding, and therefore mapping the code blocks in a manner of spreading along the time axis may be a factor of processing delay in reception processing. Specifically, in a case that reduction in processing delay is intended, mapping the concatenated bits $f_k$ in the frequency axis first (frequency first mapping) is more preferable than mapping the concatenated bits $f_k$ in the time axis first.

Figure 10:
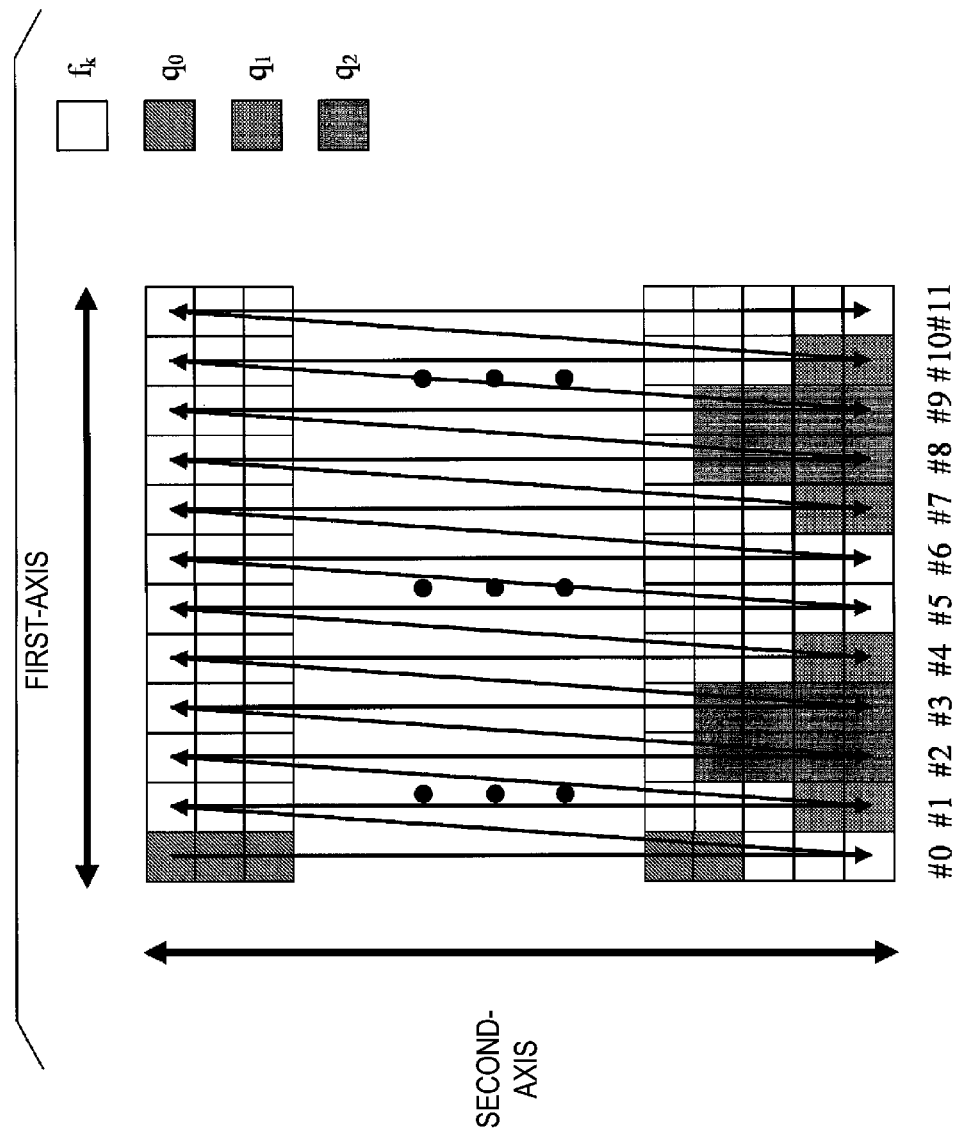
FIG. 10 is a diagram illustrating an example of mapping of an output $h_k$ in a case that arrangement switching of multiplexed bits $g_k$ by the channel interleaver unit 4008 according to the present embodiment is not performed.

FIG. 10 is a diagram illustrating an example of mapping of the output $h_k$ in a case that arrangement switching of the multiplexed bits $g_k$ by the channel interleaver unit 4008 is not performed. Here, a state that arrangement switching of the multiplexed bits $g_k$ is not performed by the channel interleaver unit 4008 may be a state that the coding processing unit 3001 does not include the channel interleaver unit 4008. The state that arrangement switching of the multiplexed bits is not performed by the channel interleaver unit 4008 may mean that $h_k=g_k$. Specifically, the state that arrangement switching of the multiplexed bits is not performed by the channel interleaver unit 4008 may be a state that the output $h_k$ and the multiplexed bits $g_k$ are the same. The state that arrangement switching of the multiplexed bits is not performed by the channel interleaver unit 4008 may be a state the output $h_k$ is the multiplexed bits $g_k$ multiplexed by the coded bits of the Uplink Control Information. As indicated by the arrows of FIG. 10, as one example in which arrangement switching of the multiplexed bits is not performed by the channel interleaver unit 4008, an example in which the multiplexed bits $g_k$ are mapped in the second-axis prioritized manner and are acquired in the second-axis prioritized manner is illustrated. In the example illustrated in FIG. 10, the multiplexed bits $g_k$ are provided by concatenating the concatenated bits $f_k$ on the end side of the coded bits $q_0$, and the coded bits $q_0$ are mapped from the left side (the head portion of the first-axis).

In a case that the number of bits of the coded bits $q_0$ is provided based on at least the coded bits $q_1$, at least first processing, second processing, and third processing may be performed in the reception processing. Here, the first processing is to decode the coded bits $q_1$. Through the first processing, the number of bits of the coded bits $q_0$ is provided. Here, the number of bits of the concatenated bits $f_k$ is provided based on the number of bits of the coded bits $q_0$. Next, the second processing is to decode the coded bits $q_0$. The third processing is to decode the concatenated bits $f_k$.

Specifically, in the case that the number of bits of the coded bits $q_0$ is provided based on at least the coded bits $q_1$, the second processing and the third processing are not started until the first processing is completed. Here, the coded bits $q_1$ decoded in the first processing are mapped in a manner of spreading along the first-axis (for example, corresponding to the time axis), and therefore starting of the second processing and the third processing may be delayed. Specifically, in order that the second processing and the third processing be started earlier, it is desirable that the coded bits $q_1$ be mapped at the head portion of the first-axis. Here, this also similarly applies in a case that the number of bits of the coded bits $q_0$ is provided based on at least the coded bits $q_2$.

For example, in the case that the coded bits $q_0$ include at least a Channel Quality Indicator and/or a Precoding Matrix Indicator and the coded bits $q_1$ include at least a Rank Indicator, the number of bits of the coded bits $q_0$ may be provided based on the coded bits $q_1$. Here, the number of bits of the Channel Quality Indicator, the number of bits of the Precode Matrix Indicator, and a precode matrix to which a value of the Precode Matrix Indicator corresponds may be provided based on a value of the Rank Indicator. The number of bits of the coded bits $q_0$ of the Uplink Control Information including the Channel Quality Indicator and/or the Precoding Matrix Indicator may be provided based on the number of bits of the Channel Quality Indicator and/or the Precode Matrix Indicator. Specifically, in the case that the coded bits $q_0$ include at least a Channel Quality Indicator and/or a Precoding Matrix Indicator and the coded bits $q_1$ include at least a Rank Indicator, the number of bits of the coded bits $q_0$ may be provided based on the value of the Rank Indicator obtained by decoding the coded bits $q_1$.

For example, the number of bits $Q_{CQI}$ of the coded bits $q_0$ is provided by $Q_{CQI} = Q_m \times Q'$. Here, $Q_m$ is a modulation order for the PUSCH, and $Q'$ is provided based on Equation (1) below.

$$Q' = \min\left(\text{ceil}\left(\frac{(O+L) \cdot M_{sc}^{PUSCH-initial} \cdot N_{symb}^{PUSCH-initial} \cdot \beta_{offset}^{PUSCH}}{\sum_{r=0}^{C-1} K_r}\right), M_{sc}^{PUSCH} \cdot N_{symb}^{PUSCH} - \frac{Q_{RI}}{Q_m}\right)$$ [Equation 1]

In Equation (1), min( ) is a function for returning a minimum value of multiple input values. Ceil(*) is a function for acquiring a minimum integer on the condition that the integer does not fall below *. Alternatively, Ceil(*) is a function for rounding up * to an integer. O is the number of bits of CQI, the number of bits of PMI, or the number of bits of CQI+PMI. L is the number of CRC parity bits attached to CQI and/or PMI. C is the number of code blocks. $K_r$ is a size of code block r. $\beta_{offset}^{PUSCH}$ is provided by $\beta_{offset}^{CQI}$. $\beta_{offset}^{CQI}$ may be provided by information/parameter received from the base station apparatus 3. $M_{sc}^{PUSCH}$ indicates a bandwidth allocated (scheduled) for PUSCH transmission in the subframe for the transport block. Alternatively, $M_{sc}^{PUSCH}$ indicates a bandwidth allocated for the PUSCH of the subframe in the subframe in which transmission of the transport block is configured. $N_{symb}^{PUSCH}$ is the number of SC-FDMA symbols in the subframe for PUSCH transmission. Alternatively, $N_{symb}^{PUSCH}$ is the number of SC-FDMA symbols in the subframe in the subframe for PUSCH transmission.

$M_{sc}^{PUSCH-initial}$ is a bandwidth scheduled for initial transmission of the PUSCH, and is obtained from an initial PDCCH for the same transport block. $M_{sc}^{PUSCH-initial}$ may be expressed by the number of subcarriers. $N_{symbol}^{PUSCH-initial}$ is the number of SC-FDMA symbols for initial transmission of the PUSCH for the same transport block. Here, the same transport block is a transport block transmitted on the PUSCH, together with the Uplink Control Information. $Q_{RI}$ is the number of coded bits of the Rank Indicator.

FIG. 11 is a diagram illustrating an example of the number of bits of the Channel Quality Indicator (Wideband CQI) and the Precoding Matrix Indicator. Here, the table illustrated in FIG. 11, the number of bits of the Channel Quality Indicator and the number of bits of the Precoding Matrix Indicator are provided in each of a case that the number of antenna ports is configured to be 2 and a case that the number of antenna ports is configured to be 4. For example, in a case that two antenna ports are configured and the Rank Indicator indicates 1 (Rank=1), the number of bits of the Wideband CQI for codeword 0 is 4. Here, the codeword is a unit of data transmitted on the PDSCH, and is mapped to the transport block. In the case that two antenna ports are configured and the Rank Indicator indicates 1 (Rank=1), the number of bits for the Precoding Matrix Indicator is 2N. Here, N is the number of subbands in a system bandwidth. Here, the subband is a unit of CSI measurement, and includes one or multiple resource blocks.

Figure 12:
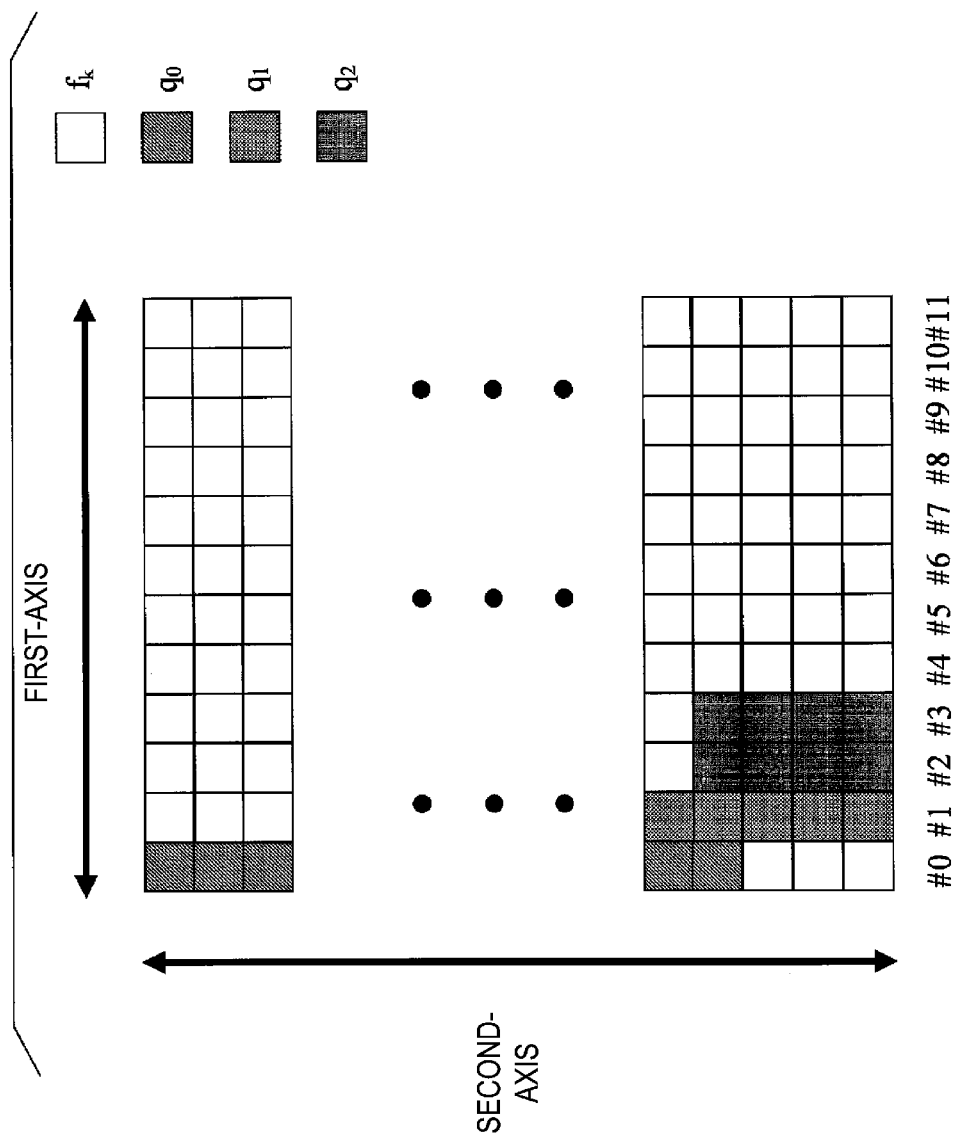
FIG. 12 is a diagram illustrating an example of mapping of an output $h_k$ performed by the channel interleaver unit 4008 according to the present embodiment.

FIG. 12 is a diagram illustrating an example of mapping of the output $h_k$ performed by the channel interleaver unit 4008. In FIG. 12, the coded bits $q_1$ are mapped to the second column of the first-axis. The coded bits $q_2$ are mapped to the third and fourth columns of the first-axis. As in the example illustrated in FIG. 12, the coded bits of the Uplink Control Information may be mapped on the front side of the predetermined position. The coded bits of the Uplink Control Information may be mapped to a portion of the predetermined position (e.g., only to the third and fourth columns of the first-axis for the coded bits $q_2$). The coded bits of the Uplink Control Information need not be mapped to at least a portion of the predetermined position.

Specifically, in one aspect of the present embodiment, whether or not the coded bits $\{q_1, q_2\}$ of the Uplink Control Information are mapped at the predetermined position may be provided based on at least whether or not arrangement switching of the multiplexed bits $g_k$ is performed by the channel interleaver unit 4008. Specifically, mapping of the coded bits $\{q_1, q_2\}$ of the Uplink Control Information may be provided based on at least whether or not arrangement switching of the multiplexed bits $g_k$ is performed by the channel interleaver unit 4008. For example, in a case that arrangement switching of the multiplexed bits $g_k$ is performed by the channel interleaver unit 4008, the coded bits $\{q_1, q_2\}$ of the Uplink Control Information may be mapped at the predetermined position. In a case that arrangement switching of the multiplexed bits $g_k$ is not performed by the channel interleaver unit 4008, the coded bits $\{q_1, q_2\}$ of the Uplink Control Information may be mapped at a first position. Here, the coded bits $q_0$ may include at least one of the Channel Quality Indicator and the Precoding Matrix Indicator. The predetermined position of the coded bits $q_1$ may be #1, #4, #7, and #10 for the first-axis. The predetermined position of the coded bits $q_2$ may be #2, #3, #8, and #9 for the first-axis. The coded bits $q_1$ may be the Rank Indicator. The coded bits $q_2$ may be the HARQ-ACK for at least one transport block. The number of coded bits of the Channel Quality Indicator may be provided based on at least the value of the Rank Indicator. The number of coded bits of the Precoding Matrix Indicator may be provided based on at least the value of the Rank Indicator. The sum of the number of coded bits of the Channel Quality Indicator and the number of coded bits of the Precoding Matrix Indicator may be provided based on at least the value of the Rank Indicator. Both of the Channel Quality Indicator and the Precoding Matrix Indicator may be coded.

Whether or not the coded bits $\{q_1, q_2\}$ of the Uplink Control Information are mapped at the predetermined position may be provided based on whether the first method or the second method is applied. For example, in a case that the first method is used for mapping of the multiplexed bits $g_k$, the coded bits $\{q_1, q_2\}$ of the Uplink Control Information may be mapped at the predetermined position. In a case that the second method is used for mapping of the multiplexed bits $g_k$, the coded bits $\{q_1, q_2\}$ of the Uplink Control Information may be mapped at the first position.

For example, the first position may include at least the head column (#0) of the first-axis. The first position may include at least the second column of the first-axis. The first position may be a column on the front side of the predetermined position. The first position may be a portion on the front side of the predetermined position of the Uplink Control Information. The first position need not include at least a portion of the predetermined position of the coded bits of the Uplink Control Information.

FIG. 13 is a diagram illustrating an example of the number of bits of the Channel Quality Indicator and the Precoding Matrix Indicator. Here, for example, in a case that the number of antenna ports is configured to be 2, the number of bits of the Channel Quality Indicator for codeword 0 is 4, irrespective of the value of the Rank Indicator. The number of bits of the Precoding Matrix Indicator is 2N, irrespective of the value of the Rank Indicator. As illustrated in FIG. 13, the number of bits of the Channel Quality Indicator and/or the number of bits of the Precoding Matrix Indicator may be provided irrespective of the value of the Rank Indicator. In a case that the number of bits of the Channel Quality Indicator and/or the number of bits of the Precoding Matrix Indicator is provided irrespective of the value of the Rank Indicator, the second processing and/or the third processing can be performed before the first processing is performed. Therefore, efficiency of the processing is enhanced.

In FIG. 13, in a case that the value of the Rank Indicator is 1, the Channel Quality Indicator for codeword 0 is fed back to the base station apparatus 3, while the Channel Quality Indicator for codeword 1 need not be fed back to the base station apparatus 3. Specifically, in a case that the number of bits of the Channel Quality Indicator is provided irrespective of the value of the Rank Indicator and in a case that the value of the Rank Indicator is 1, dummy bits may be inserted into the Channel Quality Indicator for codeword 1. In the case that the number of bits of the Channel Quality Indicator is provided irrespective of the value of the Rank Indicator and the value of the Rank Indicator is 1, the Channel Quality Indicator for codeword 0 may be inserted into the Channel Quality Indicator for codeword 1. In the case that the number of bits of the Channel Quality Indicator is provided irrespective of the value of the Rank Indicator and the value of the Rank Indicator is 1, the Channel Quality Indicator for codeword 1 may correspond to Out of range.

In one aspect of the present embodiment, a method in which the number of bits of control information (the Channel Quality Indicator and/or the Precoding Matrix Indicator) is provided may be provided based on whether or not arrangement switching of the multiplexed bits $g_k$ is performed by the channel interleaver unit 4008. Specifically, in a case that arrangement switching of the multiplexed bits $g_k$ is performed by the channel interleaver unit 4008, the number of bits of the control information may be provided based on at least the value of the Rank Indicator. In a case that arrangement switching of the multiplexed bits $g_k$ is not performed by the channel interleaver unit 4008, the number of bits of the control information may be provided irrespective of the value of the Rank Indicator. For example, in the case that arrangement switching of the multiplexed bits $g_k$ is not performed by the channel interleaver unit 4008, the number of bits of the control information may be provided based on a value or the like. described in specifications or the like. In the case that arrangement switching of the multiplexed bits $g_k$ is not performed by the channel interleaver unit 4008, the number of bits of the control information may be provided based on information contained in the higher layer signaling or a downlink control channel (e.g., the uplink grant).

The method in which the number of bits of the control information is provided may be provided based on the method used for mapping of the multiplexed bits $g_k$. For example, in a case that the first method is used for mapping of the multiplexed bits $g_k$, the number of bits of the control information may be provided based on the value of the Rank Indicator. In a case that the second method is used for mapping of the multiplexed bits $g_k$, the number of bits of the control information may be provided irrespective of the value of the Rank Indicator. For example, in the case that the second method is used for mapping of the multiplexed bits $g_k$, the number of bits of the control information may be provided based on a value or the like described in specifications or the like. In the case that the second method is used for mapping of the multiplexed bits $g_k$, the number of bits of the control information may be provided based on the higher layer signaling or signaling contained in the downlink control channel (e.g., the uplink grant). In the case that the second method is used for mapping of the multiplexed bits $g_k$ and the value of the Rank Indicator is 1, dummy bits may be inserted into the Channel Quality Indicator for codeword 1. In the case that the second method is used for mapping of the multiplexed bits $g_k$ and the value of the Rank Indicator is 1, the Channel Quality Indicator for codeword 0 may be inserted into the Channel Quality Indicator for codeword 1. In the case that the second method is used for mapping of the multiplexed bits $g_k$ and the value of the Rank Indicator is 1, the Channel Quality Indicator for codeword 1 may correspond to Out of range.

In one aspect of the present embodiment, a method in which the number of bits of the coded bits obtained by coding the control information (the Channel Quality Indicator and/or the Precoding Matrix Indicator) is provided may be provided based on whether or not arrangement switching of the multiplexed bits $g_k$ is performed by the channel interleaver unit 4008. Specifically, in a case that arrangement switching of the multiplexed bits $g_k$ is performed by the channel interleaver unit 4008, the number of bits of the coded bits of the control information is provided based on Equation (1), where O in Equation (1) is the number of bits of CQI, the number of bits of PMI, or the number of bits of CQI+PMI. In a case that arrangement switching of the multiplexed bits $g_k$ is not performed by the channel interleaver unit 4008, the number of bits of the coded bits of the control information is provided based on Equation (1), where O in Equation (1) may be different from the number of bits of CQI, the number of bits of PMI, or the number of bits of CQI+PMI. For example, in the case that arrangement switching of the multiplexed bits $g_k$ is not performed by the channel interleaver unit 4008, O may be provided based on the description of specifications or the like. In the case that arrangement switching of the multiplexed bits $g_k$ is not performed by the channel interleaver unit 4008, O may be provided based on information contained in the higher layer signaling and/or the downlink control channel (e.g., the uplink grant). In the case that arrangement switching of the multiplexed bits $g_k$ is not performed by the channel interleaver unit 4008, the number of bits of the coded bits of the control information may be provided based on a first function different from Equation (1). The first function may be a function provided irrespective of O.

The method in which the number of bits of the coded bits obtained by coding the control information (the Channel Quality Indicator and/or the Precoding Matrix Indicator) is provided may be provided based on the method used for mapping of the multiplexed bits $g_k$. For example, in a case that the first method is used for mapping of the multiplexed bits $g_k$, the number of bits of the coded bits of the control information is provided based on Equation (1), where O in Equation (1) may be the number of bits of CQI, the number of bits of PMI, or the number of bits of CQI+PMI. In a case that the second method is used for mapping of the multiplexed bits $g_k$, the number of bits of the coded bits of the control information is provided based on Equation (1), where O in Equation (1) may be different from the number of bits of CQI, the number of bits of PMI, or the number of bits of CQI+PMI. In the case that the second method is used for mapping of the multiplexed bits $g_k$, O may be provided based on the description of specifications or the like. In the case that the second method is used for mapping of the multiplexed bits $g_k$, O may be provided based on information contained in the higher layer signaling and/or the downlink control channel (e.g., the uplink grant). In the case that the second method is used for mapping of the multiplexed bits $g_k$, the number of bits of the coded bits of the control information may be provided based on the first function different from Equation (1).

In consideration of prompt response of the HARQ-ACK provided based on decoding of the transport block to a sender of a channel containing the transport block, mapping the concatenated bits $f_k$ on the front side of mapping of the coded bits $q_0$ is preferable. Specifically, in one aspect of the present embodiment, whether or not the multiplexed bits $g_k$ are provided by concatenating the concatenated bits $f_k$ on the end side of the coded bits $q_0$ may be provided based on at least whether or not arrangement switching of the multiplexed bits $g_k$ is performed by the channel interleaver unit 4008. For example, in a case that arrangement switching of the multiplexed bits $g_k$ is performed by the channel interleaver unit 4008, the multiplexed bits $g_k$ may be provided by concatenating the concatenated bits $f_k$ on the end side of the coded bits $q_0$. In a case that arrangement switching of the multiplexed bits $g_k$ is not performed by the channel interleaver unit 4008, the multiplexed bits $g_k$ may be provided by concatenating the concatenated bits $f_k$ on the front side of the coded bits $q_0$.

A method of generating the multiplexed bits $g_k$ may be provided based on the method used for mapping of the multiplexed bits $g_k$. For example, in a case that the first method is used for mapping of the multiplexed bits $g_k$, the multiplexed bits $g_k$ may be provided by concatenating the concatenated bits $f_k$ on the end side of the coded bits $q_0$. In a case that the second method is used for mapping of the multiplexed bits $g_k$, the multiplexed bits $g_k$ may be provided by concatenating the concatenated bits $f_k$ on the front side of the coded bits $q_0$.

For example, the resource element map processing unit 3007 may perform processing of mapping the transmit bits to the resource elements. The resource element may correspond to an element mapped in a block $B_2$. Here, the block $B_2$ may be a subframe (or a portion of a subframe). The block $B_2$ may be a slot (or a portion of a slot). The block $B_2$ may correspond to one or multiple OFDM symbols. The resource element map processing unit 3007 may map the transmit bits in first-axis prioritized manner, or may map the transmit bits in second-axis prioritized manner. Here, the block $B_2$ is the same as the block B, except for the number of columns and the number of rows of the block $B_2$. At least one of the first-axis and the second-axis of the block $B_2$ may be the frequency axis. At least one of the first-axis and the second-axis of the block $B_2$ may be the time axis.

A processing block including a function of mapping and/or acquiring a sequence of information (e.g., coded bits, multiplexed bits, transmit bits, or the like) to and/or from any of the block B, the block $B_1$, and the block $B_2$ is also referred to as a mapping unit. The block B, the block $B_1$, and the block $B_2$ are also collectively referred to as a mapping region.

The resource element map processing unit 3007 may apply frequency hopping to the map processing of mapping the transmit bits to the resource elements. The frequency hopping may be slot hopping. The slot hopping may be a method in which radio signals of two slots included in one subframe are transmitted on frequencies different from each other.

Whether or not frequency hopping is applied to the map processing of the resource elements may be based on information contained in the higher layer signaling. Whether or not frequency hopping is applied to the map processing of the resource elements may be based on information contained in the control channel. Whether or not frequency hopping is applied to the map processing of the resource elements may be based on information configured in advance.

For example, which of the first-axis and the second-axis is used first by the resource element map processing unit 3007 to map the transmit bits may be provided based on the predetermined condition 401 or the predetermined condition 501.

Here, for example, the first-axis may be the time axis, and the second-axis may be the frequency axis. The first-axis may be the frequency axis, and the second-axis may be the time axis.

Carrier aggregation will be described below.

Here, one or multiple serving cells may be configured for the terminal apparatus 1. A technology in which the terminal apparatus 1 communicates via multiple serving cells is referred to as cell aggregation or carrier aggregation.

One or multiple configured serving cells may include one primary cell, and one or multiple secondary cells. The primary cell may be a serving cell on which an initial connection establishment procedure has been performed, a serving cell in which a connection re-establishment procedure has been started, or a cell indicated as a primary cell during a handover procedure. The primary cell may be a cell used to transmit on the PUCCH. Here, the secondary cell(s) may be configured at a time point or after RRC connection is established.

In downlink, a carrier corresponding to the serving cell is referred to as a downlink component carrier. In uplink, a carrier corresponding to the serving cell is referred to as an uplink component carrier. The downlink component carrier and the uplink component carrier are collectively referred to as a component carrier.

The terminal apparatus 1 may simultaneously transmit and/or receive on multiple physical channels in one or multiple serving cells (component carriers). Here, one physical channel may be transmitted in one serving cell (component carrier) of the multiple serving cells (component carriers).

Here, the base station apparatus 3 may configure one or multiple serving cells, by using the higher layer signaling (e.g., the RRC signaling). For example, one or multiple secondary cells may be configured to form a set of multiple serving cells with the primary cell.

The base station apparatus 3 may activate or deactivate one or multiple serving cells, by using the higher layer signaling (e.g., the MAC control element). For example, the base station apparatus 3 may activate or deactivate one or multiple serving cells of the one or multiple serving cells configured using the RRC signaling. Here, the terminal apparatus 1 may transmit CSI (e.g., aperiodic CSI) only for activated serving cell(s).

Linking may be defined between the uplink (e.g., the uplink component carrier) and the downlink (e.g., the downlink component carrier). Specifically, based on the linking between the uplink and the downlink, the serving cells for the uplink grant (serving cells in which transmission on the (s)PUSCH scheduled via the uplink grant (uplink transmission) is performed) may be identified. Here, there is no carrier indicator field in the downlink assignment or the uplink grant in this case.

Specifically, the downlink assignment received in the primary cell may correspond to downlink transmission in the primary cell. The uplink grant received in the primary cell may correspond to uplink transmission in the primary cell. The downlink assignment received in a certain secondary cell may correspond to downlink transmission in the certain secondary cell. The uplink grant received in a certain secondary cell may correspond to uplink transmission in the certain secondary cell.

As described above, the HARQ-ACK indicates an ACK or a NACK. The terminal apparatus 1 or the base station apparatus 3 determines an ACK or a NACK for a signal, based on whether or not the terminal apparatus 1 or the base station apparatus 3 has succeeded in receiving (demodulating and decoding) the signal. The ACK indicates that the terminal apparatus 1 or the base station apparatus 3 has succeeded in receiving the signal, and the NACK indicates that the terminal apparatus 1 or the base station apparatus 3 has failed in receiving the signal. The terminal apparatus 1 or the base station apparatus 3 to which the NACK has been fed back may perform retransmission of a signal corresponding to the NACK. The terminal apparatus 1 determines whether or not the terminal apparatus 1 retransmits a PUSCH, based on details of a HARQ-ACK for a PUSCH transmitted from the base station apparatus 3. The base station apparatus 3 determines whether or not the base station apparatus 3 retransmits a PDSCH, based on details of a HARQ-ACK for a PDSCH or a PDCCH/EPDCCH transmitted from the terminal apparatus. The HARQ-ACK for the PUSCH transmitted by the terminal apparatus 1 is fed back to the terminal apparatus, by using a PDCCH or a PHICH. The HARQ-ACK for the PDSCH or the PDCCH/EPDCCH transmitted by the base station apparatus 3 is fed back to the base station apparatus 3, by using a PUCCH or a PUSCH.

Next, a transmission timing of the HARQ-ACK for the downlink transmission (PDSCH) according to the present embodiment will be described. In the present embodiment, description is given assuming a case that a normal CP is attached to the OFDM symbol and/or the SC-FDMA symbol (i.e., a case that one slot is constituted with 7 symbols, a case that one subframe is constituted with 14 symbols), but the same may apply to a case that an extended CP is attached.

The downlink transmission according to the present embodiment may be the sPDSCH. A transmission timing of the HARQ-ACK for the sPDSCH may be provided based on the Transmission Time Interval (sTTI) of the sPDSCH. Specifically, the transmission timing of the HARQ-ACK for the sPDSCH may be provided based on at least an index of the sTTI. The transmission timing of the HARQ-ACK for the sPDSCH may be provided based on at least the index of the sTTI and/or an index of a subframe. Specifically, in the description according to one aspect of the present embodiment, a subframe x may mean an x-th subframe. The subframe x may mean an x-th sTTI (or sPDSCH). The subframe x may be provided based on an index x1 of the subframe and an index x2 of the sTTI. For example, x may be x=x1*$N_{sTTI}$m+x2. Here, for example, $N_{sTTI}$ may correspond to the number of sTTIs (a maximum value of the number of sTTIs, or the like) included in one subframe (a TTI, or a predetermined Transmission Time Interval).

As for the transmission timing of the HARQ-ACK for the PDSCH, in a case that the terminal apparatus 1 detects a PDSCH in a subframe n-j for the FDD, the terminal apparatus 1 transmits the HARQ-ACK for the PDSCH in a subframe n. Specifically, the transmission timing of the HARQ-ACK for the PDSCH is a subframe that is j subframes after the subframe in which the PDSCH is transmitted.

Next, a transmission timing of the PUSCH for the uplink grant according to the present embodiment will be described.

As for the transmission timing of the PUSCH for the uplink grant, in a case that the terminal apparatus 1 detects a PDCCH (an uplink grant) in the subframe n for the FDD, the terminal apparatus 1 transmits the PUSCH for the uplink grant in a subframe n+k. Specifically, the transmission timing of the PUSCH for the uplink grant is a subframe that is k subframes after the subframe in which the uplink grant is detected.

As described in the above, the transmission timing of the HARQ-ACK for the PDSCH and the transmission timing of the PUSCH for the uplink grant may be four subframes. The transmission timing may also be referred to as a normal timing. For the FDD, k and j may be 4. k and j being 4 may be referred to as the normal timing.

The value of k and/or j may be a value smaller than 4. For example, the value of k and/or j may be 2. For example, the value of k and/or j may be 3. The value of k and/or j may be determined by processing capability of the terminal apparatus 1. k and j having a value smaller than 4 may also be referred to as a reduced timing. Here, the value of k and/or j may be a value of 4 or greater.

Here, the processing capability of the terminal apparatus 1 may be indicated by the capability information of the terminal apparatus 1. The terminal apparatus 1 may notify the base station apparatus 3 of the capability information (transmit the capability information to the base station apparatus 3).

The capability information of the terminal apparatus 1 will be described below. The capability information of the terminal apparatus 1 may be defined as information on capability of the terminal apparatus 1.

For example, the capability information of the terminal apparatus 1 may indicate actual time taken by the terminal apparatus 1 to process data. The processing time is determined based on time required to receive and decode a detected signal and time required to generate (modulate and code) a signal to transmit. In a specific sense, the capability information of the terminal apparatus 1 may indicate actual processing time of the HARQ-ACK for the PDSCH (e.g., in milliseconds). The processing time of the HARQ-ACK for the PDSCH may be time required for processing from reception and detection (decoding, blind decoding) of the PDCCH for scheduling the PDSCH to generation (modulation and coding) of the HARQ-ACK. The capability information of the terminal apparatus 1 may indicate actual processing time of the PUSCH for the uplink grant (e.g., in milliseconds). The processing time of the PUSCH for the uplink grant may be time required for processing from reception and detection (decoding, blind decoding) of the uplink grant for scheduling the PUSCH to generation (modulation and coding) of the PUSCH.

The capability information of the terminal apparatus 1 may indicate capability of supporting the terminal apparatus 1 to transmit and/or receive the sTTI.

The capability information of the terminal apparatus 1 may indicate category information of the terminal apparatus 1. The category information of the terminal apparatus 1 may include capability information that the terminal apparatus 1 reduces the processing time. The category information of the terminal apparatus 1 may include the transmission timing (the values of k and j) that can be supported by the terminal apparatus 1.

The base station apparatus 3 may determine the transmission timing (i.e., the values of k and j) that can be used by the terminal apparatus 1, based on the capability information transmitted from the terminal apparatus 1. The transmission timing (i.e., the values of k and j) may be configured as a higher layer parameter. The base station apparatus 3 may transmit RRC signaling including the transmission timing (i.e., the values of k and j) that can be used by the terminal apparatus 1 to the terminal apparatus 1.

The transmission timing (the values of k and j) may be defined by specifications or the like, and may be known values between the base station apparatus 3 and the terminal apparatus 1.

Here, the values of k and j may be defined with reference to the number of subframes. For example, the values of k and j may be 2, 3, and 4. The values of k and j may be expressed by the number of symbols (OFDM symbols and/or SC-FDMA symbols). For example, the values of k and j expressed by the number of symbols may be determined based on a relationship between the subframe and the symbols of FIG. 3. The values of k and j expressed by the number of symbols may be predetermined values. The values of k and j may be determined based on the length of the TTI. The TTI may include the sTTI.

Next, a Transport Block Size (TBS) according to the present embodiment will be described.

The TBS is the number of bits of the transport block. As described in the above, the uplink grant includes DCI format 0 and DCI format 4. DCI format 0 includes at least (a) a 'Resource block assignment and hopping resource allocation' field, (b) a 'Modulation and coding scheme and redundancy version' field, and (c) a 'New data indicator' field. DCI format 4 includes at least d) a 'Resource block assignment' field, (e) a 'Modulation and coding scheme and redundancy version' field for transport block 1, (f) a 'New data indicator' field for transport block 1, (g) a 'Modulation and coding scheme and redundancy version' field for transport block 2, and (h) a 'New data indicator' field for transport block 2.

The terminal apparatus 1 determines an MCS index ($I_{MCS}$) for the PUSCH, based on (b) the 'Modulation and coding scheme and redundancy version' field, (e) the 'Modulation and coding scheme and redundancy version' field for transport block 1, or (g) the 'Modulation and coding scheme and redundancy version' field for transport block 2. The terminal apparatus 1 refers to the determined MCS index ($I_{MCS}$) for the PUSCH to determine a modulation order ($Q_m$) for the PUSCH, a transport block size index ($I_{TBS}$) for the PUSCH, and a redundancy version ($rv_{idx}$) for the PUSCH.

The terminal apparatus 1 calculates a total number ($N_{PRB}$) of physical resource blocks allocated for the PUSCH, based on (a) the 'Resource block assignment and hopping resource allocation' field or (d) the 'Resource block assignment' field.

Specifically, the terminal apparatus 1 refers to the calculated total number ($N_{PRB}$) of physical resource blocks allocated for the PUSCH and the determined MCS index ($I_{MCS}$) for the PUSCH to determine the transport block size (TBS) for the PUSCH.

Similarly, the terminal apparatus 1 may refer to the total number ($N_{PRB}$) of physical resource blocks allocated for the PDSCH and the MCS index ($I_{MCS}$) for the PDSCH to determine the transport block size (TBS) for the PDSCH. Here, the total number ($N_{PRB}$) of physical resource blocks allocated for the PDSCH may be calculated based on a 'Resource block assignment' field included in the downlink grant. The MCS index ($I_{MCS}$) for the PDSCH may be indicated by a 'Modulation and coding scheme' field included in the downlink grant. The terminal apparatus 1 refers to the indicated MCS index ($I_{MCS}$) for the PDSCH to determine the modulation order ($Q_m$) for the PDSCH and the transport block size index ($I_{TBS}$) for the PDSCH.

Figure 14:
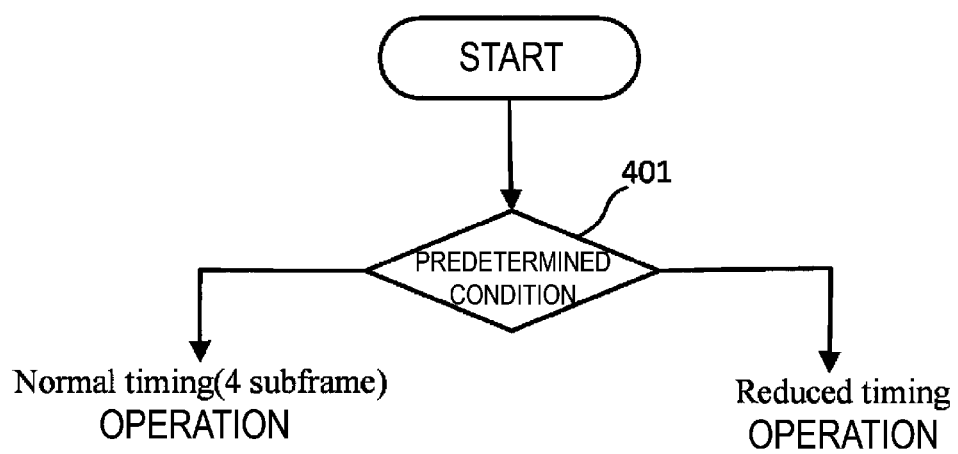
FIG. 14 is a diagram illustrating transmission timing of the PUSCH or HARQ-ACK according to the present embodiment.

FIG. 14 is a diagram illustrating the transmission timing of the PUSCH or the HARQ-ACK according to the present embodiment. Specifically, the transmission timing (the values of k and j) may be provided to the terminal apparatus 1 and the base station apparatus 3, based on the predetermined condition 401. Hereinafter, basically, operations of the terminal apparatus 1 will be described. However, it goes without saying that the base station apparatus 3 performs similar operations, corresponding to the operations of the terminal apparatus 1.

As illustrated in FIG. 14, the terminal apparatus 1 may determine (switch) any of normal timing operation and Reduced timing operation, based on the predetermined condition 401. Specifically, in a case that the normal timing operation is determined, the terminal apparatus 1 may use k or j having a value of 4 to perform transmission of data. In a case that the reduced timing operation is determined, the terminal apparatus 1 may use k or j having a value smaller than 4 to perform transmission of data.

Here, the transmission of data may include transmission on the PUSCH. The transmission of data may include transmission of the HARQ-ACK.

In a specific sense, the normal timing operation may include transmission on the PUSCH in a subframe that is k subframes after the subframe in which the uplink grant is detected (received). The normal timing operation may include transmission of the HARQ-ACK on the PUCCH in a subframe that is j subframes after the subframe in which the PDSCH is detected. Specifically, in a case of the normal timing operation, k and j may be 4.

Here, the normal timing operation may include operation in which the maximum code block length Z of the transport block is configured to a predetermined value (a predetermined maximum code block length of the normal timing operation). Here, the transport block may be a transport block included in the PDSCH. The transport block may be a transport block included in the PUSCH. The transport block may be a transport block included in the PDSCH scheduled by the PDCCH. The transport block may be a transport block included in the PUSCH scheduled by the PDCCH. Here, the predetermined maximum code block length of the normal timing operation may be provided based on the description of specifications or the like. The predetermined maximum code block length of the normal timing operation may be 6144.

Here, the normal timing operation may include operation in which arrangement switching of the multiplexed bits is performed by the channel interleaver unit 4008. Here, the multiplexed bits may be the multiplexed bits included in the transport block. The multiplexed bits may be the multiplexed bits included in the transport block included in the PUSCH. The multiplexed bits may be the multiplexed bits included in the transport block included in the PUSCH scheduled by the PDCCH.

Here, the normal timing operation may include operation in which the transmit bits are mapped in the frequency axis first (Frequency first mapping) by the resource element map processing unit 3007. Here, the transmit bits may be the multiplexed bits included in the transport block. The transmit bits may be the multiplexed bits included in the transport block included in the PUSCH. The transmit bits may be the multiplexed bits included in the transport block included in the PUSCH scheduled by the PDCCH.

Here, the normal timing operation may include an operation in which the coded bits of the Uplink Control Information are mapped at the predetermined position. The normal timing operation may include an operation in which the coded bits of the Uplink Control Information are mapped at the predetermined position by the channel interleaver unit 4008. Here, in a case that the Uplink Control Information is a Rank Indicator, the predetermined position of the coded bits of the Uplink Control Information may be the second column of the first-axis, the fifth column of the first-axis, the eighth column of the first-axis, and the eleventh column of the first-axis. In a case that the Uplink Control Information is a HARQ-ACK, the predetermined position of the coded bits of the Uplink Control Information may be the third column of the first-axis, the fourth column of the first-axis, the ninth column of the first-axis, and the tenth column of the first-axis.

Here, the normal timing operation may include an operation in which the multiplexed bits $g_k$ are provided by concatenating the concatenated bits $f_k$ on the end side of the coded bits $q_0$. The normal timing operation may include operation in which the multiplexed bits $g_k$ are provided by concatenating the concatenated bits $f_k$ on the end side of the coded bits $q_0$ by the control information and data multiplexing unit 4007.

Here, the normal timing operation may include an operation in which the number of bits of the control information (the Channel Quality Indicator and/or the Precoding Matrix Indicator) is provided based on at least the RI.

Here, the normal timing operation may include an operation in which the number of bits of the coded bits obtained by coding the control information (the Channel Quality Indicator and/or the Precoding Matrix Indicator) is provided based on Equation (1), where O in Equation (1) is the number of bits of CQI, the number of bits of PMI, or the number of bits of CQI+PMI.

The Reduced timing operation may include transmission on the PUSCH in a subframe that is k subframes after the subframe in which the uplink grant is detected (received). The Reduced timing operation may include transmission of the HARQ-ACK on the PUCCH in a subframe that is j subframes after the subframe in which the PDSCH is detected. Specifically, in a case of the Reduced timing operation, k and j may be values smaller than 4.

Here, the value of k and/or j may be a value defined in advance by the capability information of the terminal apparatus 1. For example, the value of k and/or j may be 2. The value of k and/or j may be 3. Specifically, in the reduced timing operation, transmission of the PUSCH or the HARQ-ACK can be performed earlier than four subframes being the normal timing. The values of k and j in the case of the reduced timing operation may be smaller than the values of k and j in the case of the normal timing.

Here, the reduced timing operation may include an operation in which the maximum code block length Z of the transport block is configured to a value different from the predetermined maximum code block length of the normal timing operation. For example, the reduced timing operation may include operation in which the maximum code block length Z of the transport block is configured to a value smaller than the predetermined maximum code block length of the normal timing operation. For example, the reduced timing operation may include operation in which the maximum code block length Z of the transport block is configured to a value larger than the predetermined maximum code block length of the normal timing operation. Here, the transport block may be a transport block included in the PDSCH. The transport block may be a transport block included in the PUSCH. The transport block may be a transport block included in the PDSCH scheduled by the PDCCH. The transport block may be a transport block included in the PUSCH scheduled by the PDCCH.

Here, the reduced timing operation may include an operation in which arrangement switching of the multiplexed bits is not performed by the channel interleaver unit 4008. The multiplexed bits may be the multiplexed bits included in the transport block. The multiplexed bits may be the multiplexed bits included in the transport block included in the PUSCH. The multiplexed bits may be the multiplexed bits included in the transport block included in the PUSCH scheduled by the PDCCH.

Here, the reduced timing operation may include an operation in which the transmit bits are mapped in the time axis first (Time first mapping) by the resource element map processing unit 3007. Here, the transmit bits may be the multiplexed bits included in the transport block. The transmit bits may be the multiplexed bits included in the transport block included in the PUSCH. The transmit bits may be the multiplexed bits included in the transport block included in the PUSCH scheduled by the PDCCH.

The reduced timing operation may include an operation in which the transmit bits are mapped in the frequency axis first (Frequency first mapping) by the resource element map processing unit 3007.

Here, the reduced timing operation may include an operation in which the coded bits of the Uplink Control Information are mapped at the first position. The reduced timing operation may include operation in which the coded bits of the Uplink Control Information are mapped at the first position by the channel interleaver unit 4008. The first position may include at least the head column (#0) of the first-axis. The first position may include at least the second column of the first-axis. The first position may be a column on the front side of the predetermined position. The first position may be a portion on the front side of the predetermined position of the Uplink Control Information. The first position need not include at least a portion of the predetermined position of the coded bits of the Uplink Control Information.

Here, the reduced timing operation may include an operation in which the multiplexed bits $g_k$ are provided by concatenating the concatenated bits $f_k$ on the front side of the coded bits $q_0$. The reduced timing operation may include an operation in which the multiplexed bits $g_k$ are provided by concatenating the concatenated bits $f_k$ on the front side of the coded bits $q_0$ by the control information and data multiplexing unit 4007.

Here, the reduced timing operation may include an operation in which the number of bits of the control information (the Channel Quality Indicator and/or the Precoding Matrix Indicator) is provided irrespective of the value of the RI. The reduced timing operation may include an operation in which the number of bits of the control information is provided based on a value or the like described in specifications or the like. The reduced timing operation may include an operation in which the number of bits of the control information is provided based on the higher layer signaling and/or signaling contained in the downlink control channel (e.g., the uplink grant). In a case that the Rank Indicator is 1, the reduced timing may include insertion of dummy bits into the Channel Quality Indicator for codeword 1. In the case that the Rank Indicator is 1, the reduced timing may include insertion of the Channel Quality Indicator for codeword 0 into the Channel Quality Indicator for codeword 1. In the case that the Rank Indicator is 1, the reduced timing may include the Channel Quality Indicator for codeword 1 corresponding to Out of range.

Here, the reduced timing operation may include an operation in which the number of bits of the coded bits obtained by coding the control information (the Channel Quality Indicator and/or the Precoding Matrix Indicator) is provided based on Equation (1), where O in Equation (1) is different from the number of bits of CQI, the number of bits of PMI, or the number of bits of CQI+PMI. The reduced timing operation may include an operation in which the number of bits of the coded bits of the control information is provided based on the first function different from Equation (1).

The predetermined condition 401 of FIG. 14 may include at least one of the following first condition to fifth condition. The terminal apparatus 1 may determine transmission timing operation, based on a part or all of the following first condition to seventh condition.

(1) First condition: whether a search space detecting the PDCCH is a CSS or a USS. Here, the PDCCH is a PDCCH used for scheduling of the PDSCH to which the HARQ-ACK corresponds, or a PDCCH used for scheduling of the PUSCH.

(2) Second condition: which RNTI is used to scramble the CRC parity bits attached to the DCI format. Here, the DCI format is a DCI format included in the PDCCH used for scheduling of the PDSCH to which the HARQ-ACK corresponds, or a DCI format included in the PDCCH used for scheduling of the PUSCH.

(3) Third condition: whether a TBS to be processed exceeds a threshold value of a maximum TBS. Here, the TBS to be processed is a size of the transport block included in the PDSCH, or a size of the transport block included in the PUSCH.

(4) Fourth condition: whether a value of a Timing Advance (Timing Alignment) (TA) exceeds a threshold value of a maximum TA.

(5) Fifth condition: whether a higher layer parameter indicating effectiveness of the reduced timing is configured.

(6) Sixth condition: whether a channel including a higher layer parameter indicating that there is capability of the reduced timing is to transmit.

(7) Seventh condition: mapping method of the multiplexed bits $g_k$ for the transport block.

Here, the first condition may be whether or not the position at which the PDCCH including a DCI format is detected is a predetermined position (a predetermined position for the reduced timing operation). Here, the predetermined position may be a logical position provided based on an index. For example, the position at which the PDCCH including a DCI format is detected may be provided based on whether or not the CCE index of the PDCCH is a predetermined CCE index $I_{AL, INDEX}$. The position at which the PDCCH including a DCI format is detected may be provided based on the aggregation level of the PDCCH candidates.

Specifically, on the first condition, the terminal apparatus 1 determines an operation, based on which of a CSS and a USS the search space in which the PDCCH is detected is. For example, in a case that the search space in which the PDCCH is detected is the CSS, at least a part or all of the normal timing operation may be performed. For example, in a case that the search space in which the PDCCH is detected is the USS, at least a part or all of the Reduced timing operation may be performed.

On the first condition, in a case that the CCE index $I_{AL, INDEX}$ with which the PDCCH including a DCI format is detected is a predetermined CCE index $I_{PRE}$, the terminal apparatus 1 may perform at least a part or all of the reduced timing operation. In a case that the CCE index $I_{AL, INDEX}$ with which the PDCCH including a DCI format is detected is different from the predetermined CCE index $I_{PRE}$, the terminal apparatus 1 may perform at least a part or all of the normal timing operation. Here, $I_{PRE}$ may be a value provided based on the description of specifications or the like.

On the first condition, in a case that the aggregation level of the PDCCH including a DCI format to be detected is a predetermined aggregation level, the terminal apparatus 1 may perform at least a part or all of the reduced timing operation. In a case that the aggregation level of the PDCCH including a DCI format to be detected is different from the predetermined aggregation level, the terminal apparatus 1 may perform at least a part or all of the normal timing operation. Here, the predetermined aggregation level may be a part or all of 1, 2, 4, and 8. For example, the predetermined aggregation level may be an aggregation level of N or less (or less than N). The predetermined aggregation level may be an aggregation level of N or greater (or exceeding N). Here, N is a constant.

On the first condition, the terminal apparatus 1 may change operation, based on whether a channel including a DCI format to be detected is a PDCCH or an sPDCCH. Specifically, on the first condition, in a case that the channel including a DCI format to be detected is the PDCCH, the terminal apparatus 1 may perform the normal timing operation. In a case that the channel including a DCI format to be detected is the sPDCCH, the terminal apparatus 1 may perform the reduced timing operation. Specifically, the first condition may be whether the channel including a DCI format to be detected is a PDCCH or an sPDCCH.

On the first condition, the terminal apparatus 1 may change an operation, based on whether the payload size of a DCI format to be detected is a predetermined payload size or a first payload size. Specifically, on the first condition, in a case that the payload size of a DCI format to be detected is the predetermined payload size, the terminal apparatus 1 may perform the normal timing operation. In a case that the payload size of a DCI format to be detected is the first payload size, the terminal apparatus 1 may perform the reduced timing operation. Specifically, the first condition may be whether or not the payload size of a DCI format to be detected is a predetermined value.

On the second condition, the terminal apparatus 1 determines operation, based on with which RNTI the CRC parity bits to be attached to the DCI format are scrambled. For example, in a case that the CRC parity bits to be attached to the DCI format are scrambled with any of the following RNTIs, the terminal apparatus 1 may perform at least a part or all of the normal timing operation.

(a) Temporary C-RNTI
(b) P-RNTI
(c) SI-RNTI

For example, in a case that the CRC parity bits to be attached to the DCI format are scrambled with any of the following RNTIs, the terminal apparatus 1 may perform at least a part or all of the Reduced timing operation.

(d) C-RNTI
(e) SPS-RNTI

In order that at least a part or all of the normal timing operation be performed, a new RNTI type (e.g., an X-RNTI) may be defined. In a case that the CRC parity bits to be attached to the DCI format are scrambled by the X-RNTI, the terminal apparatus 1 may perform at least a part or all of the normal timing operation. For example, the X-RNTI may be the C-RNTI. The X-RNTI may be a dedicated RNTI used for scheduling of the sPDSCH and/or the sPUSCH.

In order that at least a part or all of the Reduced timing operation be performed, a new RNTI type (e.g., a Y-RNTI) may be defined. In a case that the CRC parity bits to be attached to the DCI format are scrambled by the Y-RNTI, the terminal apparatus 1 may perform at least a part or all of the reduced timing operation. Here, the Y-RNTI may be a value shared by a group or all of the terminal apparatus 1 to which at least a part or all of the reduced timing operation is applied.

In a case that the X-RNTI and the Y-RNTI are configured for the terminal apparatus 1 through the higher layer signaling, whether at least a part or all of the normal timing operation is performed or at least a part or all of the reduced timing operation is performed may be switched, based on the second condition.

On the third condition, the terminal apparatus 1 determines operation, based on whether a TBS to be processed exceeds a threshold value of a maximum TBS. For example, in a case that the TBS to be processed exceeds the threshold value of the maximum TBS, at least a part or all of the normal timing operation may be performed. In a case that the TBS to be processed does not exceed the threshold value of the maximum TBS, at least a part or all of the Reduced timing operation may be performed. Here, the threshold value of the maximum TBS may be defined by specifications or the like, and may be a known value between the base station apparatus 3 and the terminal apparatus 1. The base station apparatus 3 may transmit RRC signaling including the threshold value of the maximum TBS to the terminal apparatus 1.

Here, the TBS to be processed may be (i) a bandwidth configured for the terminal apparatus 1 (transmission bandwidth allocated for PDSCH transmission or PUSCH transmission), and (ii) a TBS determined based on MCS configured for the terminal apparatus 1 (or a maximum value of a TBS). Specifically, the TBS to be processed may be determined based on (i) the bandwidth configured for the terminal apparatus 1 (transmission bandwidth allocated for PDSCH transmission or PUSCH transmission), and (ii) the MCS configured for the terminal apparatus 1. The TBS to be processed may be a TBS determined based on MCS configured for the terminal apparatus 1 (or a maximum value of a TBS). Specifically, the TBS to be processed may be determined based on the MCS configured for the terminal apparatus 1. The bandwidth configured for the terminal apparatus 1 (transmission bandwidth allocated for PDSCH transmission or PUSCH transmission) may be based on scheduling information. The scheduling information may be resource allocation information included in the DCI format for scheduling the PDSCH or the PUSCH. Specifically, the TBS to be processed may be a TBS calculated based on the DCI format for scheduling the PDSCH or the PUSCH. The scheduling information may be resource allocation information included in the DCI, the PDCCH, the EPDCCH, or the RRC signaling.

The terminal apparatus 1 may compare the threshold value of the maximum TBS and the TBS processed by the terminal apparatus 1. The threshold value of the maximum TBS may be a maximum value that may be processed by the terminal apparatus 1. The threshold value of the maximum TB S may be defined for each value of k or j. For example, the threshold values of the maximum TBS respectively corresponding to value of k and j different from each other may be different from each other. Specifically, the threshold value of the maximum TBS may be determined based on a bandwidth (or a system bandwidth). The threshold value of the maximum TBS may be determined based on the capability information of the terminal apparatus 1.

On the fourth condition, the terminal apparatus 1 determines operation, based on whether a Timing Advance (Timing Alignment) (TA) exceeds a threshold value of a maximum TA. For example, in a case that the TA exceeds the threshold value of the maximum TA, at least a part or all of the normal timing operation may be performed. In a case that the TA does not exceed the threshold value of the maximum TA, at least a part or all of the Reduced timing operation may be performed.

It may be considered that the TA indicates a distance between the terminal apparatus 1 and the base station apparatus 3. A TA value is a variable value, depending on the distance between the terminal apparatus 1 and the base station apparatus 3. The TA value indicates a transmission timing of an uplink subframe, and a time difference of the head of a corresponding downlink subframe. Specifically, the TA is used to adjust the transmission timing (the value of k and/or j) of the terminal apparatus 1. The TA value may be configured for the terminal apparatus 1, by using a TA command transmitted by the base station apparatus 3. The terminal apparatus 1 transmits at time before a subframe border of the uplink subframe by the TA value, based on the configured TA value. Specifically, the TA value affects the transmission timing (the value of k and/or j).

The threshold value of the maximum TA may be a maximum value of the TA that may be used by the terminal apparatus 1 for the transmission timing (the value of k or j). Specifically, it may be considered that the threshold value of the maximum TA limits a communicable range for each value of k or j. The threshold value of the maximum TA may be defined by specifications or the like, and may be a known value between the base station apparatus 3 and the terminal apparatus 1. The base station apparatus 3 may transmit RRC signaling including the threshold value of the maximum TA to the terminal apparatus 1.

On the fifth condition, a state that "a higher layer parameter indicating effectiveness of the reduced timing is not configured" may include a state that "a higher layer parameter indicating ineffectiveness of the reduced timing is configured." In a case that the higher layer parameter indicating effectiveness of the reduced timing is not configured, at least a part or all of the normal timing operation may be performed. In a case that the higher layer parameter indicating effectiveness of the reduced timing is configured, the normal timing operation or the reduced timing operation may be determined, based on at least a part or all of the above-mentioned first to fourth conditions. Here, a state that "a higher layer parameter indicating effectiveness of the reduced timing is not configured" may include a state that "a higher layer parameter indicating effectiveness of the reduced timing (or the reduced timing operation) is configured for the terminal apparatus 1," or a state that "the base station apparatus 3 transmits a channel including a higher layer parameter indicating effectiveness of the reduced timing to the terminal apparatus 1."

More specifically, in a case that the higher layer parameter indicating effectiveness of the reduced timing is not configured, the terminal apparatus 1 may perform at least a part or all of the normal timing operation, not based on a part or all of the above-mentioned first to fourth conditions. For example, in a case that the higher layer parameter indicating effectiveness of the reduced timing is not configured and the search space in which the PDCCH is detected is the USS, at least a part or all of the normal timing operation may be performed.

In a case that the higher layer parameter indicating effectiveness of the reduced timing is configured, the terminal apparatus 1 may determine the normal timing operation or the reduced timing operation, based on at least a part or all of the above-mentioned first to fourth conditions. As one example, for example, in a case that the higher layer parameter indicating effectiveness of the reduced timing is configured and the search space in which the PDCCH is detected is the CSS on the first condition, the terminal apparatus 1 may perform at least a part or all of the normal timing operation. In a case that the higher layer parameter indicating effectiveness of the reduced timing is configured and the search space in which the PDCCH is detected is the USS on the first condition, the terminal apparatus 1 may perform at least a part or all of the Reduced timing operation.

On the sixth condition, in a case that the terminal apparatus 1 does not transmit a channel including a higher layer parameter indicating that the terminal apparatus 1 has capability of the reduced timing, at least a part or all of the normal timing operation may be performed. In the case that the terminal apparatus 1 does not transmit a channel including the higher layer parameter indicating that the terminal apparatus 1 has capability of the reduced timing, the normal timing operation or the reduced timing operation may be determined, based on at least a part or all of the above-mentioned first to fifth conditions.

On the seventh condition, in a case that the terminal apparatus 1 performs arrangement switching of the multiplexed bits $g_k$, at least a part or all of the normal timing operation may be performed. In a case that the terminal apparatus 1 does not perform arrangement switching of the multiplexed bits $g_k$, the normal timing operation or the reduced timing operation may be determined, based on at least a part or all of the above-mentioned first to sixth conditions. On the seventh condition, in a case that the terminal apparatus 1 uses the first method for mapping of the multiplexed bits $g_k$, the normal timing operation may be performed. On the seventh condition, in a case that the terminal apparatus 1 uses the second method for mapping of the multiplexed bits $g_k$, the reduced timing operation may be performed.

In a case that the terminal apparatus 1 transmits a channel including the higher layer parameter indicating that the terminal apparatus 1 has capability of the reduced timing, at least a part or all of the reduced timing operation may be performed.

The terminal apparatus 1 may determine the transmission timing operation, based on combination of the above-mentioned conditions. The transmission timing operation may be provided based on at least a part or all of the normal timing operation. The transmission timing operation may be provided based on at least a part or all of the reduced timing operation.

For example, in a case that the PDCCH is detected in the CSS and the CRC parity bits to be attached to the DCI format to be transmitted on the PDCCH are scrambled with the C-RNTI, the terminal apparatus 1 may perform at least a part or all of the normal timing operation. For example, in a case that the PDCCH is detected in the USS and the CRC parity bits to be attached to the DCI format to be transmitted on the PDCCH are scrambled with the C-RNTI, the terminal apparatus 1 may perform at least a part or all of the Reduced timing operation.

Figure 15:
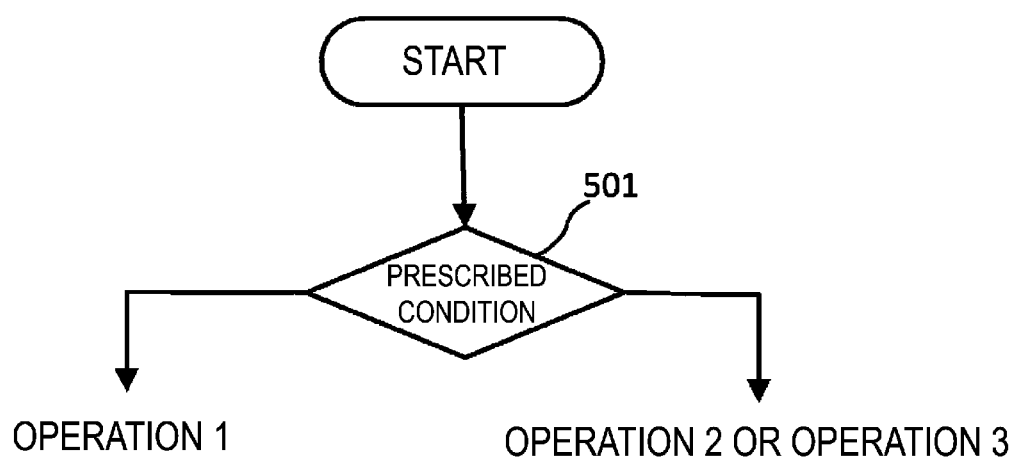
FIG. 15 is a diagram illustrating transmission operations of the PUSCH or HARQ-ACK according to the present embodiment.

FIG. 15 is a diagram illustrating transmission operations of the PUSCH or HARQ-ACK according to the present embodiment. In other words, the terminal apparatus 1 may determine (switch) operation 1, operation 2 or operation 3 based on the prescribed condition 501. The prescribed condition 501 in FIG. 15 may include at least one of the following first condition and the second condition. The terminal apparatus 1 may determine based on some or all of the following first condition and the second condition.

(i) The first condition: whether a search space detecting the PDCCH is a CSS or a USS.

(ii) The second condition: which RNTI is used to scramble CRC parity bits attached to the DCI format.

Here, the first condition may be whether or not the position where the PDCCH including the DCI format is detected is the predetermined position (the predetermined position for the reduced timing operation). Here, the predetermined position may be a logical position given based on an index. For example, for the position where the PDCCH including the DCI format is detected, a CCE index of the PDCCH may be given based on the prescribed CCE index $I_{AL,INDEX}$. The position where the PDCCH including the DCI format is detected may be given based on the aggregation level of the PDCCH.

In the first condition, the terminal apparatus 1 determines the operation whether the search space where the PDCCH is detected is the CSS or the USS. For example, in a case that the search space where the PDCCH is detected is the CSS, operation 1 may be performed. For example, in a case that the search space where the PDCCH is detected is the USS, operation 2 or operation 3 may be performed.

In the first condition, in a case that the CCE index $I_{AL,INDEX}$ where the PDCCH including the DCI format is detected is the prescribed CCE index $I_{PRE}$, the terminal apparatus 1 may perform operation 2 or operation 3. In a case that the CCE index $I_{AL,INDEX}$ where the PDCCH including the DCI format is detected is different from the prescribed CCE index $I_{PRE}$, the terminal apparatus 1 may perform operation 1. Here, $I_{PRE}$ may be a value given based on descriptions such as specifications.

In the first condition, in a case that the aggregation level of the PDCCH including the DCI format detected is the prescribed aggregation level, the terminal apparatus 1 may perform operation 2 or operation 3. In a case that the aggregation level of the PDCCH including the DCI format detected is different from the prescribed aggregation level, the terminal apparatus 1 may perform operation 1. Here, the prescribed aggregation level may be some or all of 1, 2, 4, and 8. For example, the prescribed aggregation level may be aggregation levels of smaller than or equal to N (or smaller than N). The prescribed aggregation level may be aggregation levels of greater than or equal to N (or greater than N). Here, N is a constant.

In the second condition, the terminal apparatus 1 determines operation based on with which RNTI the CRC parity bits attached to the DCI format are scrambled. For example, in a case that the CRC parity bits attached to the DCI format are scrambled with any of the following RNTIs, the terminal apparatus 1 may perform operation 1.
 (a) Temporary C-RNTI
 (b) P-RNTI
 (c) SI-RNTI For example, in a case that the CRC parity bits attached to the DCI format are scrambled with any of the following RNTIs, the terminal apparatus 1 may perform operation 2 or operation 3.
 (d) C-RNTI
 (e) SPS-RNTI A new RNTI type (e.g., a X-RNTI) may be defined to perform operation 1. In other words, in a case that the CRC parity bits attached to the DCI format are scrambled by the X-RNTI, the terminal apparatus 1 may perform operation 1.

A new RNTI type (e.g., a Y-RNTI) may be defined to perform operation 2 or operation 3. In a case that the CRC parity bits attached to the DCI format are scrambled by the Y-RNTI, the terminal apparatus 1 may perform operation 2 or operation 3.

In a case that the X-RNTI and the Y-RNTI are set to the terminal apparatus 1 by higher layer signaling, based on the second condition, the terminal apparatus 1 may switch whether to perform operation 1 or to perform operation 2 or operation 3.

The terminal apparatus 1 may determine operation 1, operation 2, or operation 3 based on combinations of the first condition and the second condition. For example, in a case that the PDCCH is detected in the CSS, and the CRC parity bits attached to the DCI format transmitted on the PDCCH are scrambled with the C-RNTI, the terminal apparatus 1 may perform operation 1. For example, in a case that the PDCCH is detected in the USS, and the CRC parity bits attached to the DCI format transmitted on the PDCCH are scrambled with the C-RNTI, the terminal apparatus 1 may perform operation 2 or operation 3.

Whether the terminal apparatus 1 performs operation 2 or operation 3 may be configured from the base station apparatus 3 beforehand.

In the following, operations of the terminal apparatus 1 will be described specifically.

Operation 1 may be an operation that is similar to the normal timing operation mentioned above. In other words, operation 1 may include an operation transmitting on the PUSCH in the subframe four subframes after the terminal apparatus 1 performs detection (reception) of the PDCCH (the uplink grant, the DCI format). Operation 1 may include an operation transmitting the HARQ-ACK on the PUCCH in the subframe four subframes after the terminal apparatus 1 detects the PDSCH.

In operation 2, the terminal apparatus 1 may determine the transmission timing (the value of k and/or j) based on (i) a TBS calculated based on the DCI format to schedule the PDSCH or the PUSCH and (ii) a threshold value of the prescribed maximum TBS. Operation 2 may include transmission on the PUSCH based on the value of k determined. Operation 2 may include transmission of the HARQ-ACK on the PUCCH based on the value of j determined.

Here, the threshold value of the prescribed maximum TBS may be different from the threshold value of the maximum TBS described in the third condition in FIG. 14. The threshold value of the prescribed maximum TBS in operation 2 may be configured based on capability information of the terminal apparatus 1. In other words, the threshold value of the prescribed maximum TBS may be configured to the value of k and/or j which the terminal apparatus 1 can support.

The threshold values of the prescribed maximum TBS may be configured separately depending on transmission timings (values of k) of the PUSCH and transmission timings (values of j) of the HARQ-ACK. In other words, based on transmission timings (values of k) of the PUSCH, the threshold values of the prescribed maximum TBS may be configured. Based on transmission timings (values of j) of the HARQ-ACK, the threshold values of the prescribed maximum TBS may be configured. Here, the threshold value of the maximum TBS configured for the transmission timing of the PUSCH may be different from the threshold value of the maximum TBS configured for the transmission timing of the HARQ-ACK. The threshold value of the prescribed maximum TBS may be configured as a parameter of the higher layers.

Now, details of an example of the transmission procedure of the PUSCH for the PDCCH detected according to operation 2 will be described. In other words, operation 2 is an operation to determine the value of k in a case of performing the transmission of the PUSCH in the subframe n+k, based on the detection of the PDCCH in the subframe n. As described above, the terminal apparatus 1 may notify (transmit) capability information to the base station apparatus 3. The base station apparatus 3 may configure the value of k used for the terminal apparatus 1, based on capability information of the terminal apparatus 1. The base station apparatus 3 may configure the threshold value of the prescribed maximum TBS for the value of k. The base station apparatus 3 may transmit (notify) to the terminal apparatus 1 by RRC signaling of the value of k and the threshold value of the corresponding prescribed maximum TBS. In other words, the transmission timing (the value of k) of the corresponding PUSCH is determined based on the TBS of the PUSCH scheduled.

FIGS. 16A and 16B are diagrams illustrating threshold values of maximum TBS and transmission timings (values of k) of corresponding PUSCHs. Different threshold values of the prescribed maximum TBS may be configured for different values of k. FIG. 16A is an example in a case that two threshold values of the prescribed maximum TBS are configured. FIG. 16B is an example in a case that one threshold value of maximum TBS is configured.

In FIG. 16A, the threshold values of the prescribed maximum TBS are configured to Max TBS1 and Max TBS2. In a case that the TBS calculated by the DCI format does not exceed the threshold value of the prescribed Max TBS1, the terminal apparatus 1 may determine (switch) the transmission timing (the value of k) of the PUSCH as k1. In a case that the TBS calculated by the DCI format is in the range from the threshold value of the prescribed Max TBS1 to the threshold value of the prescribed Max TBS2, the terminal apparatus 1 may determine (switch) the transmission timing (the value of k) of the PUSCH as k2. In a case that the TBS calculated by the DCI format is equal to or greater than the threshold of the prescribed Max TBS2, the terminal apparatus 1 may determine (switch) the transmission timing (the value of k) of the PUSCH as 4. Here, the value of k1 may be 2. The value of k2 may be 3.

In a case that the TBS calculated by the DCI format does not exceed the threshold value of the prescribed Max TBS1, the terminal apparatus 1 may perform at least some or all of the reduced timing operation. In a case that the TBS calculated by the DCI format is in the range of from the threshold value of the prescribed Max TBS1 to the threshold value of the prescribed Max TBS2, the terminal apparatus 1 may perform at least some or all of the reduced timing operation. In a case that the TBS calculated by the DCI format is in the range of from the threshold value of the prescribed Max TBS1 to the threshold value of the prescribed Max TBS2, the terminal apparatus 1 may perform at least some or all of the normal timing operation. In a case that the TBS calculated by the DCI format is equal to or greater than the threshold value of the prescribed Max TBS2, the terminal apparatus 1 may perform at least some or all of the normal timing operation.

In a case that the transmission timing of the PUSCH is switched to k1, at least some or all of the reduced timing operation may be applied, and in a case that the transmission timing of the PUSCH is switched to k2 or 4, at least some or all of the normal timing operation may be applied. In a case that the transmission timing of the PUSCH is switched to k1 or k2, at least some or all of the reduced timing operation may be applied, and in a case that the transmission timing of the PUSCH is switched to 4, at least some or all of the normal timing operation may be applied.

In FIG. 16B, the threshold value of the prescribed maximum TBS is configured to Max TBS3. In a case that the TBS calculated by the DCI format does not exceed the threshold value of the prescribed Max TBS3, the terminal apparatus 1 may determine (switch) the transmission timing (the value of k) of the PUSCH as k3. In a case that the TBS calculated by the DCI format exceeds the threshold value of the prescribed Max TBS3, the terminal apparatus 1 may determine (switch) the transmission timing (the value of k) of the PUSCH as 4. Here, the value of k3 may be 2. The value of k3 may be 3.

In a case that the TBS calculated by the DCI format does not exceed the threshold value of the prescribed Max TBS3, the terminal apparatus 1 may perform at least some or all of the reduced timing operation. In a case that the TBS calculated by the DCI format exceeds the threshold value of the prescribed Max TBS3, the terminal apparatus 1 may perform at least some or all of the normal timing operation.

In a case that the transmission timing of the PUSCH is switched to k3, at least some or all of the reduced timing operation may be applied, and in a case that the transmission timing of the PUSCH is switched to 4, at least some or all of the normal timing operation may be applied.

Figure 17:
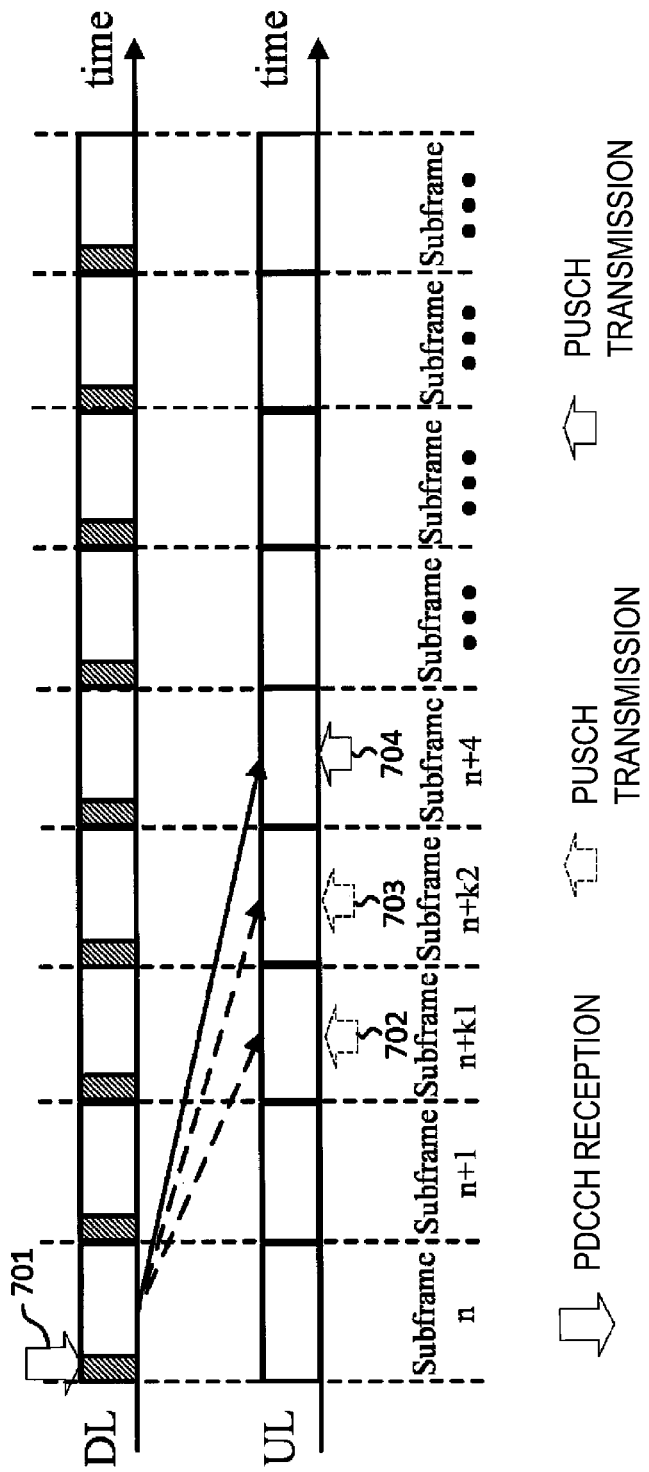
FIG. 17 is a diagram illustrating an example of a transmission method of the PUSCH in operation 2 according to the present embodiment.

FIG. 17 is a diagram illustrating an example of a transmission method of the PUSCH in operation 2.

The terminal apparatus 1 detects the PDCCH to schedule the PUSCH in the downlink subframe n of 701. Based on the DCI format transmitted on the PDCCH, the TBS for the PUSCH transmission is calculated. The terminal apparatus 1 may determine the value of k, by comparing the TBS calculated with the threshold value of the prescribed maximum TBS.

For example, in a case that the calculated TBS does not exceed the prescribed Max TBS1, the value of k may be determined as k1. The terminal apparatus 1 may transmit the PUSCH scheduled on the PDCCH detected in 701, in the uplink subframe n+k1 of 702, by using the value of k1.

For example, in a case that the calculated TBS is in the range from the threshold value of the prescribed Max TBS1 to the threshold value of the prescribed Max TBS2, the value of k may be determined as k2. The terminal apparatus 1 may transmit the PUSCH scheduled on the PDCCH detected in 701, in the uplink subframe n+k2 of 703, by using the value of k2.

For example, in a case that the calculated TBS is equal to or greater than the prescribed Max TBS2, the value of k may be determined as 4. The terminal apparatus 1 may transmit the PUSCH scheduled on the PDCCH detected in 701, in the uplink subframe n+4 of 704, by using the value of k being 4.

Now, an example of the transmission procedure of the HARQ-ACK for the PDSCH transmission according to operation 2 will be described. In a case that the PDSCH is detected in the subframe n−j, in a case of performing the transmission of the HARQ-ACK for the PDSCH in the subframe n, the terminal apparatus 1 performs the operation to determine the value of j. Similarly to the transmission procedure of the PUSCH according to operation 2, the base station apparatus 3 may configure the transmission timing (the value of j) of the HARQ-ACK used the for terminal apparatus 1, based on capability information of the terminal apparatus 1. The base station apparatus 3 may configure the threshold value of the prescribed maximum TBS for the value of j. The base station apparatus 3 may transmit (notify) to the terminal apparatus 1 by RRC signaling of the value of j and the threshold value of the corresponding prescribed maximum TBS. In other words, the transmission timing (the value of j) of the corresponding HARQ-ACK is determined based on the TBS of the PDSCH scheduled.

FIGS. 18A and 18B are diagrams illustrating threshold values of the maximum TBS and transmission timings (values of j) of corresponding HARQ-ACKs. Different threshold values of the prescribed maximum TBS may be configured for different values of j. FIG. 18A is an example in a case that two threshold values of the prescribed maximum TBS are configured. FIG. 18B is an example in a case that one threshold value of maximum TBS is configured.

In FIG. 18A, the threshold values of the prescribed maximum TBS are configured to Max TBS1 and Max TBS2. In a case that the TBS calculated by the DCI format to schedule the PDSCH does not exceed the threshold value of the prescribed Max TBS1, the terminal apparatus 1 may determine (switch) the transmission timing (the value of j) of the corresponding HARQ-ACK as j1. In a case that the TBS calculated by the DCI format to schedule the PDSCH is in the range from the threshold value of the prescribed Max TBS1 to the threshold value of the prescribed Max TBS2, the terminal apparatus 1 may determine (switch) the transmission timing (the value of j) of the corresponding HARQ-ACK as j2. In a case that the TBS calculated by the DCI format to schedule the PDSCH is equal to or greater than the threshold value of the prescribed Max TBS2, the terminal apparatus 1 may determine (switch) the transmission timing (the value of j) of the corresponding HARQ-ACK as 4. Here, the value of j1 may be 2. The value of j2 may be 3.

In a case that the TBS calculated by the DCI format to schedule the PDSCH does not exceed the threshold value of the prescribed Max TBS1, the terminal apparatus 1 may perform at least some or all of the reduced timing operation. In a case that the TBS calculated by the DCI format to schedule the PDSCH is in the range of from the threshold value of the prescribed Max TBS1 to the threshold value of the prescribed Max TBS2, the terminal apparatus 1 may perform at least some or all of the reduced timing operation. In a case that the TBS calculated by the DCI format to schedule the PDSCH is in the range of from the threshold value of the prescribed Max TBS1 to the threshold value of the prescribed Max TBS2, the terminal apparatus 1 may perform at least some or all of the normal timing operation. In a case that the TBS calculated by the DCI format to schedule the PDSCH is equal to or greater than the threshold value of the prescribed Max TBS2, the terminal apparatus 1 may perform at least some or all of the normal timing operation.

In a case that the transmission timing of the HARQ-ACK corresponding to the PDSCH is switched to k1, at least some or all of the reduced timing operation may be applied, and in a case that the transmission timing of the HARQ-ACK corresponding to the PDSCH is switched to k2 or 4, at least some or all of the normal timing operation may be applied. In a case that the transmission timing of the HARQ-ACK corresponding to the PDSCH is switched to k1 or k2, at least some or all of the reduced timing operation may be applied, and in a case that the transmission timing of the HARQ-ACK corresponding to the PDSCH is switched to 4, at least some or all of the normal timing operation may be applied.

In FIG. 18B, the threshold value of the prescribed maximum TBS is configured to Max TBS3. In a case that the TBS calculated by the DCI format to schedule the PDSCH does not exceed the threshold value of the prescribed Max TBS3, the terminal apparatus 1 may determine (switch) the transmission timing (the value of j) of the corresponding HARQ-ACK as j3. In a case that the TBS calculated exceeds the threshold value of the prescribed Max TBS3, the terminal apparatus 1 may determine (switch) the transmission timing (the value of j) of the corresponding HARQ-ACK as 4. Here, the value of j3 may be 2. The value of j3 may be 3.

In a case that the TBS calculated by the DCI format to schedule the PDSCH does not exceed the threshold value of the prescribed Max TBS3, the terminal apparatus 1 may perform at least some or all of the reduced timing operation. In a case that the TBS calculated by the DCI format to schedule the PDSCH exceeds the threshold value of the prescribed Max TBS3, the terminal apparatus 1 may perform at least some or all of the normal timing operation.

In a case that the transmission timing of the HARQ-ACK corresponding to the PDSCH is switched to k3, at least some or all of the reduced timing operation may be applied, and in a case that the transmission timing of the HARQ-ACK corresponding to the PDSCH is switched to 4, at least some or all of the normal timing operation may be applied.

The terminal apparatus 1 calculates the TBS of the PDSCH, based on the DCI format to schedule the PDSCH. The terminal apparatus 1 determines the transmission timing (the value of j) of the HARQ-ACK, by referring to the TBS of the PDSCH calculated and FIGS. 18A and 18B. Then, the terminal apparatus 1 may transmit the corresponding HARQ-ACK, in the subframe n, by using the determined value of j.

The threshold values of the prescribed maximum TBS (Max TBS1, Max TBS2, and Max TBS3) of FIGS. 18A and 18B are configured based on the transmission timings (the values of j) of the HARQ-ACK. The threshold values of the prescribed maximum TBS (Max TBS1, Max TBS2, and Max TBS3) of FIGS. 16A and 16B is configured based on the transmission timings (the values of k) of the PUSCH. In other words, the threshold values of the prescribed maximum TBS of FIGS. 18A and 18B may be different from the threshold values of the prescribed maximum TBS of FIGS. 16A and 16B.

As described above, the threshold values of the prescribed maximum TBS of FIGS. 16A and 16B and FIGS. 18A and 18B may be transmitted from the base station apparatus 3 to the terminal apparatus 1 by RRC signaling. The threshold values of the prescribed maximum TBS of FIGS. 16A and 16B and FIGS. 18A and 18B may be defined by specifications, and may be known values between the base station apparatus 3 and the terminal apparatus 1.

As described above, operation 2 is performed based on determination of the prescribed condition 501. Operation 2 may be performed not based on determination of the prescribed condition 501. In other words, in a case of performing the transmission of the PUSCH, the terminal apparatus 1 may not determine the prescribed condition 501, but may perform operation 2 directly, may determine the transmission timing (the value of k) of the PUSCH, and may transmit the PUSCH with the determined value of k. In a case of performing the transmission of the HARQ-ACK for the PDSCH, the terminal apparatus 1 may not determine the prescribed condition 501, but may perform operation 2 directly, may determine the transmission timing (the value of j) of the corresponding HARQ-ACK, and may transmit the corresponding HARQ-ACK with the determined value of j. In other words, operation 2 may be performed independent of (with no respect to) the prescribed condition 501.

Operation 3 will be described in detail below.

In operation 3, the terminal apparatus 1 may determine the transmission timing (the value of k and/or j), based on the TA value and the threshold value of the prescribed maximum TA. As described above, the TA is used to adjust the transmission timing (the value of k and/or j) of the terminal apparatus 1 and has influence on the transmission timing (the value of k and/or j). As the transmission timing (the value of k and/or j) becomes smaller, the influence of the TA value increases. Here, the threshold value of the prescribed maximum TA may be different from the threshold value of the maximum TA described in the fourth condition in FIG. 14.

Particularly, in a case that the terminal apparatus 1 performs the transmission of the PUSCH or the HARQ-ACK using k or j which is the value smaller than 4, and the TA value is large, after receiving the downlink data (the PDCCH or the PDSCH), the terminal apparatus 1 may not secure enough processing time so as to transmit the corresponding uplink data (the PUSCH or the HARQ-ACK), and may not transmit the uplink data (the PUSCH or the HARQ-ACK).

In other words, in a case that the terminal apparatus 1 performs the transmission of the PUSCH or the HARQ-ACK using k or j which is the value smaller than 4, the terminal apparatus 1 need to limit available maximum TA (or upper limit of the TA, and the like) for the value of k or j. In other words, the base station apparatus 3 determines the values of k and j used for the terminal apparatus 1, based on capability information of the terminal apparatus 1. The base station apparatus 3 may configure the threshold value of the prescribed maximum TA for the determined value of k and j. The base station apparatus 3 may transmit (notify) to the terminal apparatus 1 by RRC signaling of the values of k and j and the threshold value of the corresponding prescribed maximum TA.

FIGS. 19A and 19B are diagrams illustrating PUSCH transmission timings (values of k) and threshold values of corresponding prescribed maximum TA. Different threshold values of the prescribed maximum TA may be configured for different values of k. FIG. 19A is an example where the threshold values of the corresponding prescribed maximum TA are configured in a case that the terminal apparatus 1 supports the values of k (ka, kb, and 4). FIG. 19B is an example where the threshold values of the corresponding prescribed maximum TA are configured in a case that the terminal apparatus 1 supports the values of k (kc and 4). For a small value of k, a small threshold value of the prescribed maximum TA may be configured. The terminal apparatus 1 may determine whether to perform the TA report, based on the relationship between the value of the current TA and the threshold value of the prescribed maximum TA.

Here, the value of ka may be 2. The value of kb may be 3. The value of kc may be 2 or may be 3.

An example of the transmission method of the PUSCH in operation 3 will be described below. Here, the PUSCH transmission method will be described assuming the condition indicated by FIG. 19A.

For example, in a case that the PUSCH transmission timing (the value of k) of the terminal apparatus 1 is 4, the terminal apparatus 1 preferably monitors whether the TA value is less than Max TA2. In a case that the TA value of the terminal apparatus 1 is less than the prescribed Max TA2, the TA report is performed. In other words, the terminal apparatus 1 may report the measured TA value to the base station apparatus 3 by RRC signaling. The base station apparatus 3 transmits the RRC signaling including the acknowledgment information indicating the TA value having been received, to the terminal apparatus 1. After receiving the RRC signaling, the terminal apparatus 1 may switch the value of k to kb. In other words, in a case of detecting the PDCCH in the subframe n, the terminal apparatus 1 transmits the PUSCH scheduled on the PDCCH in the subframe n+kb.

For example, in a case that the transmission timing (the value of k) of the terminal apparatus 1 is kb, the terminal apparatus 1 monitors the two threshold values of the prescribed maximum TA Max TA1 and Max TA2. In other words, in a case that the transmission timing (the value of k) of the terminal apparatus 1 is kb, the terminal apparatus 1 monitors whether the TA value is less than Max TA1 or the TA value is greater than Max TA2. In a case that the TA value of the terminal apparatus 1 is less than the prescribed Max TA1, the TA report is performed. In other words, the terminal apparatus 1 may report the measured TA value to the base station apparatus 3 by RRC signaling. The base station apparatus 3 transmits the RRC signaling including the acknowledgment information indicating the TA value having been received, to the terminal apparatus 1. After receiving the RRC signaling, the terminal apparatus 1 may switch the value of k to ka. In other words, in a case of detecting the PDCCH in the subframe n, the terminal apparatus 1 transmits the PUSCH scheduled on the PDCCH in the subframe n+ka. In a case that the TA value of the terminal apparatus 1 is greater than the prescribed Max TA2, the TA report is performed. In other words, the terminal apparatus 1 may report the measured TA value to the base station apparatus 3 by RRC signaling. The base station apparatus 3 transmits the RRC signaling including the acknowledgment information indicating the TA value having been received, to the terminal apparatus 1. After receiving the RRC signaling, the terminal apparatus 1 may switch the value of k to 4. In other words, in a case of detecting the PDCCH in the subframe n, the terminal apparatus 1 transmits the PUSCH scheduled on the PDCCH in the subframe n+4.

For example, in a case that the transmission timing (the value of k) of the terminal apparatus 1 is ka, the terminal apparatus 1 monitors the threshold value of the prescribed maximum TA Max TA1. In other words, in a case that the transmission timing (the value of k) of the terminal apparatus 1 is ka, the terminal apparatus 1 monitors whether the TA value is greater than Max TA1. In a case that the TA value of the terminal apparatus 1 is greater than the prescribed Max TA1, the TA report is performed. In other words, the terminal apparatus 1 may report the measured TA value to the base station apparatus 3 by RRC signaling. The base station apparatus 3 transmits the RRC signaling including the acknowledgment information indicating the TA value having been received, to the terminal apparatus 1. After receiving the RRC signaling, the terminal apparatus 1 may switch the value of k to kb. In other words, in a case of detecting the PDCCH in the subframe n, the terminal apparatus 1 transmits the PUSCH scheduled on the PDCCH in the subframe n+kb.

In a case that the transmission timing of the PUSCH is switched to ka, the reduced timing operation may be applied, and in a case that the transmission timing of the PUSCH is switched to kb or 4, the normal timing operation may be applied. In a case that the transmission timing of the PUSCH is switched to ka or kb, the reduced timing operation may be applied, and in a case that the transmission timing of the PUSCH is switched to 4, the normal timing operation may be applied. In a case that the transmission timing of the PUSCH is switched to kc, the reduced timing operation may be applied, and in a case that the transmission timing of the PUSCH is switched to 4, the normal timing operation may be applied.

FIGS. 20A and 20B are diagrams illustrating transmission timings (values of j) of HARQ-ACK and threshold values of corresponding prescribed maximum TA. Different threshold values of the prescribed maximum TA may be configured for different values of j. FIG. 20A is an example where the threshold values of the corresponding prescribed maximum TA are configured in a case that the terminal apparatus 1 supports the values of j (ja, jb, and 4). FIG. 20B is an example where the threshold values of the corresponding prescribed maximum TA are configured in a case that the terminal apparatus 1 supports the values of j (jc and 4). For a small value of j, a small threshold value of the prescribed maximum TA may be configured.

Here, the value of ja may be 2. The value of jb may be 3. The value of jc may be 2 or may be 3.

Here, the threshold values (Max TA1, Max A2, and Max TA3) of the maximum TA configured for the values of j may be the same as the threshold value of the maximum TA configured for the values of k. The threshold values (Max TA1, Max TA2, and Max TA3) of the maximum TA configured for the values of j may be different from the threshold value of the maximum TA configured for the values of k.

In a case that the transmission timing of the HARQ-ACK corresponding to the PDSCH is switched to ja, at least some or all of the reduced timing operation may be applied, and in a case that the transmission timing of the HARQ-ACK corresponding to the PDSCH is switched to jb or 4, at least some or all of the normal timing operation may be applied. In a case that the transmission timing of the HARQ-ACK corresponding to the PDSCH is switched to ja or jb, at least some or all of the reduced timing operation may be applied, and in a case that the transmission timing of the HARQ-ACK corresponding to the PDSCH is switched to 4, at least some or all of the normal timing operation may be applied. In a case that the transmission timing of the HARQ-ACK corresponding to the PDSCH is switched to jc, at least some or all of the reduced timing operation may be applied, and in a case that the transmission timing of the HARQ-ACK corresponding to the PDSCH is switched to 4, at least some or all of the normal timing operation may be applied.

An example of the transmission method of the HARQ-ACK in operation 3 will be described below. Here, the HARQ-ACK transmission method will be described assuming the condition indicated by FIG. 20B.

In the case of FIG. 20B, for example, in a case that the HARQ-ACK transmission timing (the value of j) of the terminal apparatus 1 is 4, the terminal apparatus 1 preferably monitors whether the TA value is less than Max TA3. In a case that the TA value of the terminal apparatus 1 is less than the prescribed Max TA3, the TA report is performed. In other words, the terminal apparatus 1 may report the measured TA value to the base station apparatus 3 by RRC signaling. The base station apparatus 3 transmits the RRC signaling including the acknowledgment information indicating the TA value having been received, to the terminal apparatus 1. After receiving the RRC signaling, the terminal apparatus 1 may switch the value of j to jc. In other words, in a case of detecting the PDSCH in the subframe n–jc, the terminal apparatus 1 transmits the HARQ-ACK for the PDSCH in the subframe n.

For example, in a case that the HARQ-ACK transmission timing (the value of j) of the terminal apparatus 1 is jc, the terminal apparatus 1 preferably monitors Max TA3. In other words, for example, in a case that the HARQ-ACK transmission timing (the value of j) of the terminal apparatus 1 is jc, the terminal apparatus 1 preferably monitors whether the TA value is greater than Max TA3. In a case that the TA value of the terminal apparatus 1 is greater than the prescribed Max TA3, the TA report is performed. In other words, the terminal apparatus 1 may report the measured TA value to the base station apparatus 3 by RRC signaling. The base station apparatus 3 transmits the RRC signaling including the acknowledgment information indicating the TA value having been received, to the terminal apparatus 1. After receiving the RRC signaling, the terminal apparatus 1 may switch the value of j to 4. In other words, in a case of detecting the PDSCH in the subframe n–4, the terminal apparatus 1 transmits the HARQ-ACK for the PDSCH in the subframe n.

As described above, after receiving the TA report from the terminal apparatus 1, the base station apparatus 3 transmits RRC signaling including the acknowledgment information indicating that the TA report has been received, to terminal apparatus 1. The base station apparatus 3 may transmit the value of k or j by RRC signaling together. The terminal apparatus 1 may switch the transmission timing to the value of k or j included in the RRC signaling received.

Operation 3 is performed based on determination of the prescribed condition 501. Operation 3 may be performed not based on determination of the prescribed condition 501. In other words, in a case of performing the transmission of the PUSCH, the terminal apparatus 1 may not determine the prescribed condition 501, but may perform operation 2 directly, may determine the transmission timing (the value of k) of the PUSCH, and may transmit the PUSCH with the determined value of k. In a case of performing the transmission of the HARQ-ACK for the PDSCH, the terminal apparatus 1 may not determine the prescribed condition 501, but may perform operation 3 directly, may determine the transmission timing (the value of j) of the corresponding HARQ-ACK, and may transmit the corresponding HARQ-ACK with the determined value of j. In other words, operation 3 may be performed independent of (with no respect to) the prescribed condition 501.

In the following, in operation 3, the terminal apparatus 1 and the base station apparatus 3 may determine the threshold value of the prescribed maximum TA, based on at least some or all from the following element (A) to the element (G).

Element A: the processing time of the HARQ-ACK for the PDSCH

Element B: the processing time of the PUSCH for the PDCCH (uplink grant)

Element C: the number of symbols constituting the sTTI to support

Element D: the threshold value of the maximum TBS of the PDSCH

Element E: the threshold value of the maximum TBS of the PUSCH

Element F: the value of the transmission timing (k and/or j)

Element G: capability information of the terminal apparatus 1 indicating the capability (some or all from element A to element F)

In element A and element B, for example, for multiple terminal apparatuses 1 using the same value of the transmission timing and having short processing time, the threshold value of the maximum TA may be configured to be large.

In element C, the number of symbols constituting the sTTI may be assumed to be related to the reduce capability of the processing time of the terminal apparatus 1.

In element D and element E, the TBS has influence on the value of the transmission timing. In a case that the threshold value of the maximum TBS is configured to be large, the threshold value of the maximum TA needs to be configured to be small.

Element F is the value of the transmission timing of the uplink data of the terminal apparatus 1. In other words, for the terminal apparatus 1 supporting the values of multiple transmission timings, the threshold value of the maximum TA corresponding to the value of the small transmission timing needs to be configured to be small.

As described above, operation 2 or operation 3 is performed to determine the transmission timing (the values of k and j). Whether operation 2 or operation 3 is performed may be notified (indicated) by the base station apparatus 3. The terminal apparatus 1 may determine the values of k and j, based on combinations of operation 2 and operation 3.

A method to determine the value of k or j by combinations of operation 2 and operation 3 will be described below.

Operation 3 limits the threshold value of the maximum TA for the value of k or j. As described above, the threshold value of the maximum TA for the value of k or j is considered to limit the communicable range (area) of the terminal apparatus 1. In other words, the communicable range of the terminal apparatus 1 is considered to be limited for each of the value of k or j. The value of the TA may be assumed to indicate the communication range between the terminal apparatus 1 and the base station apparatus 3. In other words, the value of the TA limits the value of k or j that can be used (supported). The terminal apparatus 1 with a large value of TA cannot use k or j which is a small value, to secure processing time of the PUSCH for the uplink grant or processing time of the HARQ-ACK for the PDSCH.

At first, the terminal apparatus 1 may perform operation 3, and may determine the transmission timing (the value of k or j), by the value of the TA and the threshold value of the prescribed maximum TA. k or j which is a value larger than the determined value of k or j may be used as the transmission timing. k or j which is a value smaller than the determined value of k or j cannot secure sufficient processing time, cannot transmit the PUSCH or the HARQ-ACK, and cannot be used as transmission timing. In other words, operation 3 may determine a set of values of k or j that can be used (supported) by the value of the TA. In a case that the value of the TA changes, the contents of the set of the values of k or j that can be used (supported) may also change.

Then, the terminal apparatus 1 may perform operation 2, may compare the TBS calculated from the DCI format to schedule the PUSCH or the PDSCH with the threshold value of the maximum TBS, and may determine one value of k or j from the set of the available values of k or j determined by operation 3. Specifically, as mentioned above, operation 2 determines the value of k or j, based on the threshold value of the calculated TBS and the maximum TBS. In a case that the set of the values of k or j determined in operation 2 includes the value of k or j determined in operation 3, the terminal apparatus 1 may use the value of k or j determined in to operation 2 as transmission timing. In a case that the set of the value of k or j determined in operation 3 does not include the value of k or j determined in operation 2, the terminal apparatus 1 may use k or j which is the largest and the nearest to the value of k or j determined in operation 2 from the set of the value of k or j determined in operation 3 as transmission timing.

Referring to examples of FIG. 16A and FIG. 19A, an example to determine the value of k, based on combinations of operation 2 and operation 3 will be described below. Here, ka and kb are configured to be 2 and 3. k1 and k2 are configured to be 2 and 3. The terminal apparatus 1 can transmit the PUSCH with transmission timing with k being 2, 3, or 4.

For example, by operation 3, in a case that the value of the TA of the terminal apparatus 1 does not exceed Max TA1, referring to FIG. 19A, the value of k used for the PUSCH transmission may be ka (2). After having secured the processing time of the uplink data, k which is the value greater than 2 may be also used as transmission timing. In other words, in a case that the value of the TA of the terminal apparatus 1 does not exceed Max TA1, the set of the values of k which can be used for the PUSCH transmission may be {2, 3, 4}.

The terminal apparatus 1 may perform operation 2, may compare the TBS calculated from the DCI format to schedule the PUSCH with the threshold value of the maximum TBS, and may determine the value of k. Here, for example, the value of k is determined as k2 (3). In other words, since k being the value of 3 determined by operation 2 is included in the set of the values of k that can be used {2, 3, 4}, the terminal apparatus 1 may transmit the PUSCH using k being the value of 3.

For example, in a case that the value of the TA of the terminal apparatus 1 is in the range of threshold values from Max TA1 to Max TA2, the value of k used for the PUSCH transmission may be 3. 2 that is a value smaller than 3 is not used as transmission timing. In other words, in a case that the value of the TA of the terminal apparatus 1 is in the range of threshold values from Max TA1 to Max TA2, the value of k used for the PUSCH transmission may be a set {3, 4}.

The terminal apparatus 1 may perform operation 2, may compare the TBS calculated from the DCI format to schedule the PUSCH with the threshold value of the maximum TBS, and may determine the value of k. Here, for example, the value of k is determined as k1 (2). In other words, since k being the value of 2 determined in operation is not included in the set of the values of available k {3,4} determined in operation 3, the terminal apparatus 1 may select 3 that is the nearest to 2 and a larger value from the set of the values of available k {3,4}, and may use it as transmission timing.

For example, in a case that the value of the TA of the terminal apparatus 1 is greater than Max TA2, the value of k used for the transmission is 4. In other words, k that is a value smaller than 4 is not used as transmission timing. In this case, the terminal apparatus 1 may determine the value of k as 4 with no respect to whether operation 2 is performed.

In a case of determining the value of k or j by combinations of operation 2 and operation 3, the threshold value of the maximum TBS may be the same as the threshold value of the maximum TBS configured in operation 2 independently. The threshold value of the maximum TBS configured by combinations of operation 2 and operation 3 may be different from the threshold value of the maximum TBS configured in operation 2, and may be configured once more, based on the threshold value of the maximum TA for the value of k or j.

Configurations of apparatuses according to the present embodiment will be described below. Here, the terminal apparatus 1 and the base station apparatus 3 may include at least a part of the processing of the transmission process 3000. The terminal apparatus 1 and the base station apparatus 3 may include at least a part of reception processing corresponding to the transmission process 3000.

Figure 21:
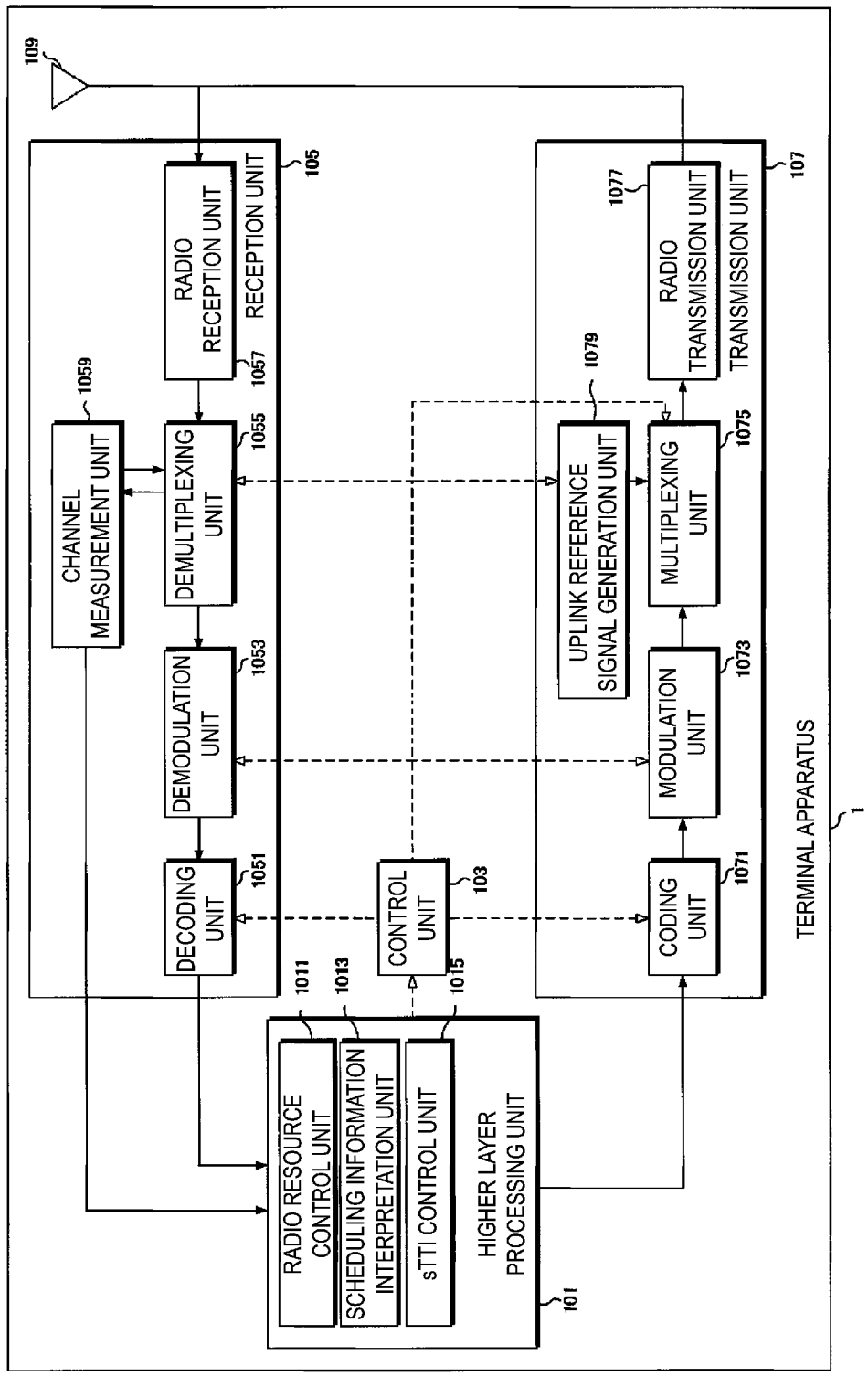
FIG. 21 is a schematic block diagram illustrating a configuration of a terminal apparatus 1 according to the present embodiment.

FIG. 21 is a schematic block diagram illustrating a configuration of the terminal apparatus 1 according to the present embodiment. As illustrated in FIG. 21, the terminal apparatus 1 is configured to include a higher layer processing unit 101, a control unit 103, a reception unit 105, a transmission unit 107, and a transmit and/or receive antenna 109. The higher layer processing unit 101 is configured to include a radio resource control unit 1011, a scheduling information interpretation unit 1013, and an sTTI control unit 1015. The reception unit 105 is configured to include a decoding unit 1051, a demodulation unit 1053, a demultiplexing unit 1055, a radio reception unit 1057, and a channel measurement unit 1059. The transmission unit 107 is configured to include a coding unit 1071, a modulation unit 1073, a multiplexing unit 1075, a radio transmission unit 1077, and an uplink reference signal generation unit 1079.

The higher layer processing unit 101 outputs the uplink data (the transport block) generated by a user operation or the like, to the transmission unit 107. The higher layer processing unit 101 performs processing of the Medium Access Control (MAC) layer, the Packet Data Convergence Protocol (PDCP) layer, the Radio Link Control (RLC) layer, and the Radio Resource Control (RRC) layer.

The radio resource control unit 1011 included in the higher layer processing unit 101 manages various configuration information/parameters of the terminal apparatus 1 itself. The radio resource control unit 1011 sets the various configuration information/parameters in accordance with higher layer signaling received from the base station apparatus 3. To be more specific, the radio resource control unit 1011 sets the various configuration information/parameters in accordance with the information indicating the various configuration information/parameters received from the base station apparatus 3. The radio resource control unit 1011 generates information to be mapped to each uplink channel, and outputs the generated information to the transmission unit 107. The radio resource control unit 1011 is also referred to as a setting unit 1011.

Here, the scheduling information interpretation unit 1013 included in the higher layer processing unit 101 interprets the DCI format (scheduling information, UL grant) received through the reception unit 105, generates control information for control of the reception unit 105 and the transmission unit 107, based on a result of interpreting the DCI format, and outputs the generated control information to the control unit 103.

The sTTI control unit 1015 included in the higher layer processing unit 101 performs controls concerning the sTTI transmission, based on various configuration information, and information or conditions regarding the SPS such as parameters.

Based on the control information originating from the higher layer processing unit 101, the control unit 103 generates a control signal for control of the reception unit 105 and the transmission unit 107. The control unit 103 outputs the generated control signal to the reception unit 105 and the transmission unit 107 to control the reception unit 105 and the transmission unit 107.

In accordance with the control signal input from the control unit 103, the reception unit 105 demultiplexes, demodulates, and decodes a reception signal received from the base station apparatus 3 through the transmit and/or receive antenna 109, and outputs the information resulting from the decoding, to the higher layer processing unit 101.

The radio reception unit 1057 converts (down-converts) a downlink signal received through the transmit and/or receive antenna 109 into a baseband signal through orthogonal demodulation, removes unnecessary frequency components, controls an amplification level in such a manner as to suitably maintain a signal level, performs orthogonal demodulation, based on an in-phase component and an orthogonal component of the received signal, and converts the resulting orthogonally-demodulated analog signal into a digital signal. The radio reception unit 1057 removes a portion corresponding to a Cyclic Prefix (CP) from the digital signal resulting from the conversion, performs Fast Fourier Transform (FFT) on the signal from which the CP has been removed, and extracts a signal in the frequency domain.

The demultiplexing unit 1055 demultiplexes the extracted signal into the PHICH, the PDCCH, the PDSCH, and the downlink reference signal. The demultiplexing unit 1055 makes a compensation of channels including the PHICH, the PDCCH, and the PDSCH, from a channel estimate input from the channel measurement unit 1059. The demultiplexing unit 1055 outputs the downlink reference signal resulting from the demultiplexing, to the channel measurement unit 1059.

The demodulation unit 1053 multiplies the PHICH by a corresponding code for composition, demodulates the resulting composite signal in compliance with a Binary Phase Shift Keying (BPSK) modulation scheme, and outputs a result of the demodulation to the decoding unit 1051. The decoding unit 1051 decodes the PHICH destined for the terminal apparatus 1 itself and outputs the HARQ indicator resulting from the decoding to the higher layer processing unit 101. The demodulation unit 1053 demodulates the PDCCH in compliance with a QPSK modulation scheme and outputs a result of the demodulation to the decoding unit 1051. The decoding unit 1051 attempts to decode the PDCCH. In a case of succeeding in the decoding, the decoding unit 1051 outputs downlink control information resulting from the decoding and an RNTI to which the downlink control information corresponds, to the higher layer processing unit 101. The decoding unit 1051 may include a function to perform decoding processing of transport blocks coded by a function which the coding processing unit 3001 includes.

The demodulation unit 1053 demodulates the PDSCH in compliance with a modulation scheme notified with the DL grant, such as Quadrature Phase Shift Keying (QPSK), 16 Quadrature Amplitude Modulation (QAM), or 64 QAM, and outputs a result of the demodulation to the decoding unit 1051. The decoding unit 1051 decodes the data in accordance with information of a coding rate notified with the downlink control information, and outputs, to the higher layer processing unit 101, the downlink data (the transport block) resulting from the decoding.

The channel measurement unit 1059 measures a downlink path loss or a channel state from the downlink reference signal input from the demultiplexing unit 1055, and outputs the measured path loss or channel state to the higher layer processing unit 101. The channel measurement unit 1059 calculates a downlink channel estimate from the downlink reference signal and outputs the calculated downlink channel estimate to the demultiplexing unit 1055. The channel measurement unit 1059 performs channel measurement and/or interference measurement in order to calculate the CQI (or the CSI).

The transmission unit 107 generates the uplink reference signal in accordance with the control signal input from the control unit 103, codes and modulates the uplink data (the transport block) input from the higher layer processing unit 101, multiplexes the PUCCH, the PUSCH, and the generated uplink reference signal, and transmits a result of the multiplexing to the base station apparatus 3 through the transmit and/or receive antenna 109. The transmission unit 107 transmits uplink control information.

The coding unit 1071 codes the uplink control information input from the higher layer processing unit 101, in convolutional coding, block coding, or the like. The coding unit 1071 performs turbo coding in accordance with information used for the scheduling of the PUSCH. The coding unit 1071 may include a function same as the coding processing unit 3001. The coding unit 1071 may include a transmission process 3000.

The modulation unit 1073 modulates coded bits input from the coding unit 1071, in compliance with the modulation scheme notified with the downlink control information, such as BPSK, QPSK, 16 QAM, or 64 QAM, or in compliance with a modulation scheme predetermined in advance for each channel. In accordance with the information used for the scheduling of the PUSCH, the modulation unit 1073 determines the number of data sequences to be spatial-multiplexed, maps multiple pieces of uplink data to be transmitted on the same PUSCH to multiple sequences through Multiple Input Multiple Output Spatial Multiplexing (MIMO SM), and performs precoding on the sequences.

The uplink reference signal generation unit 1079 generates a sequence acquired in accordance with a rule (formula) predetermined in advance, based on a physical layer cell identity (also referred to as a physical cell identity (PCI), a Cell ID, or the like) for identifying the base station apparatus 3, a bandwidth to which the uplink reference signal is mapped, a cyclic shift notified with the UL grant, a parameter value for generation of a DMRS sequence, and the like. In accordance with the control signal input from the control unit 103, the multiplexing unit 1075 rearranges modulation symbols of the PUSCH in parallel and then performs Discrete Fourier Transform (DFT) on the rearranged modulation symbols. The multiplexing unit 1075 multiplexes PUCCH and PUSCH signals and the generated uplink reference signal for each transmit antenna port. To be more specific, the multiplexing unit 1075 maps the PUCCH and PUSCH signals and the generated uplink reference signal to the resource elements for each transmit antenna port.

The radio transmission unit 1077 performs Inverse Fast Fourier Transform (IFFT) on a signal resulting from the multiplexing, generates an SC-FDMA symbol, attaches a CP to the generated SC-FDMA symbol, generates a baseband digital signal, converts the baseband digital signal into an analog signal, removes unnecessary frequency components through a lowpass filter, up-converts a result of the removal into a signal of a carrier frequency, performs power amplification, and outputs a result to the transmit and/or receive antenna 109 for transmission.

Figure 22:
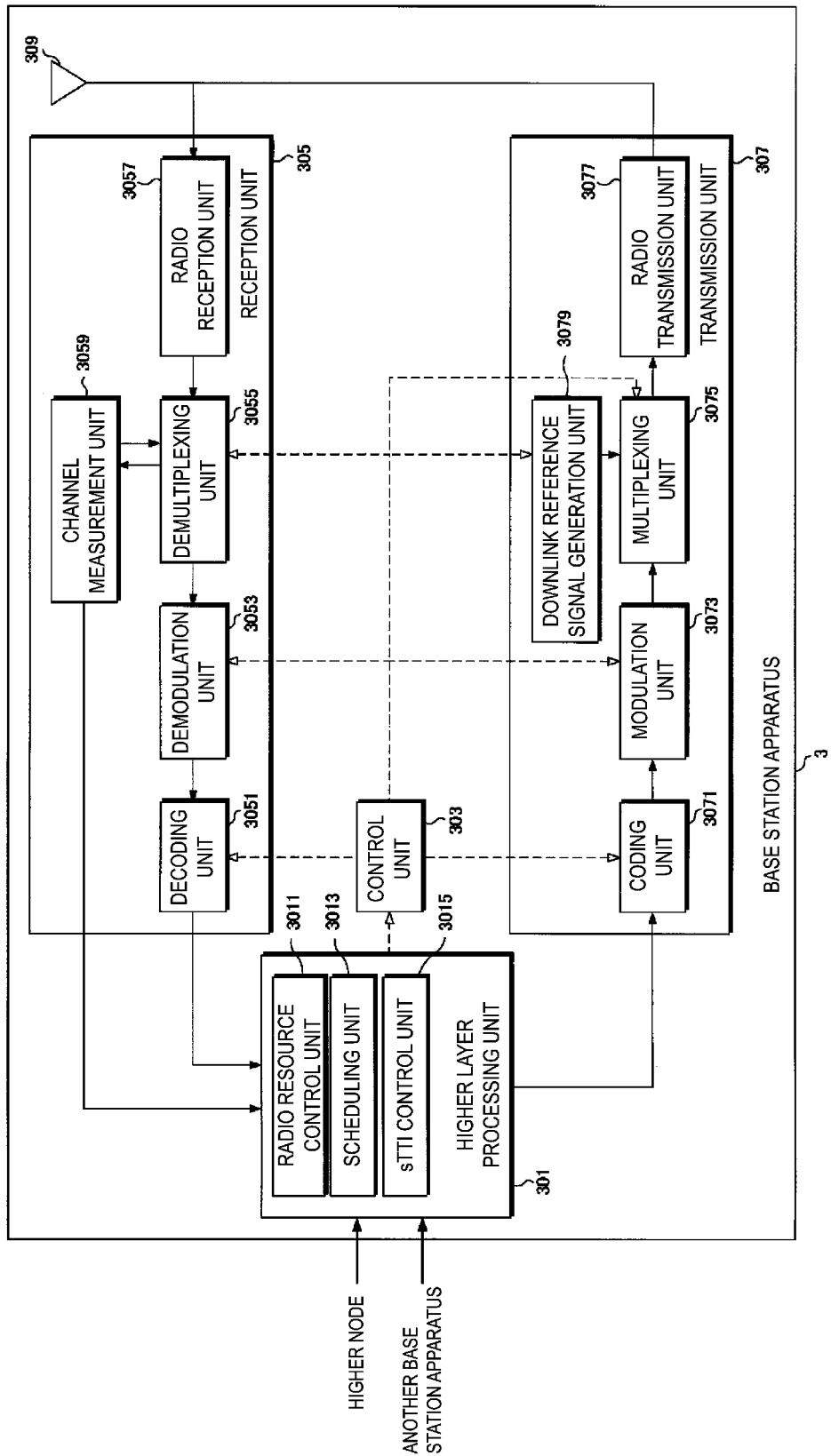
FIG. 22 is a schematic block diagram illustrating a configuration of a base station apparatus 3 according to the present embodiment.

FIG. 22 is a schematic block diagram illustrating a configuration of the base station apparatus 3 according to the present embodiment. As illustrated in the drawing, the base station apparatus 3 is configured to include a higher layer processing unit 301, a control unit 303, a reception unit 305, a transmission unit 307, and a transmit and/or receive antenna 309. The higher layer processing unit 301 is configured to include a radio resource control unit 3011, a scheduling unit 3013, and an sTTI control unit 3015. The reception unit 305 is configured to include a decoding unit 3051, a demodulation unit 3053, a demultiplexing unit 3055, a radio reception unit 3057, and a channel measurement unit 3059. The transmission unit 307 is configured to include a coding unit 3071, a modulation unit 3073, a multiplexing unit 3075, a radio transmission unit 3077, and a downlink reference signal generation unit 3079.

The higher layer processing unit 301 performs processing of the Medium Access Control (MAC) layer, the Packet Data Convergence Protocol (PDCP) layer, the Radio Link Control (RLC) layer, and the Radio Resource Control (RRC) layer. The higher layer processing unit 301 generates control information for control of the reception unit 305 and the transmission unit 307, and outputs the generated control information to the control unit 303.

The radio resource control unit 3011 included in the higher layer processing unit 301 generates, or acquires from a higher node, the downlink data (the transport block) mapped to the downlink PDSCH, system information, the RRC message, the MAC Control Element (CE), and the like, and outputs a result of the generation or the acquirement to the transmission unit 307. The radio resource control unit 3011 manages various configuration information/parameters for each of the terminal apparatuses 1. The radio resource control unit 3011 may configure various configuration information/parameters for each of the terminal apparatuses 1 through higher layer signaling. In other words, the radio resource control unit 1011 transmits/broadcasts information indicating various configuration information/parameters. The radio resource control unit 3011 is also referred to as a setting unit 3011.

The scheduling unit 3013 included in the higher layer processing unit 301 determines a frequency and a subframe to which the physical channels (PDSCH and PUSCH) are allocated, the coding rate and modulation scheme for the physical channels (PDSCH and PUSCH), the transmit power, and the like, from the received channel state information and from the channel estimate, channel quality, or the like input from the channel measurement unit 3059. The scheduling unit 3013 generates the control information (e.g., the DCI format) in order to control the reception unit 305 and the transmission unit 307 in accordance with a result of the scheduling, and outputs the generated information to the control unit 303. The scheduling unit 3013 further determines timing of performing transmission processing and reception processing.

The sTTI control unit 3015 included in the higher layer processing unit 301 performs controls concerning the SPS, based on various configuration information, and information or conditions regarding the SPS such as parameters.

In accordance with the control information originating from the higher layer processing unit 301, the control unit 303 generates a control signal for control of the reception unit 305 and the transmission unit 307. The control unit 303 outputs the generated control signal to the reception unit 305 and the transmission unit 307 to control the reception unit 305 and the transmission unit 307.

In accordance with the control signal input from the control unit 303, the reception unit 305 demultiplexes, demodulates, and decodes the reception signal received from the terminal apparatus 1 through the transmit and/or receive antenna 309, and outputs information resulting from the decoding to the higher layer processing unit 301. The radio reception unit 3057 converts (down-converts) an uplink signal received through the transmit and/or receive antenna 309 into a baseband signal through orthogonal demodulation, removes unnecessary frequency components, controls the amplification level in such a manner as to suitably maintain a signal level, performs orthogonal demodulation, based on an in-phase component and an orthogonal component of the received signal, and converts the resulting orthogonally-demodulated analog signal into a digital signal. The reception unit 305 receives the uplink control information.

The radio reception unit 3057 removes a portion corresponding to a Cyclic Prefix (CP) from the digital signal resulting from the conversion. The radio reception unit 3057 performs Fast Fourier Transform (FFT) on the signal from which the CP has been removed, extracts a signal in the frequency domain, and outputs the resulting signal to the demultiplexing unit 3055.

The demultiplexing unit 1055 demultiplexes the signal input from the radio reception unit 3057 into the PUCCH, the PUSCH, and the signal such as the uplink reference signal. Note that, the demultiplexing is performed based on radio resource allocation information that is determined in advance by the base station apparatus 3 using the radio resource control unit 3011 and that is included in the UL grant notified to each of the terminal apparatuses 1. The demultiplexing unit 3055 makes a compensation of channels including the PUCCH and the PUSCH from the channel estimate input from the channel measurement unit 3059. The demultiplexing unit 3055 outputs an uplink reference signal resulting from the demultiplexing, to the channel measurement unit 3059.

The demodulation unit 3053 performs Inverse Discrete Fourier Transform (IDFT) on the PUSCH, acquires modulation symbols, and performs reception signal demodulation, that is, demodulates each of the modulation symbols on the PUCCH and the PUSCH, in compliance with the modulation scheme predetermined in advance, such as Binary Phase Shift Keying (BPSK), QPSK, 16 QAM, or 64 QAM, or in compliance with the modulation scheme that the base station apparatus 3 itself notified in advance with the UL grant each of the terminal apparatuses 1. The demodulation unit 3053 demultiplexes the modulation symbols of multiple pieces of uplink data transmitted on the same PUSCH with the MIMO SM, based on the number of spatial-multiplexed sequences notified in advance with the UL grant to each of the terminal apparatuses 1 and information designating the precoding to be performed on the sequences.

The decoding unit 3051 decodes the coded bits of PUCCH and PUSCH, which have been demodulated, at the coding rate in compliance with a coding scheme prescribed in advance, the coding rate being prescribed in advance or being notified in advance with the UL grant to the terminal apparatus 1 by the base station apparatus 3 itself, and outputs the decoded uplink data and uplink control information to the higher layer processing unit 101. In a case where the PUSCH is re-transmitted, the decoding unit 3051 performs the decoding with the coded bits input from the higher layer processing unit 301 and retained in an HARQ buffer, and the demodulated coded bits. The channel measurement unit 309 measures the channel estimate, the channel quality, and the like, based on the uplink reference signal input from the demultiplexing unit 3055, and outputs a result of the measurement to the demultiplexing unit 3055 and the higher layer processing unit 301. The decoding unit 3051 may include a function to perform decoding processing of transport blocks coded by a function which the coding processing unit 3001 includes.

The transmission unit 307 generates the downlink reference signal in accordance with the control signal input from the control unit 303, codes and modulates the HARQ indicator, the downlink control information, and the downlink data that are input from the higher layer processing unit 301, multiplexes the PHICH, the PDCCH, the PDSCH, and the downlink reference signal, and transmits a result of the multiplexing to the terminal apparatus 1 through the transmit and/or receive antenna 309.

The coding unit 3071 codes the HARQ indicator, the downlink control information, and the downlink data that are input from the higher layer processing unit 301, in compliance with the coding scheme predetermined in advance, such as block coding, convolutional coding, or turbo coding, or in compliance with the coding scheme determined by the radio resource control unit 3011. The modulation unit 3073 modulates the coded bits input from the coding unit 3071, in compliance with the modulation scheme predetermined in advance, such as BPSK, QPSK, 16 QAM, or 64 QAM, or in compliance with the modulation scheme determined by the radio resource control unit 3011. The coding unit 3071 may include a function same as the coding processing unit 3001. The coding unit 3071 may include a transmission process 3000.

The downlink reference signal generation unit 3079 generates, as the downlink reference signal, a sequence that is already known to the terminal apparatus 1 and that is acquired in accordance with a rule predetermined in advance, based on the physical layer cell identity (PCI) for identifying the base station apparatus 3, and the like. The multiplexing unit 3075 multiplexes the modulated modulation symbol of each channel and the generated downlink reference signal. To be more specific, the multiplexing unit 3075 maps the modulated modulation symbol of each channel and the generated downlink reference signal to the resource elements.

The radio transmission unit 3077 performs Inverse Fast Fourier Transform (IFFT) on the modulation symbol resulting from the multiplexing or the like, generates an OFDM symbol, attaches a CP to the generated OFDM symbol, generates a baseband digital signal, converts the baseband digital signal into an analog signal, removes unnecessary frequency components through a lowpass filter, up-converts a result of the removal into a signal of a carrier frequency, performs power amplification, and outputs a final result to the transmit and/or receive antenna 309 for transmission.

Various kinds of units constituting the terminal apparatus 1 and the base station apparatus 3 may be circuits. For example, the transmission unit 107 may be a transmission circuit 107.

Hereinafter, various aspects of the terminal apparatus 1 and the base station apparatus 3 according to the present embodiment will be described.

(1) To accomplish the object described above, aspects of the present invention are contrived to provide the following measures. Specifically, a first aspect of the present invention is a terminal apparatus including: a reception unit configured to detect a PDCCH including a DCI format; a transmission unit configured to transmit a PUSCH including a transport block, control information, and a rank indicator, based on detection of the PDCCH, the control information including a channel quality indicator and/or a precoding matrix indicator; a coding processing unit configured to separately generate first coded bits $f_k$ of the transport block, second coded bits $q_0$ of the control information, and third coded bits $q_1$ of the rank indicator, and multiplex the first coded bits $f_k$ and the second coded bits $q_0$ to generate multiplexed bits $g_k$; and a channel interleaver unit configured to multiplex the multiplexed bits $g_k$ and the third coded bits $q_1$ to generate a first sequence $h_k$, wherein multiplexing the multiplexed bits $g_k$ and the third coded bit $q_1$ includes (i) a first procedure for mapping the third coded bits $q_1$ to a matrix, (ii) a second procedure for mapping the multiplexed bits $g_k$ to the matrix, except a position where the third coded bits $q_1$ are mapped, and (iii) a third procedure for generating the first sequence $h_k$ by reading from the matrix column by column after the first procedure and the second procedure, in the second procedure, either a first method or a second method is used for mapping the multiplexed bits $g_k$, the position where the third coded bits $q_1$ are mapped is given at least based on a part of a first condition, a second condition, and a third condition, the first condition is whether a search space detecting the PDCCH is a CSS or a USS, the second condition is which RNTI is used to scramble CRC parity bits attached to the DCI format, and the third condition is whether the first method or the second method is used for the first coded bits.

(2) In the first aspect of the present invention, the first method is a method of mapping the multiplexed bits $g_k$ row by row, and the second method is a method of mapping the multiplexed bits $g_k$ column by column.

(3) A second aspect of the present invention is a terminal apparatus including: a reception unit configured to detect a PDCCH including a DCI format; transmission unit configured to transmit a PUSCH including a transport block, control information, and a rank indicator, based on detection of the PDCCH, the control information including a channel quality indicator and/or a precoding matrix indicator; a coding processing unit configured to separately generate first coded bits $f_k$ of the transport block, second coded bits $q_0$ of the control information, and third coded bits $q_1$ of the rank indicator, and multiplex the first coded bits $f_k$ and the second coded bits $q_0$ to generate multiplexed bits $g_k$; and a channel interleaver unit configured to multiplex the multiplexed bits $g_k$ and the third coded bits $q_1$ to generate a first sequence $h_k$, wherein multiplexing the multiplexed bits $g_k$ and the third coded bit $q_1$ includes (i) a first procedure for mapping the third coded bits $q_1$ to a matrix, (ii) a second procedure for mapping the multiplexed bits $g_k$ to the matrix, except a position where the third coded bits $q_1$ are mapped, and (iii) a third procedure for generating the first sequence $h_k$ by reading from the matrix column by column after the first procedure and the second procedure, in the second procedure, either a first method or a second method is used for mapping the multiplexed bits $g_k$, whether the second coded bits $q_0$ are concatenated on a front side or an end side of the first coded bits $f_k$ is given at least based on a part of a first condition, a second condition, and a third condition, the first condition is whether a search space detecting the PDCCH is a CSS or a USS, the second condition is whether or not CRC parity bits attached to the DCI format is scrambled with any RNTI, and the third condition is whether the first method or the second method is used for the first coded bits.

(4) In the second aspect of the present invention, the first method is a method of mapping the multiplexed bits $g_k$ row by row, and the second method is a method of mapping the multiplexed bits $g_k$ column by column.

(5) A third aspect of the present invention is a terminal apparatus including: a reception unit configured to detect a PDCCH including a DCI format; a transmission unit configured to transmit a PUSCH including a transport block, control information, and a rank indicator, based on detection of the PDCCH, the control information including a channel quality indicator and/or a precoding matrix indicator; a coding processing unit configured to separately generate first coded bits $f_k$ of the transport block, second coded bits $q_0$ of the control information, and third coded bits $q_1$ of the rank indicator, and multiplex the first coded bits $f_k$ and the second coded bits $q_0$ to generate multiplexed bits $g_k$; and a channel interleaver unit configured to multiplex the multiplexed bits $g_k$ and the third coded bits $q_1$ to generate a first sequence $h_k$, wherein multiplexing the multiplexed bits $g_k$ and the third coded bit $q_1$ includes (i) a first procedure for mapping the third coded bits $q_1$ to a matrix, (ii) a second procedure for mapping the multiplexed bits $g_k$ to the matrix, except a position where the third coded bits $q_1$ are mapped, and (iii) a third procedure for generating the first sequence $h_k$ by reading from the matrix column by column after the first procedure and the second procedure, in the second procedure, either a first method or a second method is used for mapping the multiplexed bits $g_k$, in a case that the first method is used for mapping the multiplexed bits $g_k$, the number of bits of the control information is given at least based on a value of the rank indicator, and in a case that the second method is used for mapping the multiplexed bits $g_k$, the number of bits of the control information is given regardless the value of the rank indicator.

(6) In the third aspect of the present invention, the first method is a method of mapping the first coded bits row by row, and the second method is a method of mapping the first coded bits column by column.

(7) In the third aspect of the present invention, the number of the second coded bits is given based on the number of bits of the control information.

(8) A fourth aspect of the present invention is a base station apparatus including: a transmission unit configured to transmit a PDCCH including a DCI format to a terminal apparatus; and a reception unit configured to receive, from the terminal apparatus, a PUSCH corresponding to the PDCCH and including a transport block, control information, and a rank indicator, wherein the control information includes a channel quality indicator and/or a precoding matrix indicator, first coded bits $f_k$ of the transport block, second coded bits $q_0$ of the control information, and third coded bits $q_1$ of the rank indicator are separately generated, by the terminal apparatus, the first coded bits $f_k$ and the second coded bits $q_0$ are multiplexed to generate multiplexed bits $g_k$, by the terminal apparatus, the multiplexed bits $g_k$ and the third coded bits $q_1$ are multiplexed to generate a first sequence $h_k$, by the terminal apparatus, multiplexing the multiplexed bits $g_k$ and the third coded bit $q_1$ by the terminal apparatus includes (i) a first procedure for mapping the third coded bits $q_1$ to a matrix, (ii) a second procedure for mapping the multiplexed bits $g_k$ to the matrix, except a position where the third coded bits $q_1$ are mapped, and (iii) a third procedure for generating the first sequence $h_k$ by reading from the matrix column by column after the first procedure and the second procedure, in the second procedure, either a first method or a second method is used for mapping the multiplexed bits $g_k$, the position where the third coded bits $q_1$ are mapped is given at least based on a part of a first condition, a second condition, and a third condition, the first condition is whether a search space detecting the PDCCH is a CSS or a USS, the second condition is with which RNTI are used to scramble CRC parity bits attached to the DCI format, and the third condition is whether the first method or the second method are used for the first coded bits.

(9) Moreover, a fifth aspect of the present invention is a terminal apparatus including: a reception unit configured to detect a PDCCH including a DCI format; a transmission unit configured to transmit a PUSCH including a transport block, control information, and a rank indicator, based on detection of the PDCCH, the control information including a channel quality indicator and/or a precoding matrix indicator; a coding processing unit configured to separately generate first coded bits $f_k$ of the transport block, second coded bits $q_0$ of the control information, and third coded bits $q_1$ of the rank indicator, and multiplex the first coded bits $f_k$ and the second coded bits $q_0$ to generate multiplexed bits $g_k$; and a channel interleaver unit configured to multiplex the multiplexed bits $g_k$ and the third coded bits $q_1$ to generate a first sequence $h_k$, wherein multiplexing the multiplexed bits $g_k$ and the third coded bit $q_1$ includes (i) a first procedure for mapping the third coded bits $q_1$ to a matrix, (ii) a second procedure for mapping the multiplexed bits $g_k$ to the matrix, except a position where the third coded bits $q_1$ are mapped, and (iii) a third procedure for generating the first sequence $h_k$ by reading from the matrix column by column after the first procedure and the second procedure, in the second procedure, either a first method or a second method is used for mapping the multiplexed bits $g_k$, in a case that the first method is used for mapping the multiplexed bits $g_k$, the number of bits of the control information is given at least based on a value of the rank indicator, and in a case that the second method is used for mapping the multiplexed bits $g_k$, the number of bits of the control information is given regardless the value of the rank indicator.

(10) Moreover, a sixth aspect of the present invention is a base station apparatus including: a transmission unit configured to transmit a PDCCH including a DCI format to a terminal apparatus; and a reception unit configured to receive, from the terminal apparatus, a PUSCH corresponding to the PDCCH and including a transport block, control information, and a rank indicator, wherein the control information includes a channel quality indicator and/or a precoding matrix indicator, first coded bits $f_k$ of the transport block, second coded bits $q_0$ of the control information, and third coded bits $q_1$ of the rank indicator are separately generated, by the terminal apparatus, the first coded bits $f_k$ and the second coded bits $q_0$ are multiplexed to generate multiplexed bits $g_k$, by the terminal apparatus, the multiplexed bits $g_k$ and the third coded bits $q_1$ are multiplexed to generate a first sequence $h_k$, by the terminal apparatus, multiplexing the multiplexed bits $g_k$ and the third coded bit $q_1$ by the terminal apparatus includes (i) a first procedure for mapping the third coded bits $q_1$ to a matrix, (ii) a second procedure for mapping the multiplexed bits $g_k$ to the matrix, except a position where the third coded bits $q_1$ are mapped, and (iii) a third procedure for generating the first sequence $h_k$ by reading from the matrix column by column after the first procedure and the second procedure, in the second procedure, either a first method or a second method is used for mapping the multiplexed bits $g_k$, the position where the third coded bits $q_1$ are mapped is given at least based on a part of a first condition, a second condition, and a third condition, the first condition is whether a search space detecting the PDCCH is a CSS or a USS, the second condition is with which RNTI are used to scramble CRC parity bits attached to the DCI format, and the third condition is whether the first method or the second method are used for the first coded bits.

Thereby, the terminal apparatus 1 can transmit and/or receive data efficiently. The base station apparatus 3 can transmit and/or receive data efficiently.

A program running on each of the base station apparatus 3 and the terminal apparatus 1 according to one aspect of the present invention may be a program that controls a Central Processing Unit (CPU) and the like (a program for causing a computer to operate) in such a manner as to realize the functions according to the above-described embodiments of one aspect of the present invention. The information handled in these devices is temporarily stored in a Random Access Memory (RAM) while being processed. Thereafter, the information is stored in various types of Read Only Memory (ROM) such as a flash ROM and a Hard Disk Drive (HDD), and when necessary, is read by the CPU to be modified or rewritten.

Note that the terminal apparatus 1 and the base station apparatus 3 according to the above-described embodiments may be partially realized as a computer. In that case, this configuration may be realized by recording a program for realizing such control functions on a computer-readable recording medium and causing a computer system to read the program recorded on the recording medium for execution.

Note that it is assumed that the "computer system" mentioned here refers to a computer system built into the terminal apparatus 1 or the base station apparatus 3, and the computer system includes an OS and hardware components such as a peripheral apparatus. The "computer-readable recording medium" refers to a portable medium such as a flexible disk, a magneto-optical disk, a ROM, a CD-ROM, and the like, and a storage apparatus such as a hard disk built into the computer system.

Moreover, the "computer-readable recording medium" may include a medium that dynamically retains a program for a short period of time, such as a communication line that is used to transmit the program over a network such as the Internet or over a communication line such as a telephone line, and may also include a medium that retains a program for a fixed period of time, such as a volatile memory within the computer system for functioning as a server or a client in such a case. The program may be configured to realize some of the functions described above, and also may be configured to be capable of realizing the functions described above in combination with a program already recorded in the computer system.

The base station apparatus 3 according to the above-described embodiments may be realized as an aggregation (an apparatus group) constituted of multiple apparatuses. Each of the apparatuses constituting such an apparatus group may include a portion or all of each function or each functional block of the base station apparatus 3 according to the above-described embodiments. The apparatus group may include each general function or each functional block of the base station apparatus 3. The terminal apparatus 1 according to the above-described embodiments can also communicate with the base station apparatus as the aggregation.

Furthermore, the base station apparatus 3 according to the above-described embodiments may serve as an Evolved Universal Terrestrial Radio Access Network (EUTRAN). The base station apparatus 3 according to the above-described embodiments may have some or all portions of the functions of a node higher than an eNodeB.

Some or all portions of each of the terminal apparatus 1 and the base station apparatus 3 according to the above-described embodiments may be typically realized as an LSI which is an integrated circuit or may be realized as a chip set. The functional blocks of each of the terminal apparatus 1 and the base station apparatus 3 may be individually realized as a chip, or some or all of the functional blocks may be integrated into a chip. A circuit integration technique is not limited to the LSI, and may be realized with a dedicated circuit or a general-purpose processor. In a case where with advances in semiconductor technology, a circuit integration technology with which an LSI is replaced appears, it is also possible to use an integrated circuit based on the technology.

According to the above-described embodiments, the terminal apparatus has been described as an example of a communication apparatus, but the present invention is not limited to such a terminal apparatus, and is applicable to a terminal apparatus or a communication apparatus of a fixed-type or a stationary-type electronic apparatus installed indoors or outdoors, for example, such as an audio-video (AV) apparatus, a kitchen apparatus, a cleaning or washing machine, an air-conditioning apparatus, office equipment, a vending machine, and other household apparatuses.

The embodiments of the present invention have been described in detail above referring to the drawings, but the specific configuration is not limited to the embodiments and includes, for example, an amendment to a design that falls within the scope that does not depart from the gist of the present invention. Various modifications can be made to the aspect of the present invention within the scope of the present invention defined by claims, and embodiments that are made by suitably combining technical means disclosed according to the different embodiments are also included in the technical scope of the present invention. A configuration in which constituent elements, described in the respective embodiments and having mutually the same effects, are substituted for one another is also included in the technical scope of the present invention.

INDUSTRIAL APPLICABILITY

An aspect of the present invention can be utilized, for example, in a communication system, communication equipment (for example, a cellular phone apparatus, a base station apparatus, a radio LAN apparatus, or a sensor device), an integrated circuit (for example, a communication chip), or a program.

REFERENCE SIGNS LIST 1 (1A, 1B, 1C) Terminal apparatus
3 Base station apparatus
101 Higher layer processing unit
103 Control unit
105 Reception unit
107 Transmission unit
301 Higher layer processing unit 303 Control unit
305 Reception unit
307 Transmission unit
1011 Radio resource control unit
1013 Scheduling information interpretation unit
1015 sTTI control unit
3000 Transmission process
3001 Coding processing unit
3002 Scramble processing unit
3003 Modulation map processing unit
3004 Layer map processing unit
3005 Transmission precode processing unit
3006 Precode processing unit
3007 Resource element map processing unit
3008 Baseband signal generation processing unit
3011 Radio resource control unit
3013 Scheduling unit
3015 sTTI control unit
4001 CRC attachment unit
4002 Coding unit
4003 Sub-block interleaver unit
4004 Bit collection unit
4005 Bit selection and pruning unit
4006 Concatenation unit
4007 Control information and data multiplexing unit
4008 Channel interleaver unit
4010 Segmentation and CRC unit
4011 Code block segmentation unit
4012 CRC attachment unit

The invention claimed is:

1. A terminal apparatus for mapping bits by a matrix for transmission, wherein the matrix comprises a first axis and a second axis, the first axis corresponding to a time domain, the second axis corresponding to a frequency domain, the terminal apparatus comprising:
   encoding circuitry configured to:
      map first coded bits for first channel state information (CSI) onto the matrix starting with an element of the matrix in a second-axis prioritized manner and in ascending order on the first axis and the second axis;
      map second coded bits for second CSI and third coded bits for an uplink shared channel (UL-SCH) onto the matrix starting with the element of the matrix in the second-axis prioritized manner and in the ascending order on the first axis and the second axis;
      map fourth coded bits for acknowledgment onto the matrix starting with the element of the matrix in the second-axis prioritized manner and in the ascending order on the first axis and the second axis,
   wherein:
      a number of bits for the second CSI is determined based on a value of the first CSI,
      the second coded bits and the third coded bits are not mapped onto elements where the first coded bits are mapped in the matrix, and
      one of the second coded bits is punctured when the one of the second coded bits and one of the fourth coded bits are mapped onto a same element of the matrix; and
   acquire a sequence from the matrix in the second-axis prioritized manner; and
   transmission circuitry configured to transmit the sequence.

2. The terminal apparatus according to claim 1, wherein the first CSI includes a rank indicator, and the second CSI includes a precode matrix indicator.

3. The terminal apparatus according to claim 1, wherein the encoding circuitry maps the first coded bits for the first CSI onto a plurality of predetermined elements of the matrix.

4. The terminal apparatus according to claim 1, wherein the encoding circuitry maps the second coded bits for the second CSI onto a plurality of predetermined elements of the matrix.

5. A base station apparatus for demapping bits by a matrix for reception, wherein the matrix comprises a first axis and a second axis, the first axis corresponding to a time domain, the second axis corresponding to a frequency domain, the base station apparatus comprising:
   reception circuitry configured to:
      receive a sequence; and
   decoding circuitry configured to:
      obtain the matrix from the sequence in a second-axis prioritized manner;
      demap first coded bits for first channel state information (CSI) from the matrix starting with an element of the matrix in the second-axis prioritized manner and in ascending order on the first axis and the second axis;
      demap second coded bits for second CSI and third coded bits for an uplink shared channel (UL-SCH) from the matrix starting with the element of the matrix in the second-axis prioritized manner and in the ascending order on the first axis and the second axis; and
      demap fourth coded bits for acknowledgment from the matrix starting with the element of the matrix in the second-axis prioritized manner and in the ascending order on the first axis and the second axis, wherein:
         a number of bits for the second CSI is determined based on a value of the first CSI,
         the second coded bits and the third coded bits are not demapped from elements where the first coded bits are demapped in the matrix, and
         one of the second coded bits is punctured when the one of the second coded bits and one of the fourth coded bits are mapped onto a same element of the matrix.

6. The base station apparatus according to claim 5, wherein the first CSI includes a rank indicator, and the second CSI includes a precode matrix indicator.

7. The base station apparatus according to claim 5, wherein the decoding circuitry demaps the first coded bits for the first CSI from a plurality of predetermined elements of the matrix.

8. The base station apparatus according to claim 5, wherein the decoding circuitry demaps the second coded bits for the second CSI from a plurality of predetermined elements of the matrix.

9. A method for mapping bits by a matrix for transmission, wherein the matrix comprises a first axis and a second axis, the first axis corresponding to a time domain, the second axis corresponding to a frequency domain, the method comprising:
   mapping first coded bits for first channel state information (CSI) onto the matrix starting with an element of the matrix in a second-axis prioritized manner and in ascending order on the first axis and the second axis;
   mapping second coded bits for second CSI and third coded bits for an uplink shared channel (UL-SCH) onto the matrix starting with the element of the matrix in the second-axis prioritized manner and in the ascending order on the first axis and the second axis;

mapping fourth coded bits for acknowledgment onto the matrix starting with the element of the matrix in the second-axis prioritized manner and in the ascending order on the first axis and the second axis, wherein:
- a number of bits for the second CSI is determined based on a value of the first CSI,
- the second coded bits and the third coded bits are not mapped onto elements where the first coded bits are mapped in the matrix, and
- one of the second coded bits is punctured when the one of the second coded bits and one of the fourth coded bits are mapped onto a same element of the matrix;

acquiring a sequence from the matrix in the second-axis prioritized manner; and transmitting the sequence.

10. The method according to claim 9, wherein the first CSI includes a rank indicator, and the second CSI includes a precode matrix indicator.

11. The method according to claim 9, wherein mapping the first coded bits for the first CSI onto the matrix comprises mapping the first coded bits onto a plurality of predetermined elements of the matrix.

12. The method according to claim 9, wherein mapping the second coded bits for the second CSI onto the matrix comprises mapping the second coded bits onto a plurality of predetermined elements of the matrix.

13. A method for demapping bits by a matrix for reception, wherein the matrix comprises a first axis and a second axis, the first axis corresponding to a time domain, the second axis corresponding to a frequency domain, the method comprising:

receiving a sequence;

obtaining the matrix from the sequence in a second-axis prioritized manner;

demapping first coded bits for first channel state information (CSI) from the matrix starting with an element of the matrix in the second-axis prioritized manner and in ascending order on the first axis and the second axis;

demapping second coded bits for second CSI and third coded bits for an uplink shared channel (UL-SCH) from the matrix starting with the element of the matrix in the second-axis prioritized manner and in the ascending order on the first axis and the second axis; and demapping fourth coded bits for acknowledgment from the matrix starting with the element of the matrix in the second-axis prioritized manner and in the ascending order on the first axis and the second axis, wherein:
- a number of bits for the second CSI is determined based on a value of the first CSI,
- the second coded bits and the third coded bits are not demapped from elements where the first coded bits are demapped in the matrix, and
- one of the second coded bits is punctured when the one of the second coded bits and one of the fourth coded bits are mapped onto a same element of the matrix.

14. The method according to claim 13, wherein the first CSI includes a rank indicator, and the second CSI includes a precode matrix indicator.

15. The method according to claim 13, wherein demapping the first coded bits for the first CSI from the matrix comprises demapping the first coded bits from a plurality of predetermined elements of the matrix.

16. The method according to claim 13, wherein demapping the second coded bits for the second CSI from the matrix comprises demapping the second coded bits from a plurality of predetermined elements of the matrix.

* * * * *